United States Patent
Kimura et al.

(10) Patent No.: US 9,362,932 B2
(45) Date of Patent: Jun. 7, 2016

(54) A/D CONVERTER CIRCUIT AND SEMICONDUCTOR INTEGRATED CIRCUIT

(71) Applicant: RENESAS ELECTRONICS CORPORATION, Kanagawa (JP)

(72) Inventors: Keisuke Kimura, Kanagawa (JP); Yuichi Okuda, Kanagawa (JP); Hideo Nakane, Kanagawa (JP); Takaya Yamamoto, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/817,645

(22) Filed: Aug. 4, 2015

(65) Prior Publication Data

US 2015/0341043 A1 Nov. 26, 2015

Related U.S. Application Data

(63) Continuation of application No. 14/579,049, filed on Dec. 22, 2014, now Pat. No. 9,124,284.

(30) Foreign Application Priority Data

Dec. 27, 2013 (JP) ................. 2013-272727

(51) Int. Cl.
*H03M 1/06* (2006.01)
*H03M 1/12* (2006.01)
*H03M 1/00* (2006.01)

(52) U.S. Cl.
CPC ............ *H03M 1/002* (2013.01); *H03M 1/0617* (2013.01); *H03M 1/0634* (2013.01); *H03M 1/1225* (2013.01); *H03M 1/12* (2013.01)

(58) Field of Classification Search
None
See application file for complete search history.

(56) References Cited

U.S. PATENT DOCUMENTS

| 6,271,781 | B1 | 8/2001 | Pellon | |
| 6,720,895 | B2 | 4/2004 | Poulton et al. | |
| 7,010,023 | B1 | 3/2006 | Sato | |
| 7,138,933 | B2 | 11/2006 | Nairn | |
| 8,836,551 | B2 * | 9/2014 | Nozaki | H03M 1/06 341/118 |
| 9,030,340 | B1 * | 5/2015 | Waltari | H03M 1/1245 341/118 |

OTHER PUBLICATIONS

Oshima et al., "Fast nonlinear deterministic calibration of pipelined A/D converters", IEEE 2008 Midwest Symposium on Circuits and Systems. Session C2L-C-1, Aug. 2008.

(Continued)

*Primary Examiner* — Howard Williams
(74) *Attorney, Agent, or Firm* — Mattingly & Malur, P.C.

(57) ABSTRACT

An analog-to-digital converter circuit having a simple design and capable of preventing an increase in surface area and other problems. An analog-to-digital converter circuit for converting an analog input signal to a digital quantity includes an analog-to-digital converter unit that converts analog input signals to pre-correction digital values, and a corrector unit that digitally corrects the pre-connection digital values output from the analog-to-digital converter unit. The corrector unit includes a weighting coefficient multiplier unit that outputs a post-correction digital value obtained by multiplying the weighting coefficients provided for each bit by each bit of the pre-correction digital value output from the A/D converter unit and summing them, and a weighting coefficient search unit that searches for weighting coefficients so as to minimize an error signal generated based on the post-correction digital value and an approximate value for the post-correction digital value.

3 Claims, 32 Drawing Sheets

(56) References Cited

OTHER PUBLICATIONS

Oshima et al., "23-mW 50-MS/s10-bit pipeline A/D converter with nonlinear LMS foreground calibration", 2009 International Symposium on Circuits and Systems, May 2009, pp. 960-963.

McNeill et al., "A split-ADC architecture for deterministic digital background calibration of a 16b 1MS/s ADC", IEEE 2005 International Solid-State Circuits Conference, Feb. 2005, pp. 276-277.

Liu et al. "A 12b 22.5/45MS/s3.0mW 0.059mm2 CMOS SAR ADC achieving over 90dB SFDR" IEEE 2010 International Solid-State Circuits Conference, Feb. 2010, pp. 380-381.

* cited by examiner

S: SAMPLING    AD: AD CONVERSION

1#A

S: SAMPLING   AD: AD CONVERSION

S: SAMPLING   AD: AD CONVERSION (DURING WEIGHTING COEFFICIENT SEARCH OPERATION)

(DURING AD CONVERSION OPERATION)

A/D CONVERTER CIRCUIT AND SEMICONDUCTOR INTEGRATED CIRCUIT

CROSS-REFERENCE TO RELATED APPLICATIONS

The disclosure of Japanese Patent Application No. 2013-272727 filed on Dec. 27, 2013 including the specification, drawings and abstract is incorporated herein by reference in its entirety.

The present invention relates to an analog/digital (A/D) converter circuit for converting an analog quantity to a digital quantity.

BACKGROUND

Sequential comparison ADC (Analog to Digital Converter) is one type of A/D (analog/digital) conversion system. High-speed and high-accuracy AD (analog to digital) conversion has become possible by way of CMOS process miniaturization so that sequential comparison ADC is now utilized in a wide range of fields from conventional sensor applications to wireless communications, etc. Among these fields, sequential comparison ADC that performs non-binary conversion has proven particularly resistant (robust) to unwanted effects such as device mismatches caused by process miniaturization and so research in this area has been reported in academic conferences in recent years.

In binary sequential comparison ADC of the related art is based on binary search, digital values are decided by a binary search performed in order from high-order bits while applying feedback to the analog signal that is input in the DAC (Digital to Analog Converter). The weight of each bit is therefore applied at a power of 2. In other words, the relation between the digital output value x and each bit $D_i$ from the AD conversion results is given by the following formula.

$$x = \sum_{i=0}^{N-1} 2^i D_i \quad \text{[Formula 1]}$$

In some cases, $D_i=\{0,1\}$ and $D_i=\{-1,+1\}$ according to the notation method but are still essentially the same. Unless stated to the contrary, the notation $D_i=\{-1,+1\}$ is utilized here.

In non-binary ADC however the weight of each bit is given by ADC that is not a power of 2. Namely, in non-binary ADC, the relation between the digital output x and each bit Di in the AD conversion results is given in the following formula.

$$x = \sum_{i=0}^{N-1} W_i D_i \quad \text{[Formula 2]}$$

Here, $W_i$ is the weighting coefficient and is typically a value differing from $2^i$. The non-binary ADC can usually be configured by selecting $W_{i+1}/W_i<2$ so that there are plural AD conversion results relative to the analog value. The presence of plural AD conversion results in other words signifies that there are plural search routes, forming this type of structure allows redundancy in the conversions.

Correct AD conversion results can therefore be obtained due to redundancy even if a conversion error occurs in the process for sequential comparison due to noise in the comparator or an incomplete setting for feedback DAC.

However in non-binary ADC, unless the coefficient of the feedback DAC matches the value of the weighted coefficient $W_i$, the AD conversion accuracy will deteriorate due to errors occurring in the digital output value.

A weighting coefficient $W_i$ must be accurately calculated in order to perform accurate AD conversion to cope with fluctuation in the feedback DAC coefficient relative to the design value due to production variations, power supply voltage, and operating temperature, etc. In particular, in order to maintain an optimum value for the weighting coefficient $W_i$ for coping with fluctuations during circuit usage such as the power supply voltage, and operating temperature, the search for the weighting coefficient must be performed in parallel with circuit operation or in other words, a background operation is required.

To meet this need, a method utilizing the LMS (Least-Mean-Square) algorithm is known as a method to find the weighting coefficient of the non-binary ADC. The LMS algorithm is a calculation method that is one type of so-called adaptive algorithm that generates an error signal and sets a weighting coefficient so that the generated error signal approaches zero.

The non-patent documents 1 through 4 each disclose an A/D converter circuit that applies the LMS algorithm. The A/D converter circuit is comprised of an A/D converter unit to convert the analog input signals into digital values, and a corrector unit to digitally correct the output of the A/D converter unit. These non-patent documents 1 through 4 propose a low power consumption, and high-speed and high-accuracy A/D converter circuit that performs digital correction by applying a LMS algorithm in the corrector unit.

[Non-Patent Document 1]
T. Oshima, et al., "Fast nonlinear deterministic calibration of pipelined A/D converters," IEEE 2008 Midwest Symposium on Circuits and Systems, Session C2L-C-1, August 2008.

[Non-Patent Document 2]
T. Oshima, et al., "23-mW 50-MS/s10-bit pipeline A/D converter with nonlinear LMS foreground calibration,"2009 International Symposium on Circuits and Systems, pp. 960-963, May 2009.

[Non-Patent Document 3]
J. Mcneill, et al., "A split-ADC architecture for deterministic digital background calibration of a 16b 1 MS/s ADC," IEEE2005 International Solid-State Circuits Conference, pp. 276-277, February 2005.

[Non-Patent Document 4]
W. Liu et al., "A 12b 22.5/45 MS/s3.0 mW 0.059 mm² CMOS SAR ADC achieving over 90 dB SFDR," IEEE 2010 International Solid-State Circuits Conference, pp. 380-381, February 2010.

SUMMARY

The A/D converter circuits shown in non-patent documents 1 through 3 on the other hand, are comprised of plural A/D converter units that lead to the problems of a larger surface area and larger current consumption.

The A/D converter circuits in non-patent document 4 require a mechanism to apply an offset, and this mechanism also leads to the problems of a larger surface area and larger current consumption as well as an increase in the design man-hours.

In order to resolve the aforementioned problems, the present invention has the object of providing an A/D converter circuit and a semiconductor integrated circuit capable of preventing an increase in the surface area and other problems by utilizing a simple structure.

The novel features and other issues of the present invention will become readily apparent from the description in the present specifications and the accompanying drawings.

According to one aspect of the present invention, an A/D converter circuit for converting an analog input signal into a digital quantity includes an A/D converter unit that converts the analog input signal into a pre-correction digital value, and a corrector unit that digitally corrects the pre-correction digital value output from the A/D converter unit. The corrector unit includes a weighting coefficient multiplier unit that outputs a post-correction digital value obtained by summing the weighting coefficients provided in each bit multiplied by the pre-correction digital value of each bit output from the A/D converter unit; and a weighting coefficient search unit that searches for weighting coefficients so as to minimize an error signal generated based on the post-correction digital value and an approximate value for the post-correction digital value.

According to one aspect of the present invention, the above structure is capable of preventing an increase in the surface area and other disadvantages by utilizing a simple structure.

DETAILED DESCRIPTION

Figure 1A:
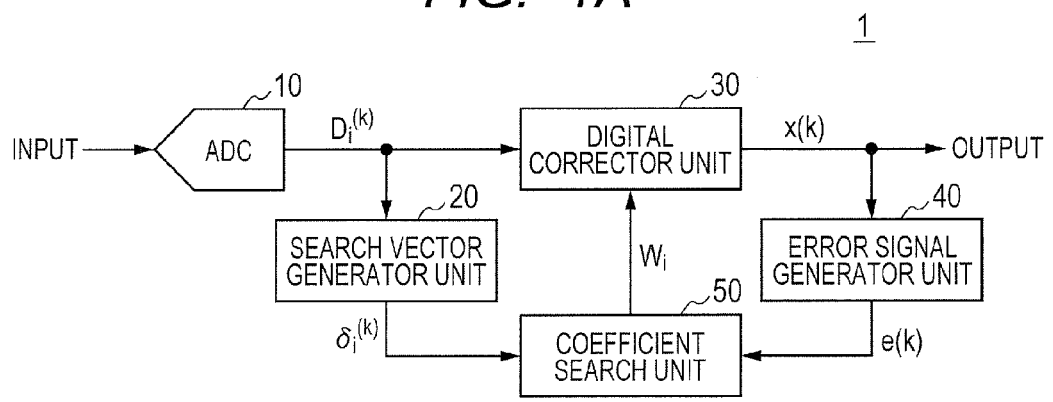
FIG. 1A and FIG. 1B are an outline diagram and a conversion timing drawing for describing the structure of the A/D converter circuit based on the first embodiment.

The embodiments are described in detail next while referring to the drawings. In the drawings, the same reference

First Embodiment

Structure of the Analog/Digital (A/D) Converter Circuit

Figure 1B:

FIGS. 1A and 1B are an outline diagram and a conversion timing drawing of the A/D converter circuit 1 based on the first embodiment.

In this example, the A/D converter circuit 1 for converting the analog input signal into a digital quantity is described while referring to FIG. 1A.

The A/D converter circuit 1 contains an A/D converter unit (ADC) 10, a search vector generator unit 20, a digital corrector unit 30, an error signal generator unit 40, and a coefficient search unit 50.

The A/D converter unit 10 converts an analog input signal into a digital value representing the AD conversion results. The search vector generator unit 20 calculates a search vector $\delta_i^{(k)}$ based on the approximate value of each bit $D_i^{(k)}$ for each bit $D_i^{(k)}$ of the digital value output from the A/D converter unit 10. In the present example, the search vector generator unit 20 calculates the interpolation bit estimation value based on the approximate value of each bit $D_i^{(k)}$ and calculates the search vector $\delta_i^{(k)}$ based on the difference between each bit $D_i^{(k)}$ and the interpolation bit estimation value.

The error signal generator unit 40 calculates an error signal e(k) based on the digital value x(k) output from the digital corrector unit 30, and the approximate value. In the present example, the error signal generator unit 40 calculates an error signal e(k) based on error signal interpolation estimation value based on x(k) the approximate value, and the digital value.

The coefficient search unit 50 searches for a weighting coefficient so as to minimize the error signal generated based on the digital value x(k) output from the digital corrector unit 30, and the approximate value. Specifically, the coefficient search unit 50 searches for a weighting coefficient $W_i$ for each bit based on the error signal e(k) output from the error signal generator unit 40 and the search vector $\delta_i^{(k)}$ output from the search vector generator unit 20. In the present example, the coefficient search unit 50 rewrites the weighting coefficient $W_i$ for each bit by multiplying the error signal e(k), and the search vector $\delta_i^{(k)}$ utilized for searching the weighting coefficient $W_i$ generated based on each bit $D_i^{(k)}$ of the digital value output from the corresponding A/D converter unit 10, and the approximate value for each bit $D_i^{(k)}$ and summing them.

The digital corrector unit 30 digitally corrects of each bit $D_i^{(k)}$ of the digital value output from the A/D converter unit 10 according to the weighting coefficient $W_i$ of each bit searched by the coefficient search unit 50. Specifically, the digital corrector unit 30 calculates the digital value x(k) by multiplying the weighting coefficient $W_i$ by each bit $D_i^{(k)}$ of the digital value from the A/D converter unit 10 and summing them.

In the present example, the digital value output from the A/D converter unit 10 is called the pre-correction digital value, and the digital value output from the digital corrector unit 30 is called the post-correction digital value.

An outline diagram of the conversion timing by the A/D converter circuit 1 is shown here while referring to FIG. 1B. The present example shows the case where repeatedly and alternately executing the sampling ("S") as one example of sampling processing of the analog input signal, and the AD conversion ("AD") for processing the sampled analog input signal by A/D conversion. The sampling may utilize a structure contained in the A/D converter unit 10 or a structure contained in a pre-stage of the A/D converter unit 10.

Figure 2:
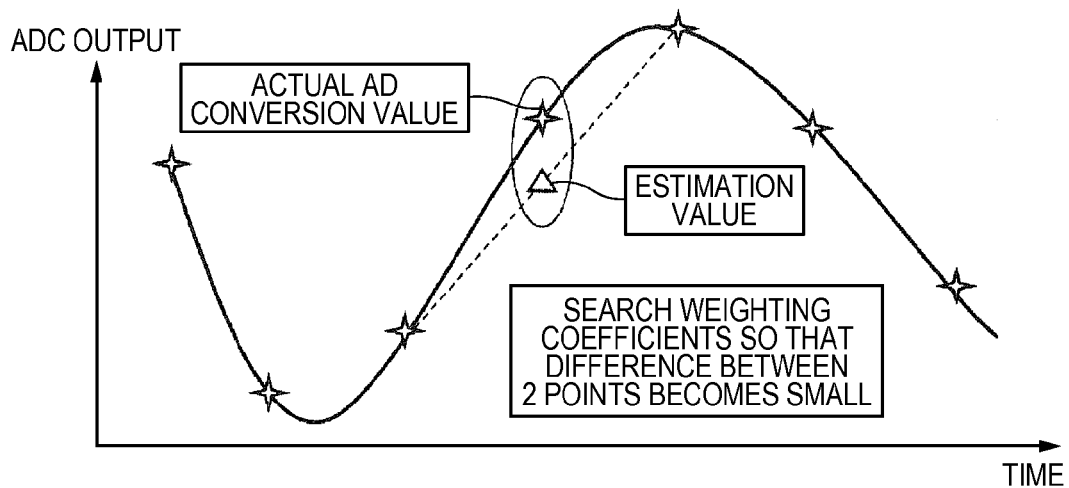
FIG. 2 is a drawing for describing the concept of searching weighting coefficients in the A/D converter circuit based on the first embodiment.

FIG. 2 is a drawing for describing the concept of searching weighting coefficients in the A/D converter circuit 1 based on the first embodiment.

Referring now to FIG. 2, the coefficient search unit 50 searches the weighting coefficients by utilizing an optimization algorithm (LMS {least-mean-square} algorithm and so on) so as to minimize the difference between the digitally corrected post-correction digital value and the interpolation estimation value based on the approximate value for the post-correction digital value.

The present example describes two point interpolation which is polynomial interpolation as one example of interpolation however there are no particular restrictions on the interpolation method to be utilized and linear interpolation, Lagrange interpolation, Newton interpolation and spline interpolation as well as others may be utilized. The specific example of an interpolation method given for the present embodiment is linear interpolation but other types of interpolation method may also be utilized.

In the present example utilizing an LMS algorithm is described as the optimization algorithm however there are no particular restrictions on the algorithm for utilization and the learning identification method, projection method, conjugate gradient method, RLS (Recursive Least Square) algorithm, BLMS (Block least-mean-square) algorithm, and jump algorithm and so on may be utilized.

The A/D converter unit 10, the digital corrector unit 30, the search vector generator unit 20, the error signal generator unit 40, and the coefficient search unit 50 may be formed on the same chip or may be formed on respectively different chips. Moreover, the digital corrector unit 30, the search vector generator unit 20, the error signal generator unit 40, and the coefficient search unit 50 are for digital signal processing and so may be achieved through hardware processing in logic circuits or may be achieved through software processing on computers.

The present example describes the case where searching for weighting coefficients by way of an optimization algorithm so as to minimize the error signal which is the difference between the digitally corrected post-correction digital value and the interpolation estimation value based on the approximate value for the post-correction digital value. However, the method is not limited to an error signal versus the interpolation estimation value and any method may be utilized as long provided the method searches for a weighting coefficient so as to minimize the error signal based on the post-correction digital value and the approximate value for the post-correction digital value.

The present example mainly describes applying sequential comparison ADC, pipeline ADC, cyclic ADC as the ADC method however there are no particular restrictions on the ADC method and other ADC methods such as flash ADC may also be utilized.

Figure 3:
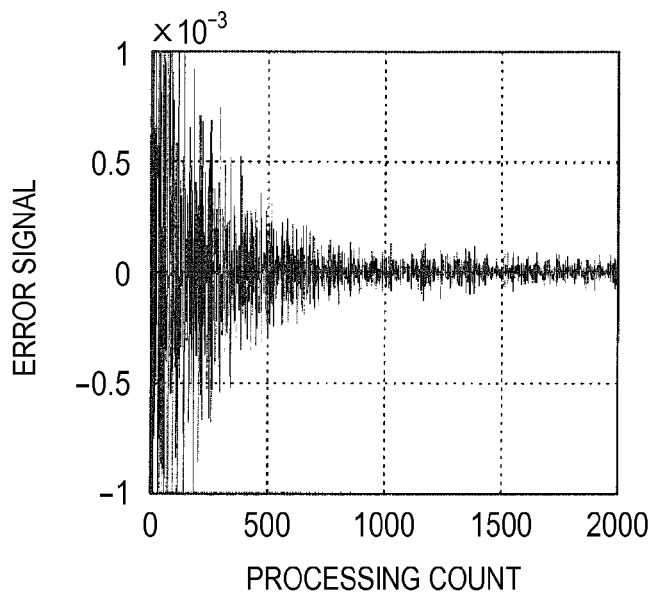
FIG. 3 is a drawing for describing the converging of the error signals in the A/D converter circuit based on the first embodiment.

FIG. 3 is a drawing for describing the converging of the error signals in the A/D converter circuit 1 based on the first embodiment.

Referring to FIG. 3, the A/D converter circuit 1 based on the first embodiment is capable of checking the error signal convergence by repeating the search processing for the target weighting coefficient, and in the present example by repeating the search processing about 1,000 times as one example.

Figure 4A:
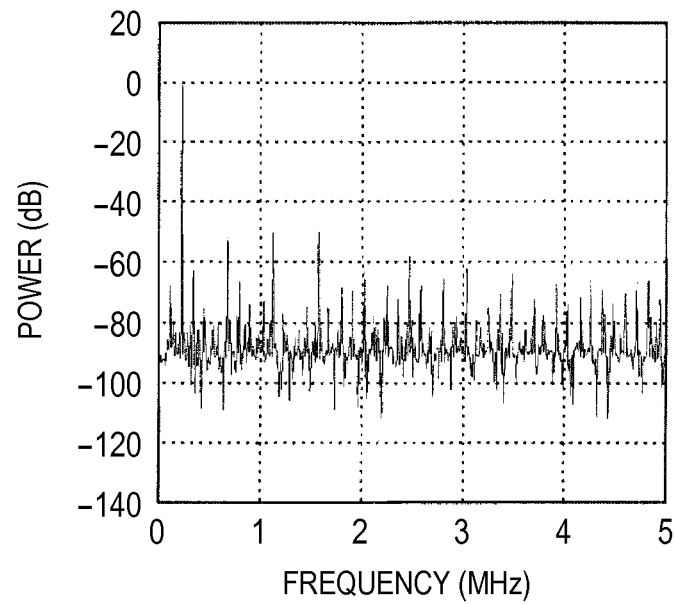
FIGS. 4A and 4B are drawings for describing specific examples of the frequency spectrum output by the A/D converter circuit based on the first embodiment.
Figure 4B:
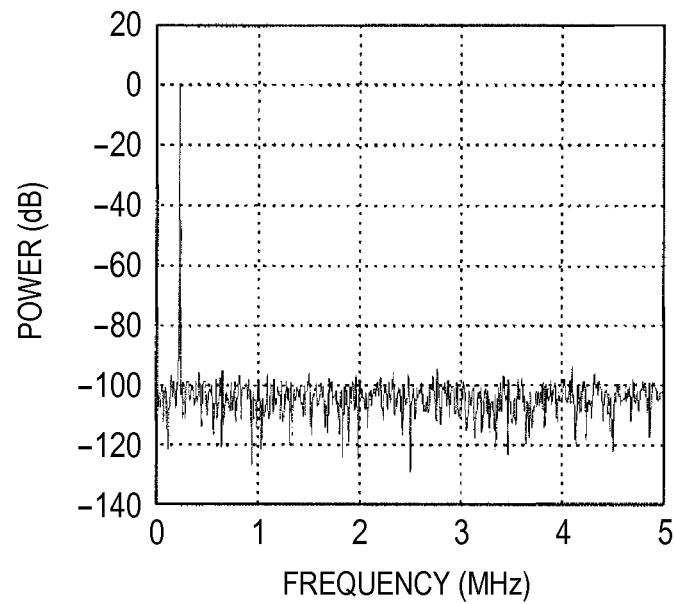

FIG. 4A and FIG. 4B are drawings for describing specific examples of the frequency spectrum of the output by the A/D converter circuit 1 based on the first embodiment.

The present example shows the frequency spectrum of the output when sampling a sine wave of a 225 KHz analog input signal at a sampling frequency of 10 MHz in the A/D converter circuit 1.

FIG. 4A is the frequency spectrum prior to searching for the weighting coefficient.

FIG. 4B is the frequency spectrum after searching for the weighting coefficient.

Results from optimizing the weighting coefficient by searching for the target weighting coefficient confirm that the high frequencies (RF) and noise floor are reduced in the frequency spectrum. The SNDR (Signal-to-noise and distortion ratio) are at this time improved from 44.5 dB to 75.7 dB. Moreover, the ENOB (Effective Number Of Bits) is improved from 7.10 bits to 12.28 bits. The ENOB is calculated by finding (SNDR−1.76)/6.02.

A specific example of interpolation is described next.
(Specific Example of Two Point Interpolation)

The weighting coefficient search method utilizing two-point interpolation as polynomial interpolation, and an LMS algorithm as the optimizing algorithm is described next.

The weighting coefficient search formula utilizing two-point interpolation is expressed in the next formula as follows.

[Formula 3]

$$W_i^{(new)} = W_i^{(old)} - \mu'_i [2x(k-1) - x(k) + x(k-2)] \times (2D_i^{(k-1)} - D_i^{(k)} + D_i^{(k-2)}) \quad (1)$$

The meaning of each variable is given here as follows:
$W_i^{(new)}$: Weighting coefficient after rewrite (post-rewrite weighting coefficient $W_i^{(old)}$)
$W_i^{(old)}$: Weighting coefficient before rewrite (pre-rewrite weighting coefficient $W_i^{(old)}$)
$\mu'_i$: Appropriate constant. Controls convergence speed of the coefficient search
k: Index expressing the No. of the sample.
x(k): Digital output value obtained by AD converting the k-th sample
$D_i^{(k)}$: i-th bit of AD conversion result for k-th sample
The formula (1) is derived as follows.

The output value x(k) for the A/D converter unit 10 is first of all expressed in the following formula (2).

[Formula 4]

$$x(k) = \sum_{i=0}^{N-1} W_i D_i^{(k)} \quad (2)$$

The estimation value ξ(k) found from two-point interpolation of x(k) is an average value for x(k+1) and x(k−1) so ξ(k) is given by the following formula (3).

$$\xi(k) = \frac{1}{2}[x(k+1) + x(k-1)] = \frac{1}{2}\left(\sum_{i=0}^{N-1} W_i D_i^{(k+1)} + \sum_{i=0}^{N-1} W_i D_i^{(k-1)}\right) \quad (3)$$

Therefore, the error e(k) for the estimation value ξ(k) and AD conversion value x(k) from formula (2) and formula (3) is as follows.

$$e(k) = x(k) - \xi(k) \quad (4)$$

$$= x(k) - \frac{1}{2}[x(k+1) + x(k-1)]$$

$$= \sum_{i=0}^{N-1} W_i D_i^{(k)} - \frac{1}{2}\left(\sum_{i=0}^{N-1} W_i D_i^{(k+1)} + \sum_{i=0}^{N-1} W_i D_i^{(k-1)}\right)$$

$$= \sum_{i=0}^{N-1} W_i \left(D_i^{(k)} - \frac{1}{2}D_i^{(k+1)} - \frac{1}{2}D_i^{(k-1)}\right)$$

The search vector $\delta_i^{(k)}$ is:

$$\delta_i^{(k)} = \frac{\partial e(k)}{\partial W_i} = D_i^{(k)} - \frac{1}{2}D_i^{(k+1)} - \frac{1}{2}D_i^{(k-1)} \quad (4A)$$

On the other hand the formula for searching the weighting coefficient when the LMS algorithm is applied so as to minimize e(k) is given as follows:

$$W_i^{(new)} = W_i^{(old)} - \mu_i e(k) \frac{\partial e(k)}{\partial W_i} \quad (5)$$

So that from applying formula (A) and formula (5):

$$W_i^{(new)} = W_i^{(old)} - \mu_i e(k)\left(D_i^{(k)} - \frac{1}{2}D_i^{(k+1)} - \frac{1}{2}D_i^{(k-1)}\right) \quad (6)$$

$$= W_i^{(old)} - \mu_i \left[x(k) - \frac{1}{2}x(k+1) - \frac{1}{2}x(k-1)\right] \times$$

$$\left(D_i^{(k)} - \frac{1}{2}D_i^{(k+1)} - \frac{1}{2}D_i^{(k-1)}\right)$$

Here, $\mu_i = 4\mu'_i$ and by substituting k→k−1, and interchanging the sequence of the terms, the following formula (7) is obtained.

$$W_i^{(new)} = W_i^{(old)} - \mu'_i [x(k) - 2x(k-1) + x(k-2)] \times \quad (7)$$

$$\left(D_i^{(k)} - 2D_i^{(k-1)} + D_i^{(k-2)}\right)$$

$$= W_i^{(old)} - \mu'_i [2x(k-1) - x(k) - x(k-2)] \times$$

$$\left(2D_i^{(k-1)} - D_i^{(k)} + D_i^{(k-2)}\right)$$

Formula (1) is calculated as described above.

FIG. 1 can be functionally executed as shown next in compliance with formula (1).

Figure 5:
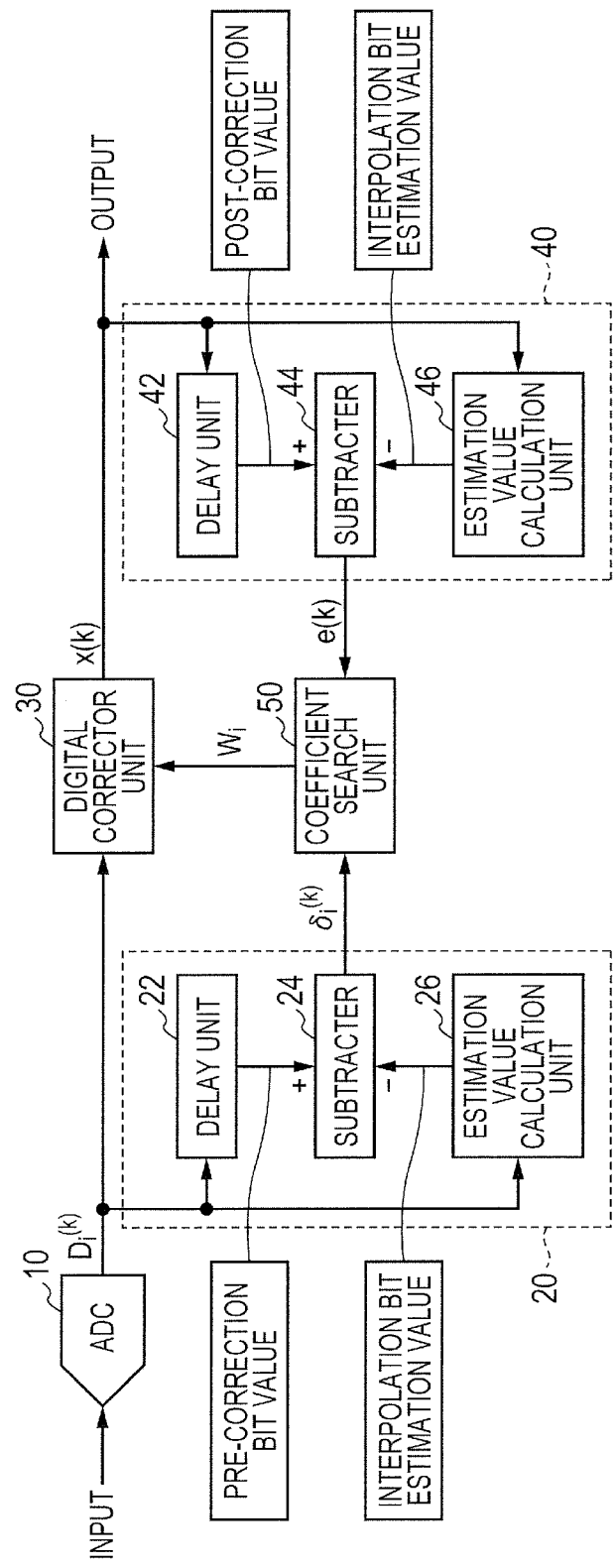
FIG. 5 is a block diagram for describing the function of a search vector generator unit and an error signal generator unit based on the first embodiment.

FIG. 5 is a block diagram for describing the function of the search vector generator unit 20 and error signal generator unit 40 the based on the first embodiment.

The search vector generator unit 20 as shown in FIG. 5, includes a delay unit 22, a subtracter 24, and an interpolation bit estimation value calculation unit 26.

The interpolation bit estimation value output unit 26 calculates the interpolation bit estimation value based on the approximate value of each bit in the pre-correction digital value.

The delay unit 22 uses the subtracter 24 to adjust the timing for obtaining the difference between each bit of the pre-correction digital value, and the interpolation bit estimation value from the interpolation bit estimation value calculation unit 26.

The subtracter 24 outputs the search vector $\delta_i^{(k)}$ for each bit based on the difference between each bit of the pre-correction digital value and the interpolation bit estimation value from the interpolation bit estimation value calculation unit 26.

The error signal generator unit 40 is comprised of the delay unit 42, the subtracter 44, and the interpolation estimation value calculation unit 46.

The interpolation estimation value calculation unit 46 calculates the interpolation estimation value based on the approximate value of the post-correction digital value x(k).

The delay unit 42 uses the subtracter 44 to adjust the timing when obtaining the difference between interpolation estimation value from the interpolation estimation value calculation unit 46, and the post-correction digital value.

The subtracter 44 outputs the error signal e(k) based on the difference between the post-correction digital value, and the interpolation estimation value output from the interpolation estimation value calculation unit 46.

Figure 6:
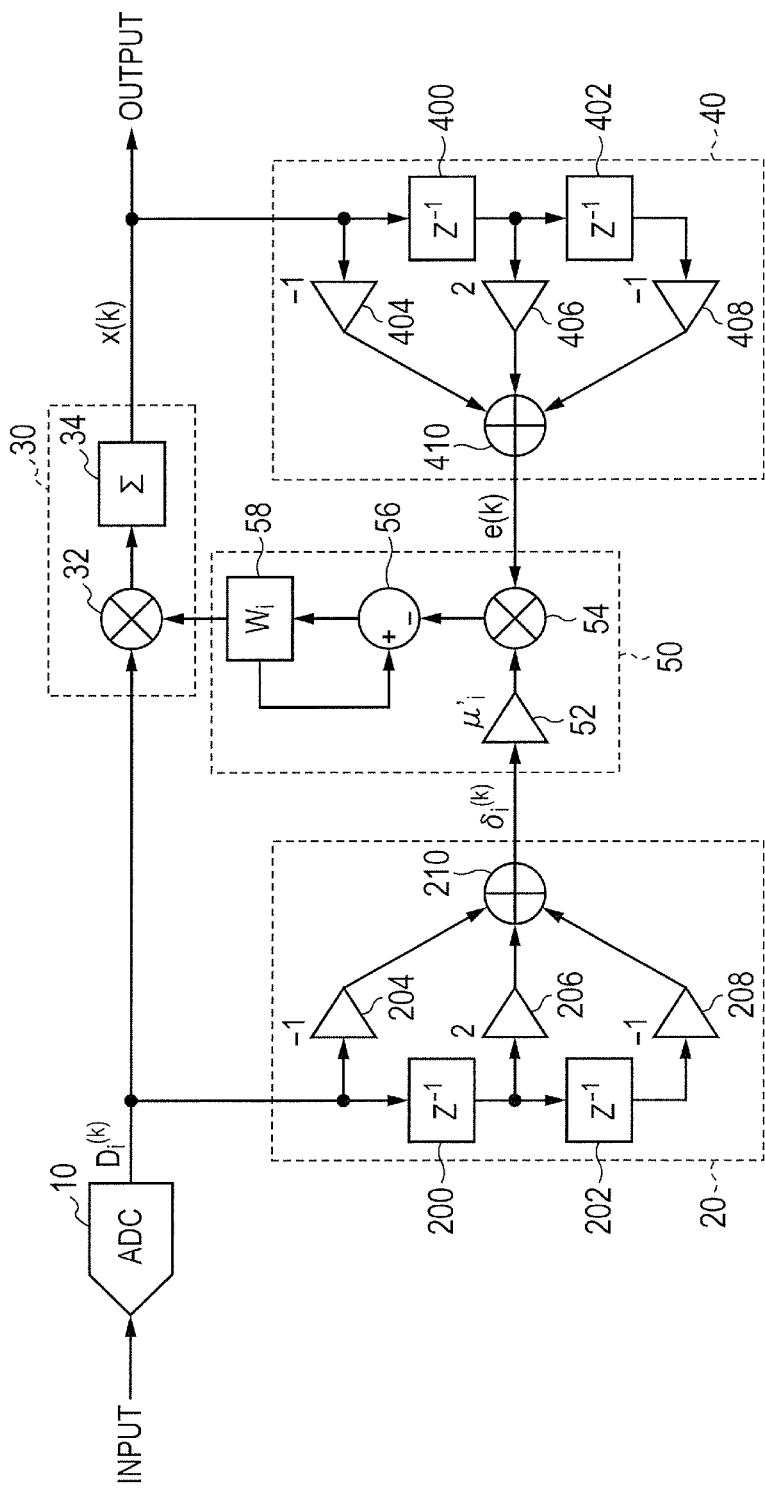
FIG. 6 is a drawing for describing the circuit structure of the A/D converter circuit based on the first embodiment.

FIG. 6 is a drawing for describing the circuit structure of the A/D converter circuit 1 based on the first embodiment.

The A/D converter circuit 1 shown in FIG. 6 is configured as shown in the drawing in compliance with "$2D_i^{(k-1)} - D_i^{(k)} - D_i^{(k-2)}$" of formula 1. More specifically, the search vector generator unit 20 is comprised of the delay elements 200, 202, the multipliers 204, 206, 208, and the adder 210. The A/D converter circuit 1 in this way calculates the search vector $\delta_i^{(k)}$ corresponding to each bit.

The error signal generator unit 40 is configured as shown in the drawing in compliance with "2x(k−1)−x(k)−x(k−2)" of formula 1. More specifically, the error signal generator unit 40 is comprised of the delay elements 400, 402, the multipliers 404, 406, 408, and the adder 410. The error signal generator unit 40 in this way calculates the error signal e(k) which is the difference between the post-correction digital value and the interpolation estimation value based on the approximate value of the post-correction digital value.

The coefficient search unit 50 is comprised of a multiplier 52 for the multiplying factor $\mu'_i$ according to formula (1), a multiplier 54 for multiplying the output of the multiplier 52 with the error signal e(k), a subtracter 56 to subtract the output from the multiplier 54 from the pre-rewrite weighting coefficient $W_i^{(old)}$, and a retention unit 58 to output the output from the subtracter 56 as the post-rewrite weighting coefficient $W_i^{(new)}$.

The digital corrector unit 30 is comprised of a multiplier 32 to multiply the post-correction weighting coefficient $W_i^{(new)}$ by the pre-correction digital value for each bit, and the integrator 34 to output the post-corrected digital value x(k) that is integrated from the value of each bit multiplied in the multiplier 32.

The above structure or in other words, the error signal generator unit 40 calculates the error signal e(k) which is the difference between the post-correction digital value and the interpolation estimation value based on the approximate value of the post-correction digital value. The search vector generator unit 20 then calculates the interpolation bit estimation value based on the approximate value of each bit $D_i^{(k)}$ for the digital value each bit $D_i^{(k)}$ and calculates the search vector $\delta_i^{(k)}$ based on that difference.

The correction direction for the weighting coefficient of each bit is determined by the search vector $\delta_i^{(k)}$, and the weighting coefficient can be converged to an optimum value so as to reduce the error signal e(k) by the coefficient search unit 50 by utilizing the LMS algorithm.

The A/D converter circuit 1 can therefore execute high-speed and high-accurate A/D conversion processing based on the first embodiment.

In comparison with the example of the related art, the structure or namely the AD converter circuit 1 based on the first embodiment is a simple structure including a single A/D converter unit (ADC), and further requires no mechanism for applying an offset so that along with a smaller surface area, an increase in consumption current can also be prevented.

(Specific Example of 4-Point Interpolation)

A search method for weighting coefficients utilizing 4-point interpolation as polynomial interpolation is described.

A weighting coefficient search formula utilizing 4-point interpolation is shown in the next formula.

[Formula 5]

$$W_i^{(new)} = W_i^{(old)} - \mu'_i[x(k) - 4x(k-1) + 6x(k-2) - 4x(k-3) + x(k-4)] \times \left(D_i^{(k)} - 4D_i^{(k-1)} + 6D_i^{(k-2)} - 4D_i^{(k-3)} + D_i^{(k-4)}\right) \tag{8}$$

Formula (8) is derived as follows.

The digital output value x(k) for the A/D converter unit 10 is expressed in the formula (2) as described for 2-point interpolation.

[Formula 6]

The estimation value $\xi(k)$ found from four-point interpolation of x(k) is given by the following formula (9) utilizing formula (14).

$$\xi(k) = \frac{1}{6}[4x(k+1) + 4x(k-1) - x(k+2) - x(k-2)] \tag{9}$$

$$= \frac{1}{6}\left(4\sum_{i=0}^{N-1} W_i D_i^{(k+1)} + 4\sum_{i=0}^{N-1} W_i D_i^{(k-1)} - \sum_{i=0}^{N-1} W_i D_i^{(k+2)} + \sum_{i=0}^{N-1} W_i D_i^{(k-2)}\right)$$

Therefore, the error e(k) for the AD conversion value x(k) and estimation value $\xi(k)$ are given as follows from formula (2) and formula (9).

$$e(k) = x(k) - \xi(k) = x(k) - \frac{1}{6}\left[\begin{array}{c} 4x(k+1) + 4x(k-1) - \\ x(k+2) - x(k-2) \end{array}\right] \tag{10}$$

$$= \sum_{i=0}^{N-1} W_i D_i^{(k)} - \frac{1}{6}\left(4\sum_{i=0}^{N-1} W_i D_i^{(k+1)} + 4\sum_{i=0}^{N-1} W_i D_i^{(k-1)} - \sum_{i=0}^{N-1} W_i D_i^{(k+2)} + \sum_{i=0}^{N-1} W_i D_i^{(k-2)}\right)$$

$$= \sum_{i=0}^{N-1} W_i \left(D_i^{(k)} - \frac{2}{3}D_i^{(k+1)} - \frac{2}{3}D_i^{(k-1)} + \frac{1}{6}D_i^{(k+2)} + \frac{1}{6}D_i^{(k-2)}\right)$$

The search vector $\delta_i^{(k)}$ is found by:

$$\delta_i^{(k)} = \frac{\partial e(k)}{\partial W_i} = D_i^{(k)} - \frac{2}{3}D_i^{(k+1)} - \frac{2}{3}D_i^{(k-1)} + \frac{1}{6}D_i^{(k+2)} - \frac{1}{6}D_i^{(k-2)} \tag{10A}$$

On the other hand, the search formula for the weighting coefficient when an LMS algorithm is applied so as to minimize e(k) is given as follows:

$$W_i^{(new)} = W_i^{(old)} - \mu_i e(k) \frac{\partial e(k)}{\partial W_i} \quad (11)$$

So that from formula (10A) and formula (11) we obtain $$W_i^{(new)} = W_i^{(old)} - \mu_i e(k) \begin{pmatrix} D_i^{(k)} - \frac{2}{3}D_i^{(k+1)} - \frac{2}{3}D_i^{(k-1)} + \\ \frac{1}{6}D_i^{(k+2)} + \frac{1}{6}D_i^{(k-2)} \end{pmatrix} \quad (12)$$

$$= W_i^{(old)} - \mu_i \begin{bmatrix} x(k) - \frac{2}{3}x(k+1) - \frac{2}{3}x(k-1) + \\ \frac{1}{6}x(k+2) + \frac{1}{6}x(k-2) \end{bmatrix} \times$$

$$\left( D_i^{(k)} - \frac{2}{3}D_i^{(k+1)} - \frac{2}{3}D_i^{(k-1)} + \frac{1}{6}D_i^{(k+2)} + \frac{1}{6}D_i^{(k-2)} \right)$$

Here, with $\mu'_i = 36\mu_i$, and substituting $k \to k-2$, and interchanging the sequence of the terms gives the following formula (13).

$$W_i^{(new)} = \quad (13)$$
$$W_i^{(old)} - \mu'_i [x(k) - 4x(k-1) + 6x(k-2) - 4x(k-3) + x(k-4)] \times$$
$$\left( D_i^{(k)} - 4D_i^{(k-1)} + 6D_i^{(k-2)} - 4D_i^{(k-3)} + D_i^{(k-4)} \right)$$

The above allows calculating the formula (8).

Figure 7:
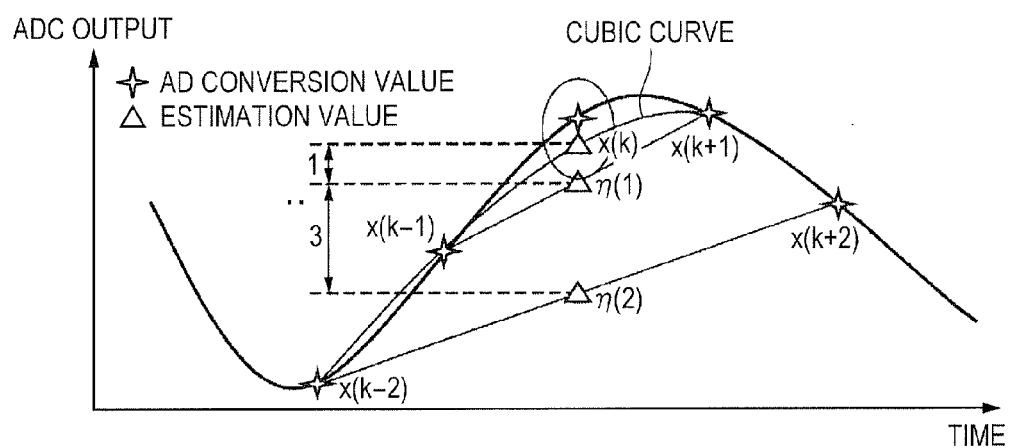
FIG. 7 is a drawing for describing the calculation of the estimation value $\xi(k)$ by four-point interpolation based on the first embodiment.

Here the calculation of the estimation value ξ(k) by 4-point interpolation is described while referring to FIG. 7.

[Formula 7]

$$\xi(k) = \frac{1}{6}[4x(k+1) + 4x(k-1) - x(k+2) - x(k-2)] \quad (14)$$

The AD conversion value first of all approximates the cubic curve in the following formula (15).

$$\xi(t) = a(t-k)^3 + b(t-k)^2 + c(t-k) + d \quad (15)$$

Assuming that each point (k−2, k−1, k+1, k+2) on this approximate curve matches the AD conversion values, then the following is obtained:

$$x(k-2) = \xi(k-2) = -8a + 4b - 2c + d \quad (16)$$

$$x(k-1) = \xi(k-1) = -a + b - c + d \quad (17)$$

$$x(k+1) = \xi(k+1) = a + b + c + d \quad (18)$$

$$x(k+2) = \xi(k+2) = 8a + 4b + 2c + d \quad (19)$$

The estimation value ξ(k) on the other hand is given by the following formula $$\xi(k) = d \quad (20)$$

The intermediate points η(1), η(2) are defined in the following formulas.

$$\eta(1) = \frac{x(k+1) + x(k-1)}{2} = b + d \quad (21)$$

$$\eta(2) = \frac{x(k+2) + x(k-2)}{2} = 4b + d \quad (22)$$

Here, eliminating b gives:

$$4\eta(1) - \eta(2) = 3d \quad (23)$$

so therefore, solving for d yields:

$$\xi(k) = \quad (24)$$
$$d = \frac{1}{3}(4\eta(1) - \eta(2)) = \frac{1}{6}[4x(k+1) + 4x(k-1) - x(k+2) - x(k-2)]$$

Figure 8:
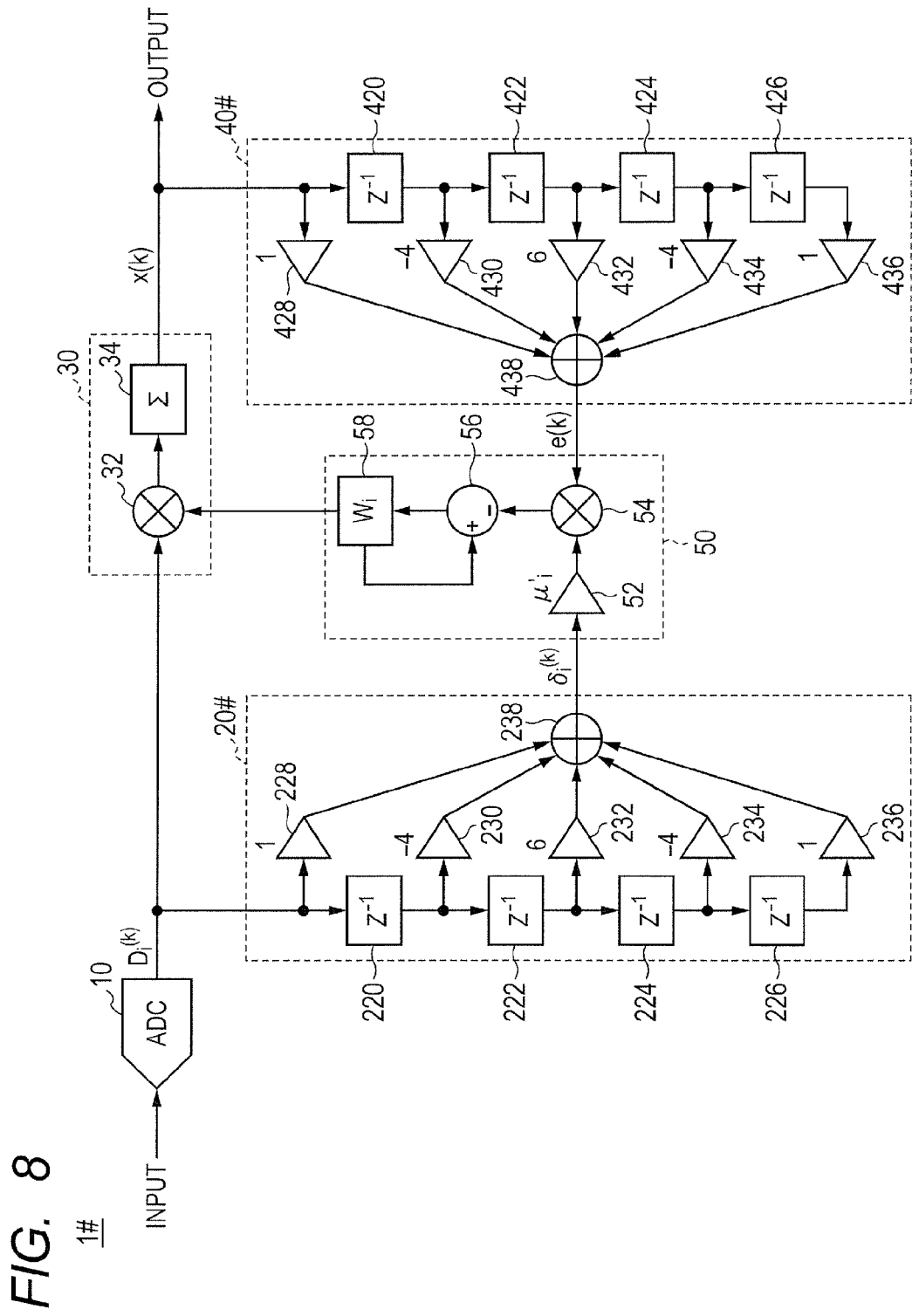
FIG. 8 is a drawing for describing the circuit structure of A/D converter circuit based on the first embodiment.

FIG. 8 is a drawing for describing the circuit structure of A/D converter circuit 1# based on the first embodiment. The A/D converter circuit 1# shown in FIG. 8, searches for a weighting coefficient by utilizing 4-point interpolation. In the present example, along with substituting the search vector generator unit 20 described in FIG. 4, with the search vector generator unit 20#, the error signal generator unit 40 is substituted with the error signal generator unit 40#. The other structural elements are identical so a redundant description is omitted.

More specifically, the search vector generator unit 20# is configured as shown in the drawing according to "$D_i^{(k)} - 4D_i^{(k-1)} + 6D_i^{(k-2)} - 4D_i^{(k-3)} + D_i^{(k-4)}$" in formula (8). Specifically, the search vector generator unit 20 is comprised of the delay elements 220 to 226, the multipliers 228 to 236, and the adder 238. A search vector $\delta_i^{(k)}$ corresponding to each bit can in this way be calculated.

The error signal generator unit 40# is comprised as shown in the drawing according to "x(k)−4x(k−1)+6x(k−2)−4x(k−3)+x(k−4)" in formula (8). Specifically, the error signal generator unit 40# is comprised of the delay elements 420 to 426, the multipliers 428 to 436, and the adder 438. The error signal e(k) which is the difference between the post-correction digital value and the interpolation estimation value based on the approximate value of the post-correction digital value is calculated in this way.

The coefficient search unit 50 according to the formula (8) is comprised of a multiplier 52 having a multiplying factor $\mu'_i$, a multiplier 54 for multiplying the output of the multiplier 52 and the error signal e(k), a subtracter 56 for subtracting the output from the multiplier 54 from the pre-rewrite weighting coefficient $W_i^{(old)}$, and a retention unit 58 to output the output from the subtracter 56 as the post-rewrite weighting coefficient $W_i^{(new)}$.

The digital corrector unit 30 is comprised of a multiplier 32 to multiply the post-rewrite weighting coefficient $W_i^{(new)}$ by the pre-correction digital value for each bit, and the integrator 34 to output the post-corrected digital value x(k) which is integrated from the value of each bit multiplied in the multiplier 32.

The above structure or in other words, the error signal generator unit 40# calculates the error signal e(k) which is the difference between the post-correction digital value and the interpolation estimation value based on the approximate value of the post-correction digital value. The search vector generator unit 20# then calculates the interpolation bit estimation value based on the approximate value of each bit $D_i^{(k)}$ for each bit $D_i^{(k)}$ of the digital value and calculates the search vector $\delta_i^{(k)}$ based on that difference.

The correction direction for the weighting coefficient of each bit is determined by the search vector $\delta_i^{(k)}$, and the weighting coefficient can be converged to an optimum value so as to reduce the error signal e(k) by the coefficient search unit 50 by utilizing the LMS algorithm.

The A/D converter circuit 1# based on the first embodiment can therefore execute high-speed and high-accurate A/D conversion processing.

In comparison to the example of the related art, the above structure or namely the AD converter circuit 1# based on the first embodiment has a simple structure including a single A/D converter unit (ADC), and also requiring no mechanism for applying an offset so that along with a smaller surface area, an increase in current consumption can also be prevented.

(Specific Example of 2n-Point Interpolation)
[Formula 8]

In the weighting coefficient formulas (1) and (8) for 2-point and 4-point interpolation, the coefficient for each term in the formula for the error signal is a binomial coefficient. In other words, in the case of 2-point interpolation the coefficient is $(1 -2\ 1) = (_2C_2\ -_2C_1\ _2C_0)$; and in the case of 4-point interpolation the coefficient is $(1\ -4\ 6\ -4\ 1) = (_4C_4\ -_4C_3\ _4C_2\ -_4C_1\ _4C_0)$. The approach is generally the same for 2-point interpolation so each coefficient becomes $(-1)^{n-1}{}_nC_1$. The weighting coefficient is therefore as shown below.

$$W_i^{(new)} = W_i^{(old)} - \mu_i' \left[ \sum_{l=0}^{2n} (-1)^{n-l} {}_nC_l x(k-l) \right] \times \left[ \sum_{l=0}^{2n} (-1)^{n-l} {}_nC_l D_i^{(k-l)} \right] \quad (25)$$

Figure 9:
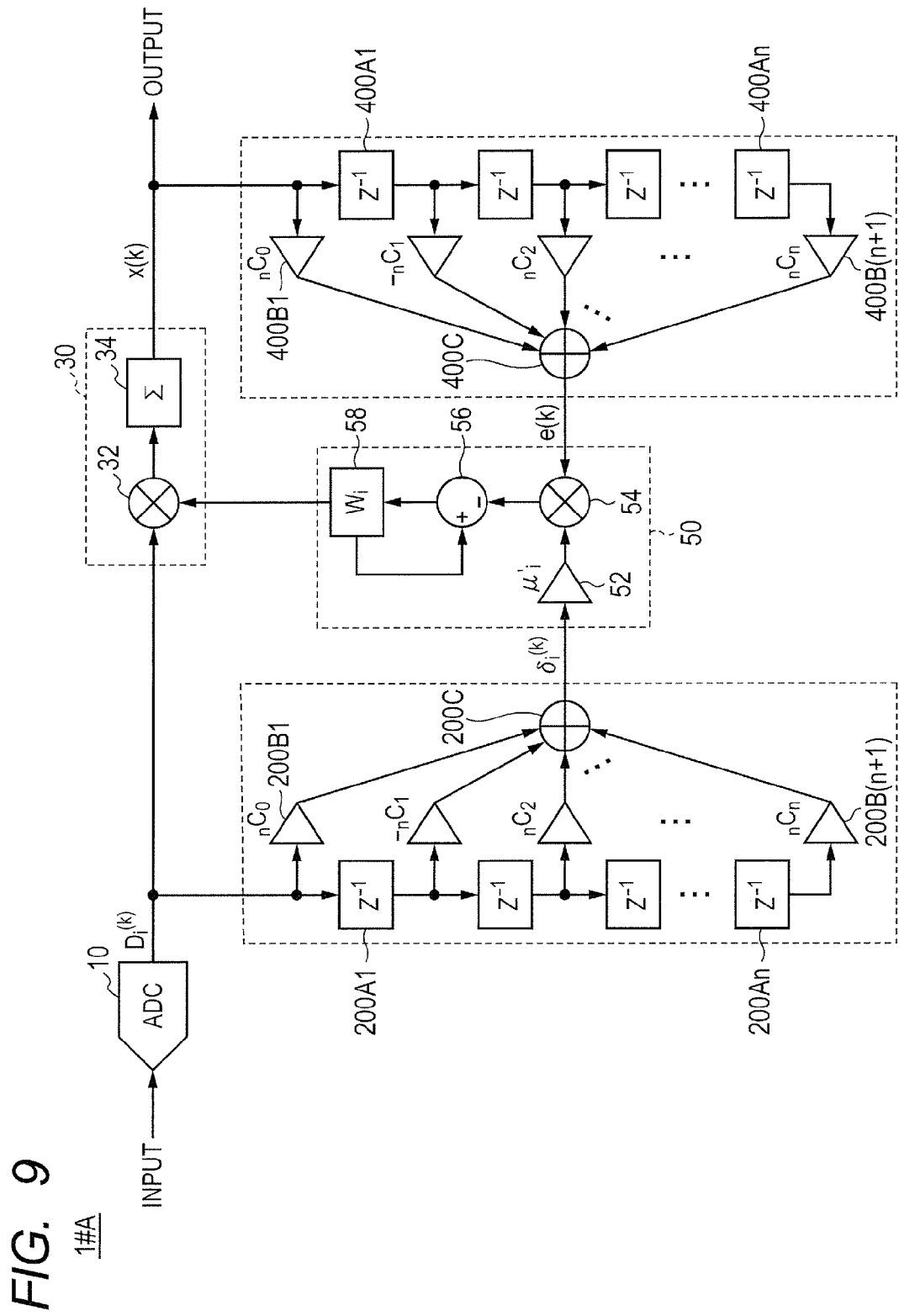
FIG. 9 is a drawing for describing the circuit structure of A/D converter circuit based on the first embodiment.

FIG. 9 is a drawing for describing the circuit structure of A/D converter circuit 1#A based on the first embodiment.

The A/D converter circuit 1#A shown in FIG. 9, searches for a weighting coefficient by utilizing 2n-point interpolation. In the present example, along with substituting the search vector generator unit 20 described in FIG. 4, with the search vector generator unit 20#A, the error signal generator unit 40 is substituted with the error signal generator unit 40#A. The other elements are identical so a redundant description is omitted.

More specifically, the search vector generator unit 20# is configured as shown in the drawing according to formula (25). Specifically, the search vector generator unit 20# is comprised of the delay elements 200A1 to 200An, the multipliers 200B1 to 200B (n+1), and the adder 200C. A search vector $\delta_i^{(k)}$ corresponding to each bit is calculated in this way.

The error signal generator unit 40#A is comprised as shown in the drawing according to the formula (25) described above. More specifically, the error signal generator unit 40#A is comprised of the delay elements 400A1 to 400An, the multipliers 400B1 to 400B (n+1), and the adder 400C. The error signal e(k) which is the difference between the post-correction digital value and the interpolation estimation value based on the approximate value of the post-correction digital value is calculated in this way.

The coefficient search unit 50 according to the formula (25) is comprised of a multiplier 52 having a the multiplying factor $\mu_i'$, a multiplier 54 for multiplying the output of the multiplier 52 and the error signal e(k), a subtracter 56 for subtracting the output from the multiplier 54 from the pre-rewrite weighting coefficient $W_i^{(old)}$, and a retention unit 58 to output the output from the subtracter 56 as the post-rewrite weighting coefficient $W_i^{(new)}$.

The digital corrector unit 30 is comprised of a multiplier 32 to multiply the post-correction weighting coefficient $W_i^{(new)}$ by each bit of the pre-correction digital value, and the integrator 34 to output the post-correction digital value x(k) which is integrated from the value of each bit that is multiplied in the multiplier 32.

The above structure or in other words, the error signal generator unit 40#A calculates the error signal e(k) which is the difference between the post-correction digital value and the interpolation estimation value based on the approximate value of the post-correction digital value. The search vector generator unit 20#A then calculates the interpolation bit estimation value based on the approximate value of each bit $D_i^{(k)}$ for the digital value and calculates the search vector $\delta_i^{(k)}$ based on that difference.

The correction direction for the weighting coefficient of each bit is determined by the search vector $\delta_i^{(k)}$, and the weighting coefficient can be converged to an optimum value so as to reduce the error signal e(k) by the coefficient search unit 50 by utilizing the LMS algorithm.

The A/D converter circuit 1#A can therefore execute high-speed and high-accurate A/D conversion processing based on the first embodiment.

In comparison to the example of the related art, the above structure or namely the AD converter circuit 1#A based on the first embodiment has a simple structure including a single A/D converter unit (ADC), and also requiring no mechanism for applying an offset so that along with a smaller surface area, an increase in consumption current can also be prevented.

(First Modification of the First Embodiment)
[Formula 9]

Examining the properties of the binomial coefficient shows that formula (25) can express the power of $(1-z^{-1})$. First of all, formula (25) can be written as shown below utilizing z conversion.

$$W_i^{(new)} = W_i^{(old)} - \quad (26)$$
$$\mu_i' \left[ \sum_{l=0}^{2n} Z^{-1}(-1)^{n-l}{}_nC_l z^{-l} Zx(k) \right] \times \left[ \sum_{l=0}^{2n} Z^{-1}(-1)^{n-l}{}_nC_l z^{-l} ZD_i^{(k)} \right]$$

Here, Z denotes z conversion and $Z^{-1}$ denotes inverse z conversion. The properties of the binomial coefficient yield:

$$\sum_{l=0}^{m} {}_nC_l a^l b^{n-l} = (a+b)^m \quad (27)$$

so that by setting a=1, b=$-z^{-1}$, and m=2n we obtain, $$\sum_{l=0}^{2n} (-1)^{n-l}{}_nC_l = (1-z^{-1})^{2N} \quad (28)$$

Therefore, formula (26) can be rewritten as follows.

$$W_i^{(new)} = W_i^{(old)} - \mu_i' [Z^{-1}(1-z^{-1})^{2n} Zx(k)] \times [Z^{-1}(1-z^{-1})^{2n} ZD_i^{(k)}] \quad (29)$$

At this point, $(1-z^{-1})$ in formula (29) is a transfer function whose high-pass characteristic has a maximum value and frequency characteristics such that the amplitude is that of a Nyquist frequency.

The weighting coefficient search formula on the other hand is not restricted to a form that is a power of $(1-z^{-1})$, and is capable of searching the weighting coefficient even if the $(1-z^{-1})$ in formula (29) is substituted with a typical high-pass characteristic transfer function H(z).

Consider the case for example where the transfer function H(z) is assumed to be an FIR (Finite Impulse Response) filter.

[Formula 10]

$$e(k) = Z^{-1}H(z)Zx(k) = \sum_m h_m x(k-m) = \sum_m \left( h_m \sum_{i=0}^{N-1} W_i D_i^{(k-m)} \right) \quad (30)$$

When utilizing the above formula, the search vector $\delta_i^{(k)}$ is:

$$\delta_i^{(k)} = \frac{\partial e(k)}{\partial W_i} = \quad (31)$$

$$\frac{\partial}{\partial W_i}[Z^{-1}H(z)Zx(k)] = \frac{\partial}{\partial W_i} \sum_m \left( h_m \sum_{i=0}^{N-1} W_i D_i^{(k-m)} \right) = \sum_m h_m D_i^{(k-m)}$$

Therefore, the weighting coefficient search formula is:

$$W_i^{(new)} = W_i^{(old)} - \mu_i \left[ \sum_m h_m x(k-m) \right] \times \left[ \sum_m h_m D_i^{(k-m)} \right] \quad (32)$$

Or if correcting formula (32) to a formula for H(z) is:

$$W_i^{(new)} = W_i^{(old)} - \mu'_i [Z^{-1}H(z)Zx(k)] \times [Z^{-1}H(z)ZD_i^{(k)}] \quad (33)$$

However, the transfer function for the search vector generator unit and error signal generator unit need not always be the same so by substituting with $H_1(z)$ and $H_2(z)$ to distinguish between both, we can write the weighting coefficient search formula as:

$$W_i^{(new)} = W_i^{(old)} - \mu'_i [Z^{-1}H_1(z)Zx(k)] \times [Z^{-1}H_2(z)ZD_i^{(k)}] \quad (34)$$

and this formula is more generally used than the weighting coefficient search formula mentioned above.

The structural diagram for the case when utilizing the search formula of formula (34) is described next.

Figure 10:
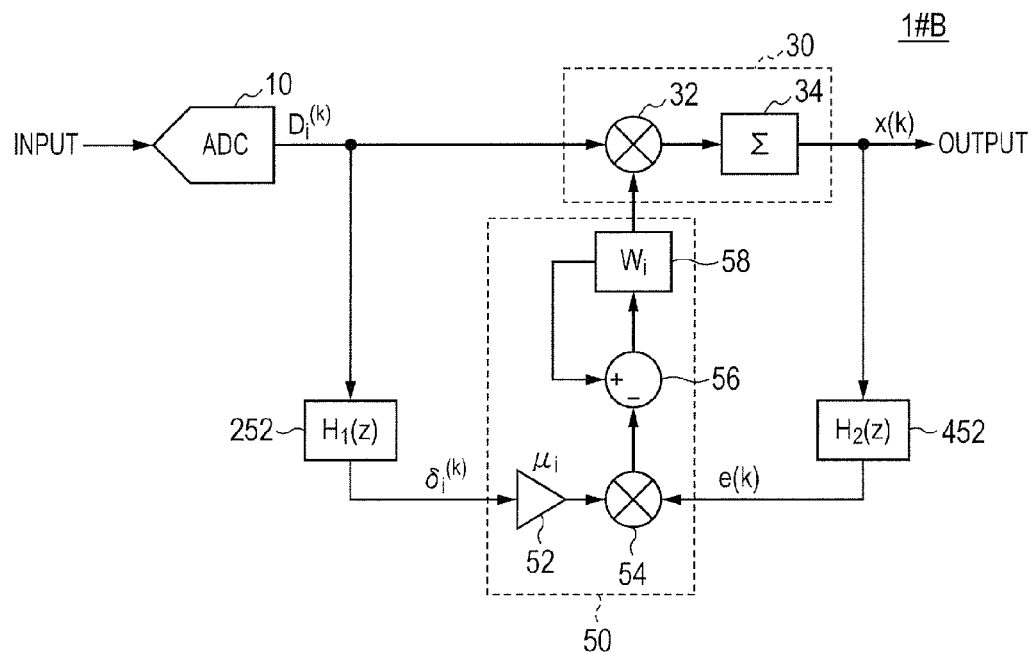
FIG. 10 is a drawing for describing the circuit structure of A/D converter circuit based on a first modification of the first embodiment.

FIG. 10 is a drawing for describing the structure of A/D converter circuit 1#B based on a first modification of the first embodiment.

FIG. 10 shows the case where utilizing a digital filter 252 for the transfer function $H_1(Z)$ as the search vector generator unit 20.

FIG. 10 also shows the case where utilizing a digital filter 452 for the transfer function $H_2(z)$ as the error signal generator unit 40.

Here, assuming that the transfer function H(z) derived in the above described formula (33) is FIR, a transfer function H(z) that is IIR might not always be established with formula (33).

However, the weighting coefficient can be calculated by formula (34) even when the transfer function H(z) is IIR.

The above described structure is capable of utilizing a digital filter as the search vector generator unit 20 and the error signal generator unit 40.
(Second Modification of the First Embodiment)

When the signal band on the other hand, is on the low frequency side, the error signal generator unit 40 can generate an error signal utilizing a high-pass filter as the digital filter. Conversely, when the signal band is on the high frequency side, the error signal generator unit 40 can generate an error signal utilizing a low-pass filter as the digital filter. However offset correction is required.

Offset correction is required because the offset is equivalent to noise in the low frequency component and so correctly searching for the coefficient requires canceling out the offset by way of an offset correction. When the A/D conversion circuit is designed, the digital value output from the A/D conversion circuit will not always be zero even for the case of zero input. The voltage potential from this zero is called the offset.

A second modification of the first embodiment is described for the case where correcting the offset.

Figure 11:
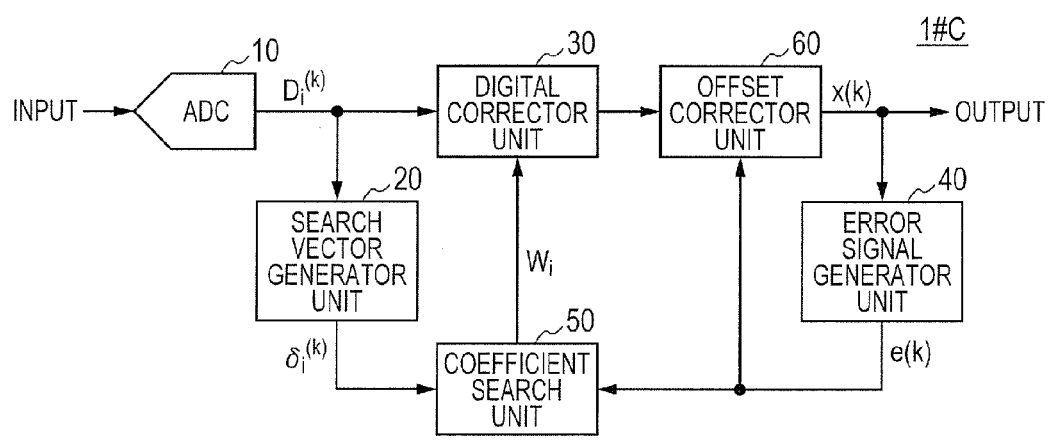
FIG. 11 is an outline diagram for describing the structure of A/D converter circuit based on a second modification of the first embodiment.

FIG. 11 is an outline diagram for describing the structure of A/D converter circuit 1#C based on a second modification of the first embodiment.

The A/D converter circuit 1#C as shown in FIG. 11, differs from the A/D converter circuit 1 in FIG. 1 in the point that the A/D converter circuit 1#C further contains an offset corrector unit 60 to correct the offset in the output value from the digital corrector unit 30.

The specific structure of the offset corrector unit 60 is described next.
[Formula 11]

Adding an offset correction term $W_{OFS}$ to the digital output value from the ADC gives:

$$x(k) = \sum_{i=0}^{N-1} W_i D_i^{(k)} + W_{OFS} \quad (35)$$

Assuming the H(z) is FIR and substituting in gives.

$$e(k) = Z^{-1}H(z)Zx(k) = \quad (36)$$

$$\sum_m h_m x(k-m) = \sum_m \left( h_m \sum_{i=0}^{N-1} W_i D_i^{(k-m)} \right) + \sum_m h_m W_{OFS}$$

The offset correction term first of all is:

$$\frac{\partial e(k)}{\partial W_{OFS}} = \frac{\partial}{\partial W_{OFS}}[Z^{-1}H(z)Zx(k)] = \frac{\partial}{\partial W_{OFS}} \sum_m \left( h_m \sum_{i=0}^{N-1} W_i D_i^{(k-m)} \right) + \quad (37)$$

$$\frac{\partial}{\partial W_{OFS}} \sum_m h_m W_{OFS}$$

$$= \sum_m h_m \propto 1$$

The search formula for the offset correction term is therefore provided in the following formula.

$$W_{OFS}^{(new)} = W_{OFS}^{(old)} - \mu_{OFS} \sum_m h_m x(k-m) \quad (38)$$

Rewriting the above formula to an expression utilizing H(z) gives the following formula.

$$W_{OFS}^{(new)} = W_{OFS}^{(old)} - \mu_{OFS} Z^{-1} H(z) Zx(k) \quad (39)$$

Figure 12:
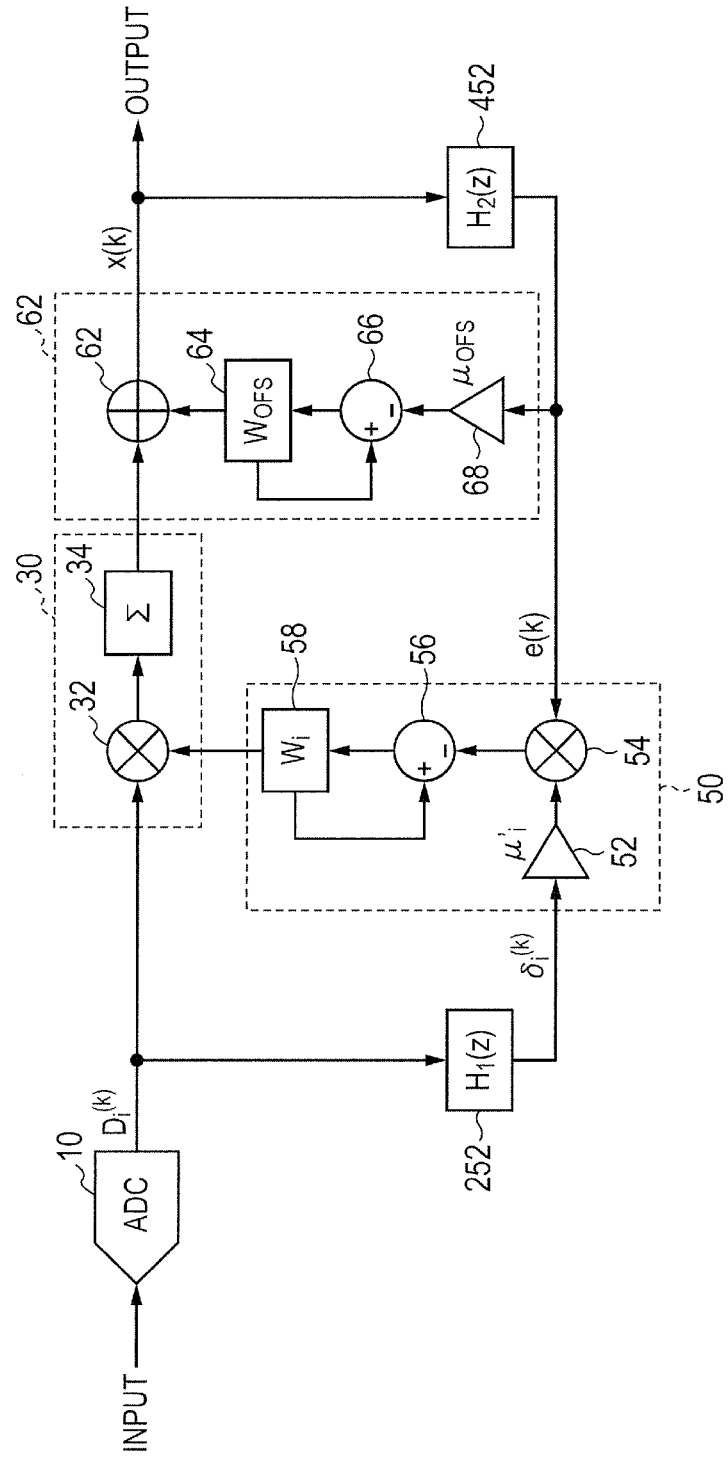
FIG. 12 is a drawing for describing the circuit structure of A/D converter circuit based on a second modification of the first embodiment.

FIG. 12 is a drawing for describing the circuit structure of A/D converter circuit 1#C based on a second modification of the first embodiment.

As shown in FIG. 12, the present example shows the case where a digital filter 252 for the transfer function $H_i(z)$ is utilized as the search vector generator unit 20, and a digital filter 452 for the transfer function $H_2(z)$ is utilized as the error signal generator unit 40.

An offset corrector unit 60 includes a multiplier 68 for the multiplying factor $\mu_{OFS}$ according to formula (39), a subtracter 66 to subtract the output from the multiplier 68 from the pre-rewrite offset correction term $W_{OFS}$, a retention unit 64 to output the output from the subtracter 66 as the post-rewrite offset correction term $W_{OFS}$, and an adder 62 to add the post-rewrite offset correction term $W_{OFS}$ to the output of the digital corrector unit 30.

The weighting coefficient is the same as described above and so the weighting coefficient search formula is formula (32) or formula (33).

The above structure is capable of utilizing a low-pass filter as the digital filter for the error signal generator unit 40 by offset correction via the offset corrector unit 60.

(Third Modification of the First Embodiment)

The weighting coefficient search processing on the other hand causes convergence of the weighting coefficient to an optimal value, however the converged weighting coefficient does not always match with an optimum value and fluctuations may possibly occur in the vicinity of the optimal value, possibly causing deterioration in the characteristics of the A/D converter circuit.

A method for preventing deterioration in A/D converter circuit characteristics is described in a third modification of the first embodiment. More specifically, removing weighting coefficient fluctuations by a digital filter is capable of preventing deterioration in A/D converter circuit characteristics.

Figure 13:
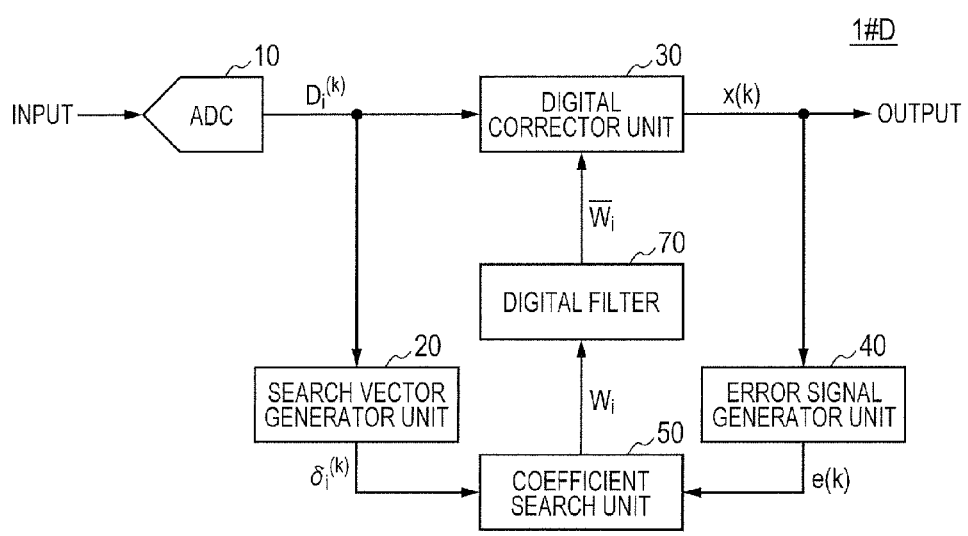
FIG. 13 is an outline diagram for describing the structure of A/D converter circuit based on a third modification of the first embodiment.

FIG. 13 is an outline diagram for describing the structure of the A/D converter circuit 1#D based on a third modification of the first embodiment.

The A/D converter circuit 1#D shown in FIG. 13, differs from the A/D converter circuit 1 in FIG. 1 in the point that a digital filter 70 is further provided for filter processing of the weighting coefficients output from the coefficient search unit 50.

The specific structure of the digital filter 70 is described next.

As one example, a FIR filter, an IIR filter, an adaptive filter, and other filters may be utilized as the digital filter 70.

Figure 14:
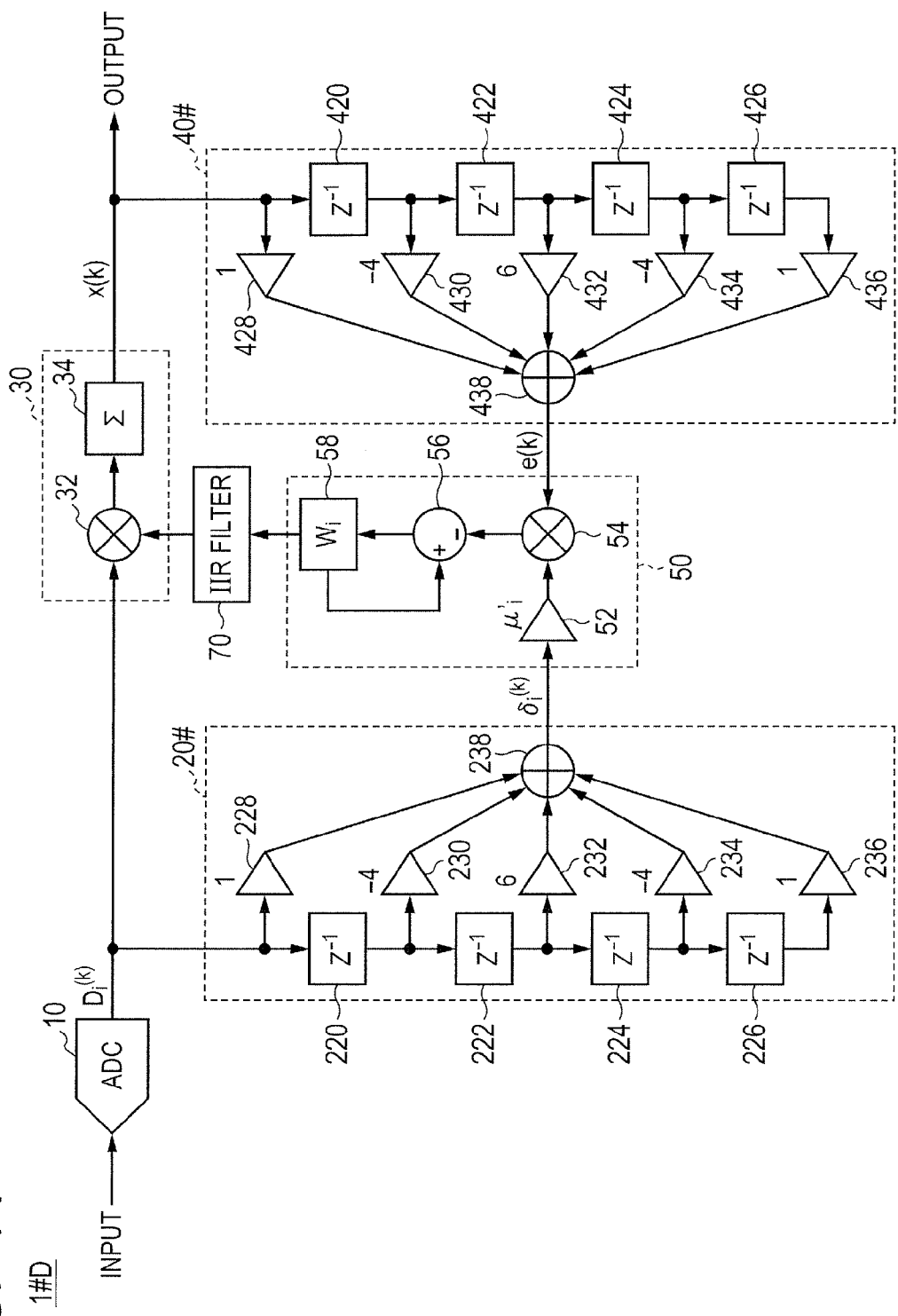
FIG. 14 is a drawing for describing the circuit structure of A/D converter circuit based on a third modification of the first embodiment.

FIG. 14 is a drawing for describing the circuit structure of A/D converter circuit 1#D based on a third modification of the first embodiment.

As shown in FIG. 14, the present example shows the case where the weighting coefficient searching processing is performed by utilizing 4-point interpolation based on formula (8) as described in FIG. 8. More specifically, the utilization of the search vector generator unit 20# and the error signal generator unit 40# is shown. The case where an IIR filter 70 is provided as the digital filter 70 between the coefficient search unit 50 and the digital corrector unit 30 is shown.

Figure 15:
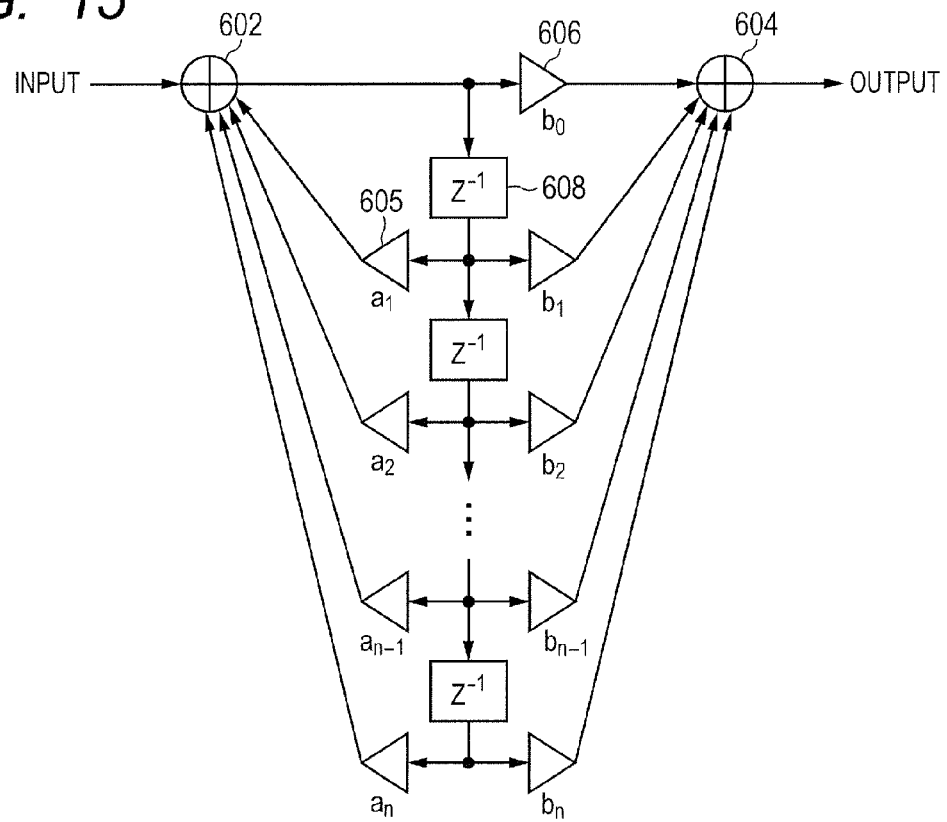
FIG. 15 is a drawing for describing the circuit structure of the IIR filter based on a third modification of the first embodiment.

FIG. 15 is a drawing for describing the IIR filter 70 circuit structure based on a third modification of the first embodiment.

As shown in FIG. 15, the IIR filter 70 is comprised of plural delay elements 608 to delay the signal from the adder 602, plural multipliers 606 for the filter constants b0 to bn, an adder 604 for adding the outputs from the plural multiplier 606 for the filter constants b0 to bn, the plural multipliers 605 for the filter constants 1a to 1n, and an adder 602 to add the input signals and outputs from the plural multipliers 605 of the filter constants a1 to an.

The FIR filter is equivalent to a setting of filter constant a1 to an=0.

(Fourth Modification of the First Embodiment)

In the above description, the case is described where the error signal generator unit 40 calculates the error signal e(k) based on the digital value x(k) output from the digital corrector unit 30. However the calculation is not limited to the digital value x(k) output from the digital corrector unit 30, and may also calculate the error signal e(k) by other formulas.

[Formula 12]

Examining formula (30) and formula (31) gives:

$$e(k) = \sum_m \left( h_m \sum_{i=0}^{N-1} W_i D_i^{(k-m)} \right) = \sum_{i=0}^{N-1} \left( W_i \sum_m h_m D_i^{(k-m)} \right) = \sum_{i=0}^{N-1} W_i \delta_i^{(k)} \quad (39A)$$

So the error signal e(k) can be calculated from the search vector $\delta_i^{(k)}$.

The structure in FIG. 1 can therefore be modified as shown next if based on the formula (39A).

Figure 16:
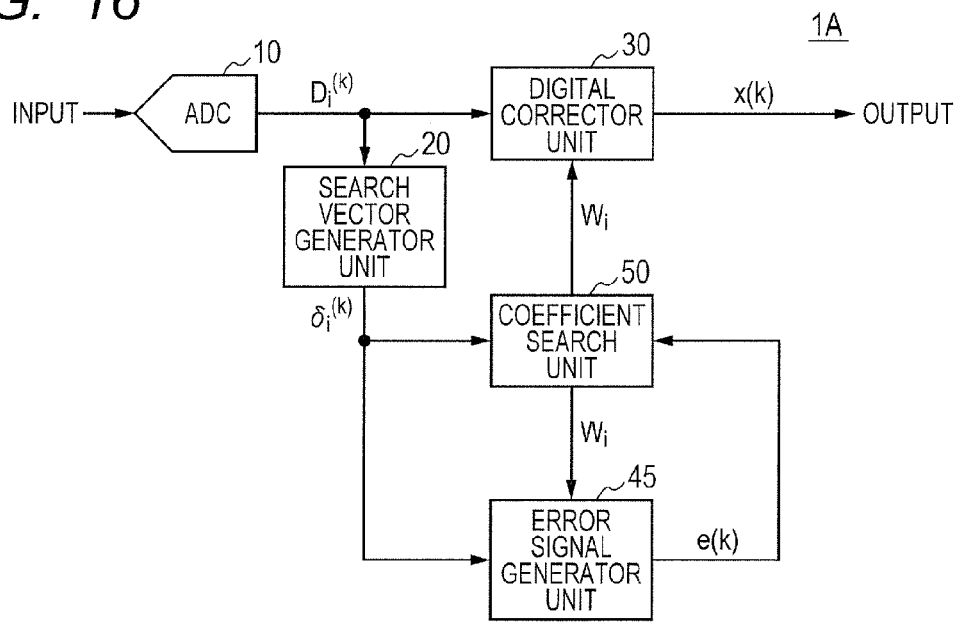
FIG. 16 is an outline diagram for describing the structure of the A/D converter circuit based on a fourth modification of the first embodiment.

FIG. 16 is an outline diagram for describing the structure of the A/D converter circuit 1A based on a fourth modification of the first embodiment.

Comparing to the A/D converter circuit 1, the A/D converter circuit 1A as shown in FIG. 16, differs in the point that the error signal generator unit 40 is replaced by an error signal generator unit 45.

The error signal generator unit 45 is capable of calculating the error signal e(k) by multiplying the weighting coefficient $W_i$ by the search vector $\delta_i^{(k)}$ from the search vector generator unit 20 and summing them, according to formula (39A).

In comparison to the related art, the structure of the A/D converter circuit 1A based on a fourth modification of the first embodiment is a simple structure including a single A/D converter unit (ADC). Also, no mechanism for applying an offset is required so that along with a smaller surface area, an increase in consumption current can also be prevented. This structure can also be applied to other embodiments and modifications.

Second Embodiment

In the second embodiment, an A/D converter circuit for executing time interleaving operation capable of high-speed processing is described.

(When there are 2 Time Interleavings)

Figure 17A:
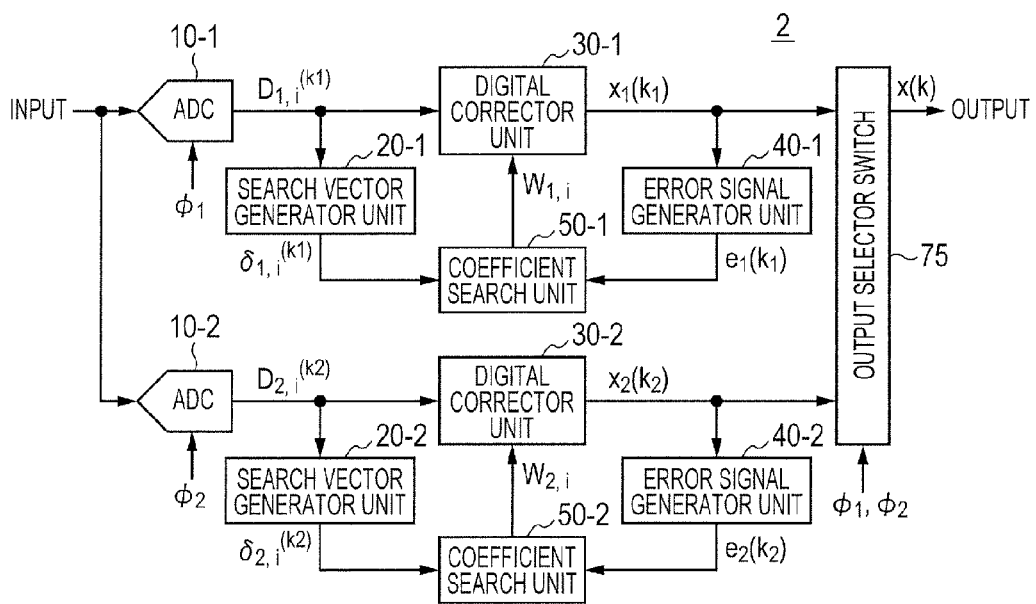
FIG. 17A and FIG. 17B are an outline diagram and a conversion timing drawing for describing the structure of the A/D converter circuit based on the second embodiment.
Figure 17B:
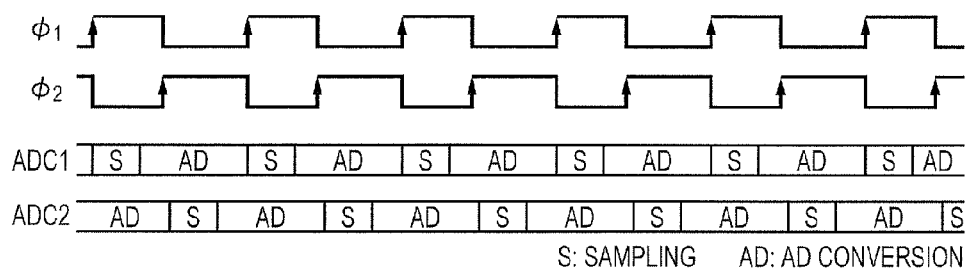

FIG. 17A and FIG. 17B are an outline diagram and a conversion timing drawing for describing the structure of the A/D converter circuit 2 based on the second embodiment.

The A/D converter circuit 2 based on the second embodiment as shown in FIG. 17A, is comprised of the A/D converter units (ADC) 10-1, 10-2, the search vector generator units 20-1, 20-2, digital corrector units 30-1, 30-2, the error signal generator units 40-1, 40-2, the coefficient search units 50-1, 50-2, and the output selector switch 75.

The A/D converter units 10-1, 10-2 convert the analog input signals into digital values that are the AD conversion results.

The search vector generator units 20-1, 20-2 calculate the interpolation bit estimation value based on the approximate values for each $D_{1,i}^{(k)}$, $D_{2,i}^{(k)}$ which are digital values respectively output from the A/D converter units 10-1, 10-2, and also calculate the respective search vectors $\delta_{1,i}^{(k)}, \delta_{2,i}^{(k)}$ based on the difference.

The error signal generator units 40-1, 40-2 calculate the digital values $x_1(k)$, $x_2(k)$ respectively output from the digital corrector units 30-1, 30-2, and calculate the error signals $e_1(k)$, $e_2(k)$ based on the interpolation estimation value based on the approximate values.

The coefficient search units 50-1, 50-2 provided to respectively correspond to the digital corrector units 30-1, 30-2, search the weighting coefficients $W_{1,i}$, $W_{2,i}$ for each bit based on the search vector $\delta_{1,i}^{(k)}, \delta_{2,i}^{(k)}$ output respectively from the search vector generator units 20-1, 20-2 and the error signals $e_1(k)$, $e_2(k)$ output from the error signal generator unit 40-1, 40-2.

The digital corrector units 30-1, 30-2 provided to respectively correspond to the A/D converter units 10-1, 10-2, perform digital correction of each bit $D_{1,i}^{(k)}$, $D_{2,i}^{(k)}$ for corresponding digital values from A/D converter units 10-1, 10-2 according to the weighting coefficients $W_{1,i}$, $W_{2,i}$ for each bit that is searched by the coefficient search units 50-1, 50-2. More specifically, the digital corrector units 30-1, 30-2 calculate the digital values $x_1(k)$, $x_2(k)$ by multiplying the weighting coefficients $W_{1,i}$, $W_{2,i}$ by the digital values for each bit $D_{1,i}^{(k)}$, $D_{2,i}^{(k)}$ from the A/D converter units 10-1, 10-2 and summing them.

The output selector switch 75 respectively switches and outputs the digital values $x_1(k)$, $x_2(k)$ output from the digital corrector units 30-1, 30-2 according to the clocks $\phi_1$, $\phi_2$.

A concept drawing of the conversion timing for the A/D converter circuit 2 is shown here while referring to FIG. 17B. The present example shows the case where alternately and repeatedly implementing sampling ("S") as one example of sampling processing of an analog input signal, and AD conversion ("AD") for processing the sampled analog input signal by A/D conversion.

In the time interleaving operation, the clocks for processing are operated after shifting the phase of the clocks $\phi_1$, $\phi_2$. The present example shows the case where there are two time interleavings, and the phase of the clocks $\phi_1$, $\phi_2$ are shifted a half cycle. Sampling processing is performed during the pulse rise of the clocks $\phi_1$, $\phi_2$. This operation outputs digital values respectively from the A/D converter units 10-1, 10-2, and the digital values after digital correction are alternately output by way of the output selector switch 75 to allow high-speed A/D conversion processing.

(When there are 4 Time Interleavings)

Figure 18A:
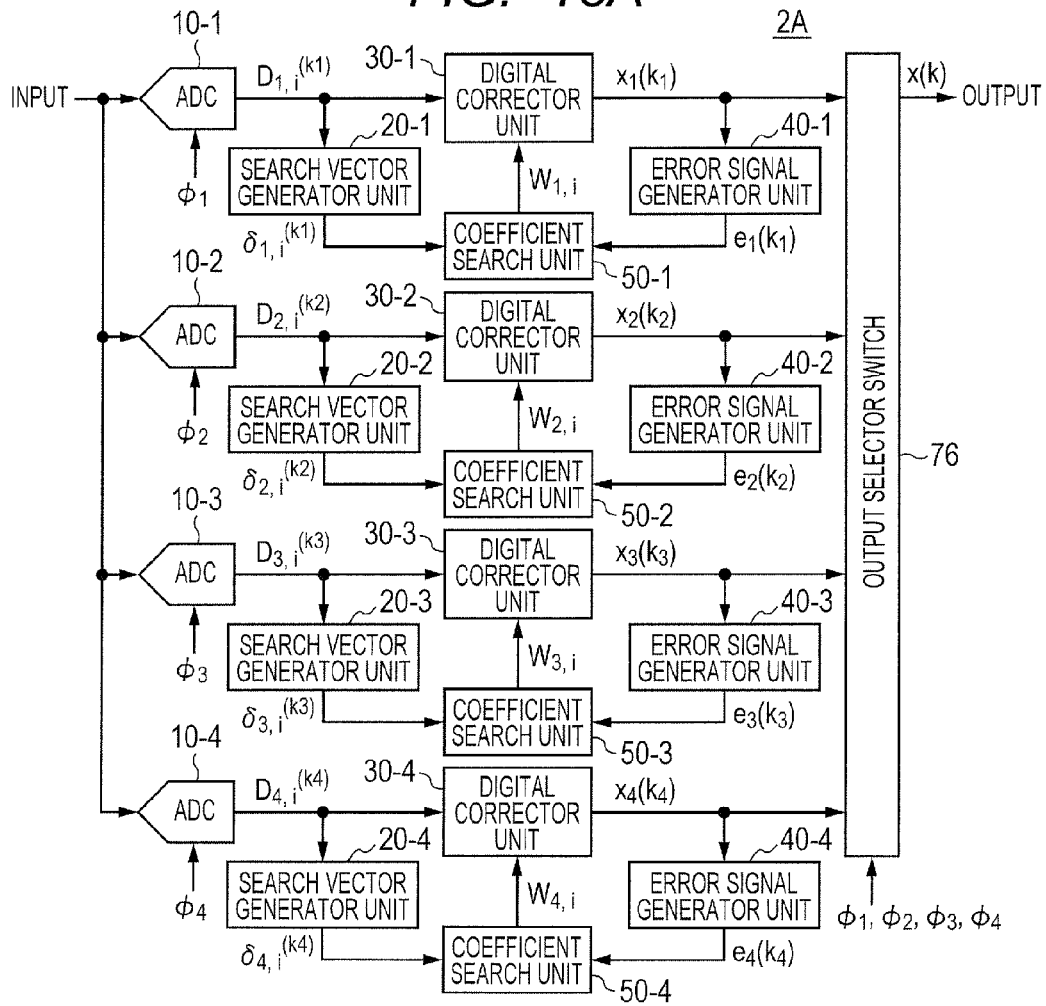
FIG. 18A and FIG. 18B are an outline diagram and a conversion timing drawing for describing the structure of the A/D converter circuit based on the second embodiment.
Figure 18B:
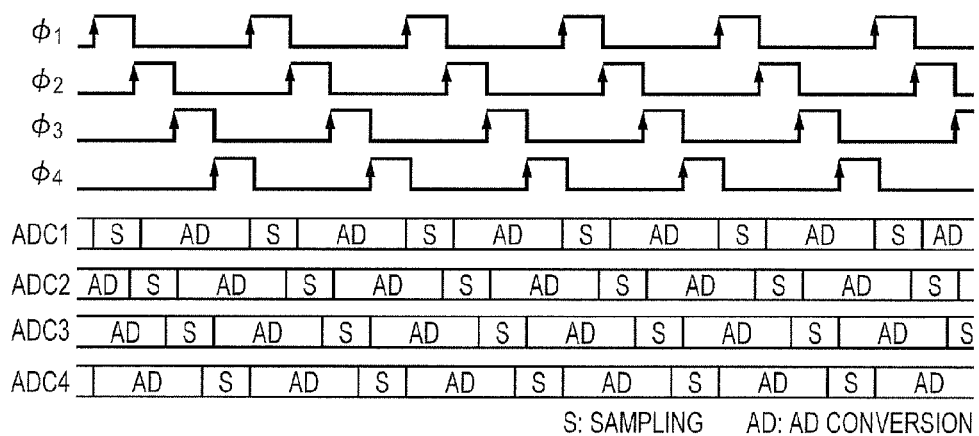

FIG. 18A and FIG. 18B are an outline diagram and a conversion timing drawing for describing the structure of the A/D converter circuit 2A based on the second embodiment.

The A/D converter circuit 2A based on the second embodiment as shown in FIG. 18A is comprised of the A/D converter units (ADC) 10-1 to 10-4, search vector signal generator units 20-1 to 20-4, digital corrector units 30-1 to 30-4, error signal generator units 40-1 to 40-4, coefficient search units 50-1 to 50-4, and an output selector switch 76.

The A/D converter units 10-1 to 10-4 convert the analog input signals into digital values that are the AD conversion results.

The search vector generator units 20-1 to 20-4 calculate the interpolation bit estimation value based on the approximate value of each bit $D_{1,i}^{(k)}$ to $D_{4,i}^{(k)}$ in the digital values respectively output from the A/D converter units 10-1 to 10-4 and respectively calculate the search vectors $\delta_{1,i}^{(k)}$ to $\delta_{4,i}^{(k)}$ based on the difference.

The error signal generator units 40-1 to 40-4 calculate the error signals $e_1(k)$ to $e_4(k)$ based on the interpolation estimation values based on the approximate valves, and the digital values $x_1(k)$ and $x_4(k)$ respectively output from the digital corrector units 30-1 to 30-4.

The coefficient search units 50-1 to 50-4 search the weighting coefficients $W_{1,i}$ to $W_{4,i}$ for each bit based on the search vectors $\delta_{1,i}^{(k)}$ to $\delta_{4,i}^{(k)}$ that are respectively output from the search vector generator units 20-1 to 20-4 and the error signals $e_1(k)$ to $e_4(k)$ that are output from the error signal generator units 40-1 to 40-4.

The digital corrector units 30-1 to 30-4 respectively digitally correct each bit $D_{1,i}^{(k)}$ to $D_{4,i}^{(k)}$ of the digital value, from the A/D converter units 10-1 to 10-4 according to the weighting coefficients $W_{1,i}$ to $W_{4,i}$ of each bit searched by the coefficient search units 50-1 to 50-4. More specifically, the digital corrector units 30-1 to 30-4 calculate the digital values $x_1(k)$ to $x_4(k)$ by multiplying the weighting coefficients $W_{1,i}$ to $W_{4,i}$ by each bit $D_{1,i}^{(k)}$ to $D_{4,i}^{(k)}$ of the digital values output from the A/D converter units 10-1 to 10-4 and summing them.

The output selector switch 76 selectively outputs the digital values $x_1(k)$ to $x_4(k)$ output from the digital corrector units 30-1 to 30-4 according to the clocks $\phi_1$ to $\phi_4$.

An outline diagram of the conversion timing for the A/D converter circuit 2A is shown here while referring to FIG. 18B. The present example shows the case where alternately and repeatedly implementing sampling ("S") as one example of sampling processing of an analog input signal, and implementing AD conversion ("AD") for processing the sampled analog input signal by A/D conversion.

In the time interleaving operation, the clocks for processing are operated by shifting the phase of the clocks $\phi_1$, $\phi_2$, $\phi_3$, $\phi_4$. The present example shows the case where there are four time interleavings and the phase of the clocks $\phi_1$, $\phi_2$, $\phi_3$, $\phi_4$ are shifted a quarter cycle. Sampling processing is performed during the pulse rise of the clocks $\phi_1$, $\phi_2$, $\phi_3$, $\phi_4$. This operation outputs the digital values respectively from the A/D converter units 10-1 to 10-4, and the digital values after digital correction are alternately output by way of the output selector switch 76 to allow high-speed A/D conversion processing.

(When there are n Number of Time Interleavings)

Figure 19A:
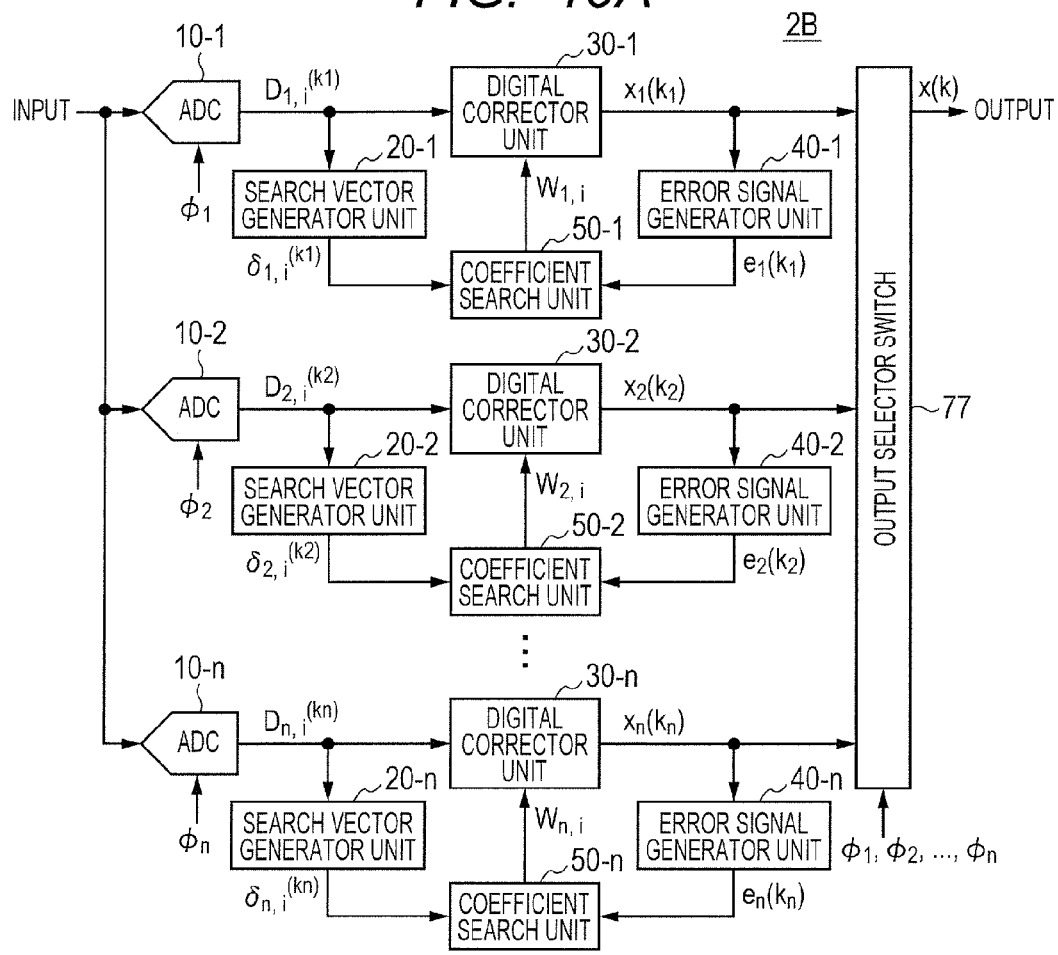
FIG. 19A and FIG. 19B are an outline diagram and a conversion timing drawing for describing the structure of the A/D converter circuit based on the second embodiment.
Figure 19B:
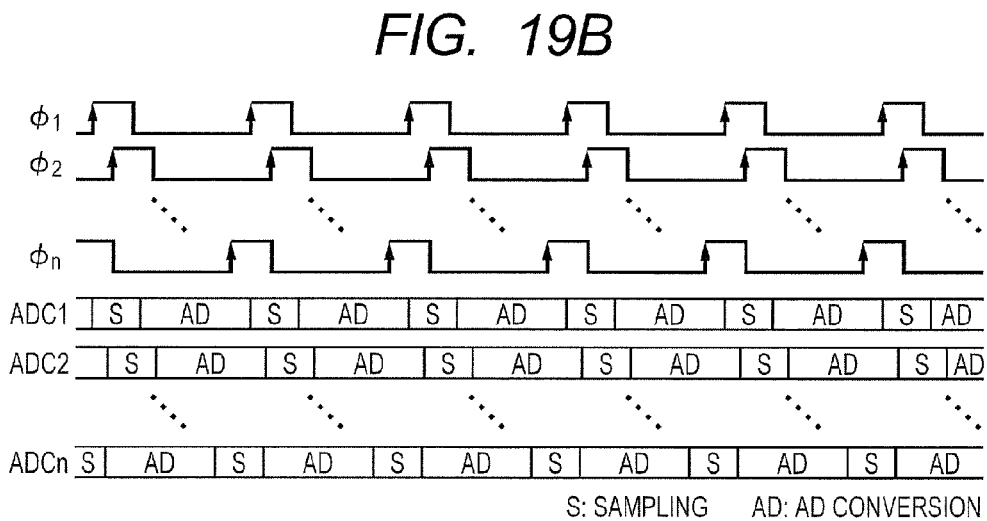

FIG. 19A and FIG. 19B are an outline diagram and a conversion timing drawing for describing the structure of the A/D converter circuit 2B based on the second embodiment.

The A/D converter circuit 2B based on the second embodiment as shown in FIG. 19A is comprised of the A/D converter units (ADC) 10-1 to **10-*n*, search vector generator units 20-1 to 20-*n*, digital corrector units 30-1 to 30-*n*, error signal generator units 40-1 to 40-*n*, coefficient search unit 50-1 to 50-*n*, and an output selector switch 77**.

The A/D converter units 10-1 to **10-*n*** convert the analog input signals into digital values that are the AD conversion results.

The search vector generator units 20-1 to **20-*n* calculate the interpolation bit estimation values based on the approximate value for each bit $D_{1,i}^{(k)}$ to $D_{n,i}^{(k)}$ for the digital values respectively output from the A/D converter units 10-1 to 10-*n***, and respectively calculate the search vectors $\delta_{1,i}^{(k)}$ to $\delta_{n,i}^{(k)}$ based on the difference.

The error signal generator units 40-1 to **40-*n* calculate the error signals $e_1(k)$ to $e_4(k)$ based on the digital values $x_1(k)$ and $x_n(k)$ respectively output from the digital corrector units 30-1 to 30-*n*** and the interpolation estimation values based on the approximate valves.

The coefficient search units 50-1 to **50-*n* search the weighting coefficients $W_{1,i}$ to $W_{n,i}$ for each bit based on the search vectors $\delta_{1,i}^{(k)}$ to $\delta_{n,i}^{(k)}$ respectively output from the search vector signal generator units 20-1 to 20-n and the error signals $e_1(k)$, $e_n(k)$ output from the error signal generator units 40-1 to 40-n**.

The digital corrector units 30-1 to 30-n perform digital correction of digital values for each bit $D_{1,i}^{(k)}$ to $D_{n,i}^{(k)}$ corresponding to the A/D converter units 10-1 to 10-n according to the weighting coefficients $W_{1,i}$ to $W_{n,i}$ for each bit that is searched by the coefficient search units 50-1 to 50-n of each A/D converter units 10-1 to 10-n. More specifically, the digital corrector units 30-1 to 30-n calculate the digital values $x_1(k)$ to $x_2(k)$ by multiplying the weighting coefficients $W_{1,i}$ to $W_{n,i}$ by the digital value for each $D_{1,i}^{(k)}$ to $D_{n,i}^{(k)}$ from the A/D converter units 10-1 to 10-n and summing them.

The output selector switch 77 respectively selects and outputs the digital values $x_1(k)$ to $x_n(k)$ output from the digital corrector units 30-1 to 30-n according to the clocks $\phi_1$ to $\phi_n$.

An outline diagram of the conversion timing for the A/D converter circuit 2A is shown here while referring to FIG. 19B. The present example shows the case where alternately and repeatedly implementing sampling ("S") as one example of sampling processing of an analog input signal, and implementing AD conversion ("AD") to convert the sampled analog input signal.

In the time interleaving operation, the clocks for processing are operated by shifting the phase of the clocks $\phi_1$, $\phi_2$, ... $\phi_n$. The present example shows the case where there are four time interleavings and the phase of the clocks $\phi_1$, $\phi_2$, ... $\phi_n$ are shifted a quarter cycle. Sampling is performed during the pulse rise of the clocks $\phi_1$, $\phi_2$, ... $\phi_n$. This operation outputs the digital values respectively from the A/D converter units 10-1 to 10-n, and the digital values after digital correction are alternately output by way of the output selector switch 77 to allow high-speed A/D conversion processing.

(First Modification of the Second Embodiment)

In the modification of the second embodiment, an A/D converter circuit for executing time interleaving operation capable of reducing the surface area along with high-speed processing is described next.

(When there are 2 Time Interleavings)

Figure 20:
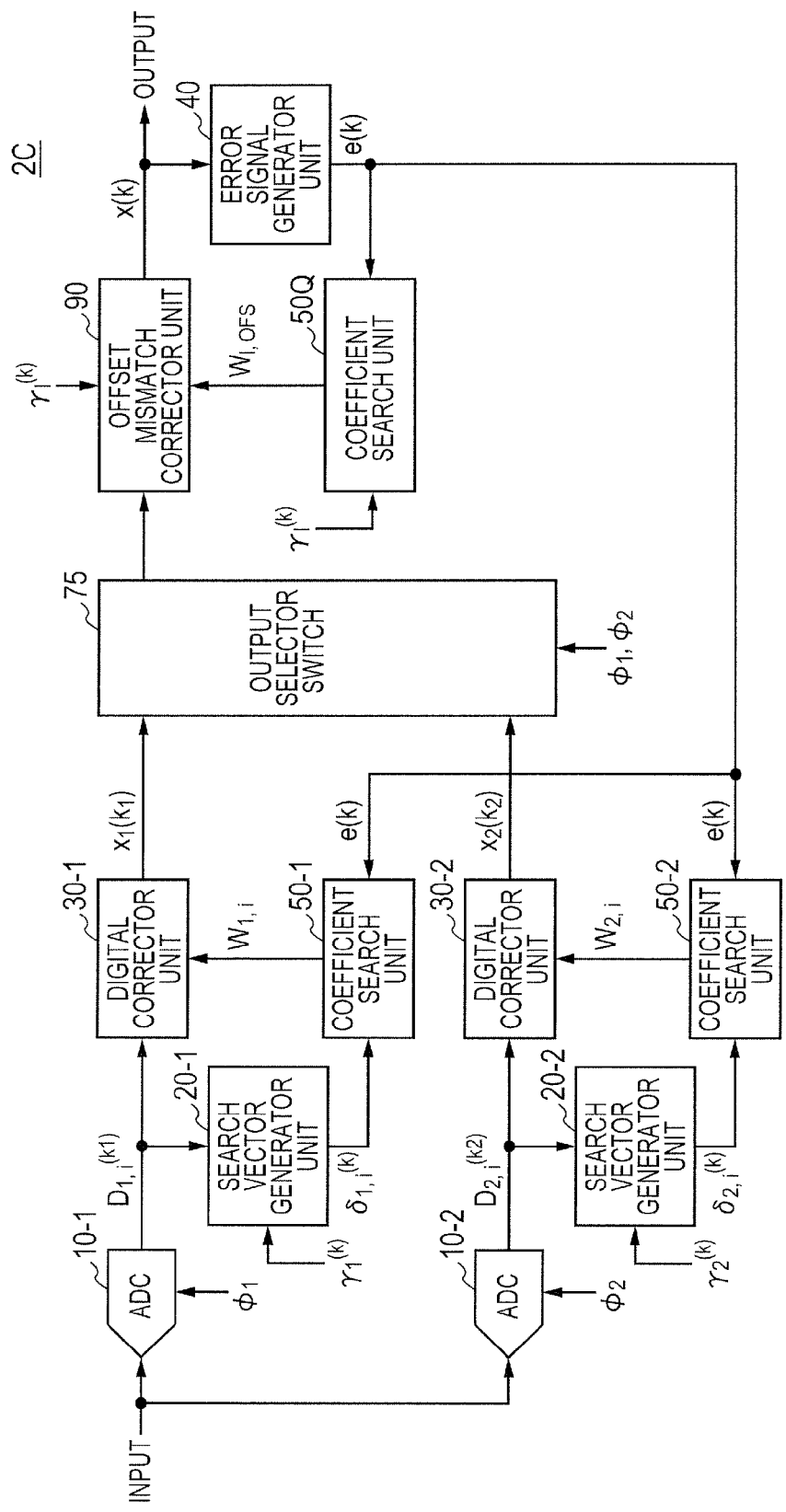
FIG. 20 is an outline diagram for describing the structure of the A/D converter circuit based on a first modification of the second embodiment.

FIG. 20 is an outline diagram for describing the structure of the A/D converter circuit 2C based on a first modification of the second embodiment.

The A/D converter circuit 2C based on the modification of the second embodiment as shown in FIG. 20 differs from the A/D converter circuit 2 of FIG. 17 in the point that the error signal generator units 40-1, 40-2 are integrated into one error signal generator unit 40.

The error signal generator unit 40 calculates the error signal e(k) based on the digital value x(k) output from the output selector switch 75 and the interpolation estimation value based on the approximate value and outputs them to the coefficient search units 50-1, 50-2.

On the other hand, there is the possibility that spurious frequencies might occur due to the occurrence of offset mismatches among time interleave channels due to switching of the post-correction digital value x(k) input to the error signal generator unit 40 from the output selector switch 75 according to the clocks $\phi_1$, $\phi_2$. These spurious frequencies may cause deterioration in the A/D converter circuit characteristics.

An offset mismatch corrector unit 90 to correct the offset mismatch and a coefficient search unit 50Q to search the coefficients for correcting the target offset mismatch are therefore further provided.

The coefficient search unit 50Q searches the coefficient $W_{1,OFS}$ that are utilized for offset correction in the offset mismatch corrector unit 90 based on the error signal e(k) which is the output from the error signal generator unit 40.

The post-correction digital value is expressed here as shown in the following formula.

[Formula 13]

$$x(k) = \sum_{i=0}^{N-1} \gamma_l^{(k)} W_{L,i} D_i^{(k)} + \gamma_l^{(k)} W_{L,OFS} \quad (40)$$

is expressed as shown above. The meaning of each variable is given below.

$L$: denotes an index expressing a channel $\gamma_L^{(k)}$: denotes a coefficient expressing on which channel the AD conversion of the k-th sample is performed $W_{L,i}$: denotes a weighting coefficient for channel $L$ $W_{L,OFS}$: denotes an offset correction term for channel $L$ k: denotes an index for expressing the number of the sample x(k): denotes the digital output value obtained by AD conversion of the k-th sample $D_i^{(k)}$: denotes the i-th bit of the AD conversion results for the k-th sample Here, $\gamma_L^{(k)}=+1$ when the k-th sample is AD converted by the ADC of channel $L$, and $\gamma_L^{(k)}=0$ in all other cases. Assuming that H(z) is FIR, the error signal is given below as:

$$e(k) = Z^{-1}H(z)Zx(k) = \sum_m h_m x(k-m) = \quad (41)$$

$$\sum_m \left( h_m \sum_{i=0}^{N-1} \gamma_l^{(k-m)} W_{L,i} D_i^{(k-m)} \right) + \sum_m \left( h_m \gamma_l^{(k-m)} W_{l,OFS} \right)$$

At this time the search vector $\delta_{L,i}^{(k)}$ is given as follows:

$$\delta_{L,i}^{(k)} = \frac{\partial e(k)}{\partial W_{L,i}} = \frac{\partial}{\partial W_{L,i}}[Z^{-1}H(z)Zx(k)] \quad (42)$$

$$= \frac{\partial}{\partial W_{L,i}} \sum_m \left( h_m \sum_{i=0}^{N-1} \gamma_l^{(k-m)} W_{L,i} D_i^{(k-m)} \right) +$$

$$\frac{\partial}{\partial W_{L,i}} \sum_m \left( h_m \gamma_l^{(k-m)} W_{l,OFS} \right) = \sum_m h_m \gamma_l^{(k-m)} D_i^{(k-m)}$$

Therefore, the search formula for the weighting coefficient is:

$$W_{L,i}^{(new)} = W_{L,i}^{(old)} - \mu_{L,i}\left[\sum_m h_m x(k-m)\right] \times \left[\sum_m h_m \gamma_l^{(k-m)} D_i^{(k-m)}\right] \quad (43)$$

and can also be derived for the offset correction term with the same search formula. First of all, $$\frac{\partial e(k)}{\partial W_{l,OFS}} = \frac{\partial}{\partial W_{l,OFS}}[Z^{-1}H(z)Zx(k)] \quad (44)$$

$$= \frac{\partial}{\partial W_{l,OFS}} \sum_m \left( h_m \sum_{i=0}^{N-1} \gamma_l^{(k-m)} W_{L,i} D_i^{(k-m)} \right) +$$

$$\frac{\partial}{\partial W_{l,OFS}} \sum_m \left( h_m \gamma_l^{(k-m)} W_{l,OFS} \right)$$

$$= \sum_m h_m \gamma_l^{(k-m)}$$

and therefore the search formula for the offset correction term is as follows.

$$W_{l,OFS}^{(new)} = W_{l,OFS}^{(old)} - \mu_{l,OFS}\left[\sum_m h_m x(k-m)\right] \times \left[\sum_m h_m \gamma_l^{(k-m)}\right] \quad (45)$$

The above structure is capable of preventing deterioration in A/D converter circuit characteristics by correcting the mismatch in offsets between time interleaving channels.

The above structure further allows reducing the number of parts and reducing the surface area by using one error signal generator unit, and without requiring the usage of two error signal generator units.

(When there are 4 Time Interleavings)

Figure 21:
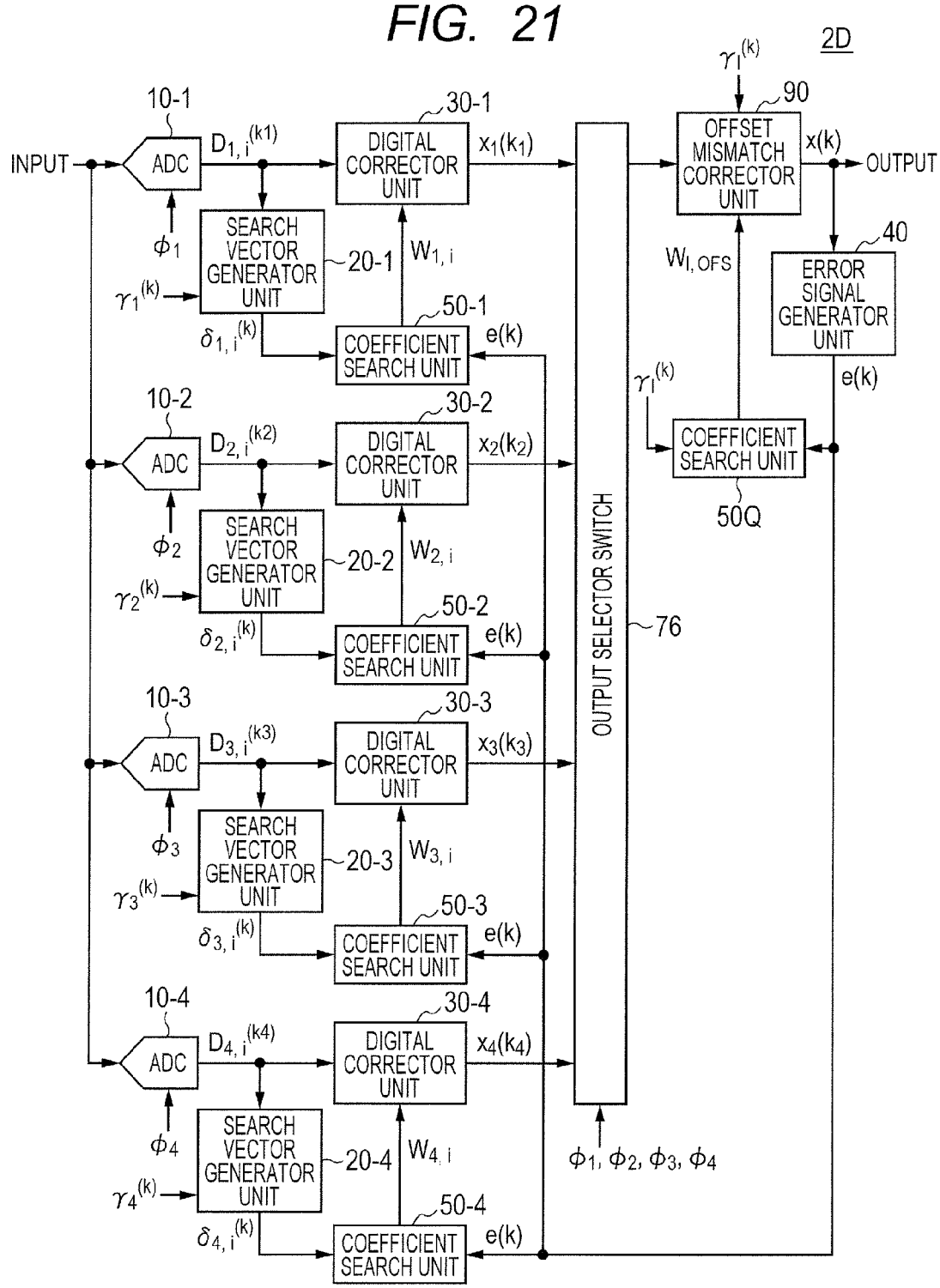
FIG. 21 is an outline diagram for describing the structure of the A/D converter circuit based on a first modification of the second embodiment.

FIG. 21 is an outline diagram for describing the structure of the A/D converter circuit 2D based on a first modification of the second embodiment.

The A/D converter circuit 2D based on a first modification of the second embodiment as shown in FIG. 21 differs from the A/D converter circuit 2A of FIG. 18 in the point that the error signal generator units 40-1 to 40-4 are integrated into one error signal generator unit 40.

The error signal generator unit 40 calculates the error signal e(k) based on the digital value x(k) output from the output selector switch 76 according to the clocks $\phi_1$ to $\phi_4$ and the interpolation estimation value based on the approximate value, and outputs them to the coefficient search units 50-1 to 50-4.

The A/D converter circuit 2D further includes an offset mismatch corrector unit 90 to correct an offset mismatch, and a coefficient search unit 50Q to search coefficients to correct the offset mismatch.

The coefficient search unit 50Q searches the coefficient $W_{1.OFS}$ that is utilized for offset correction in the offset mismatch corrector unit 90 based on the error signal e(k) which is the output from the error signal generator unit 40.

The above structure is capable of preventing deterioration in A/D converter circuit characteristics by correcting the mismatch among offsets in time interleaving channels.

The above structure further allows reducing the number of parts and reducing the surface area by integrating the error signal generator units into one error signal generator unit, without requiring the providing of four error signal generator units.

(When there are n Number of Time Interleavings)

Figure 22:
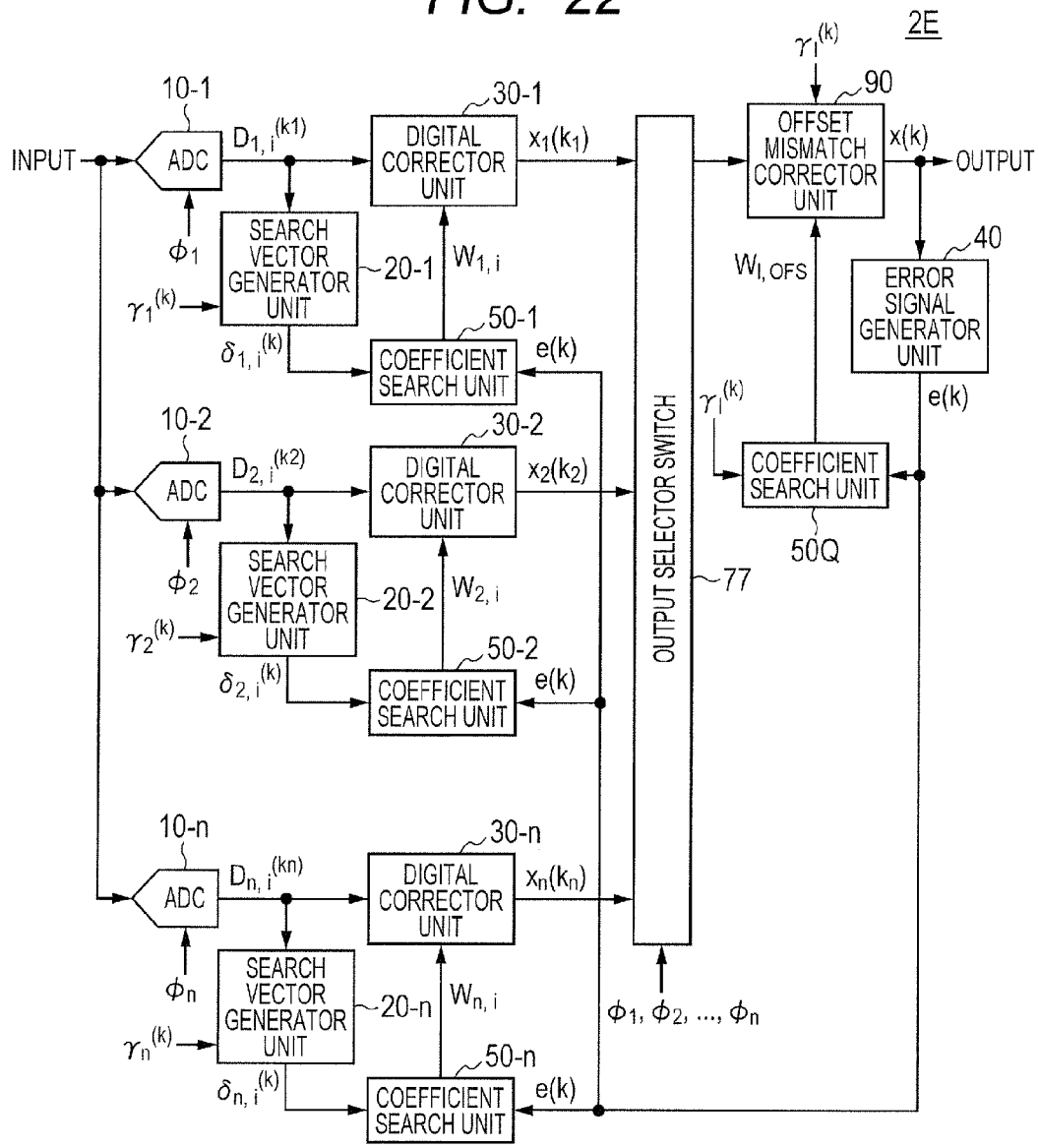
FIG. 22 is a drawing for describing the structure of the A/D converter circuit based on a first modification of the second embodiment.

FIG. 22 is a drawing for describing the structure of the A/D converter circuit 2E based on the first modification of the second embodiment.

The A/D converter circuit 2E based on the first modification of the second embodiment as shown in FIG. 22 differs from the A/D converter circuit 2B of FIG. 19 in the point that the error signal generator units 40-1 to 40-n are integrated into one error signal generator unit 40.

The error signal generator unit 40 calculates the error signal e(k) based on the digital value x(k) from the output selector switch 77 according to the clocks $\phi_1$ to $\phi_n$ and the interpolation estimation value based on the approximate value, and outputs them to the coefficient search units 50-1 to 50-n.

An offset mismatch corrector unit 90 to correct the offset mismatch and a coefficient search unit 50Q to search the coefficients for correcting the target offset mismatch are further provided.

The coefficient search unit 50Q searches the coefficient $W_{1.OFS}$ that are utilized in the offset mismatch corrector unit 90 based on the error signal e(k) which is the output from the error signal generator unit 40.

The above structure is capable of preventing deterioration in A/D converter circuit characteristics by correcting the mismatch among offsets in time interleaving channels.

The above structure further allows reducing the number of parts and reducing the surface area by using one error signal generator unit, and without requiring the usage of n number of error signal generator units.

(Second Modification of the Second Embodiment)

Figure 23:
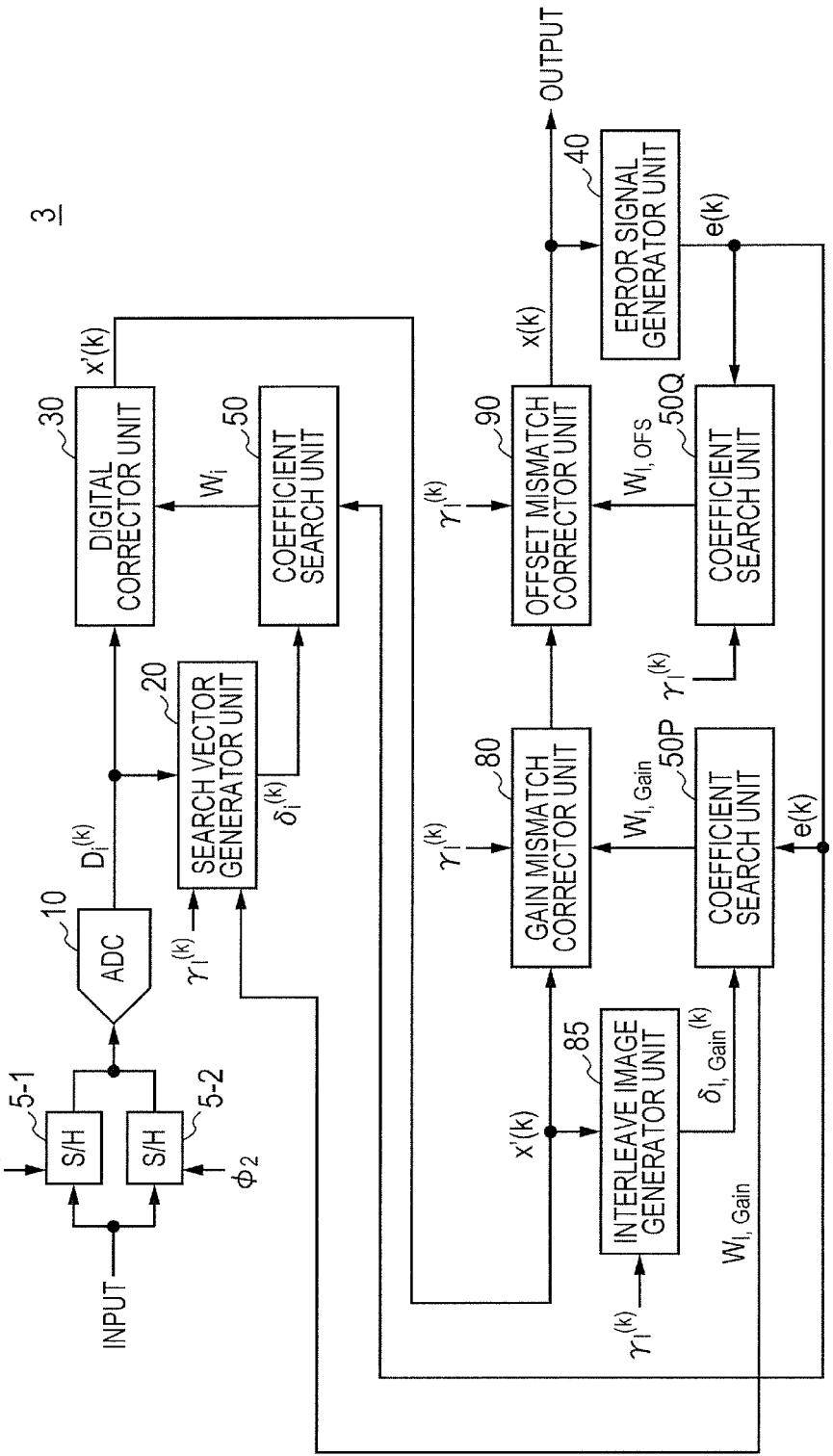
FIG. 23 is a drawing for describing the A/D converter circuit 3 based on a second modification of the second embodiment.

FIG. 23 is a drawing for describing the A/D converter circuit 3 based on a second modification of the second embodiment.

FIG. 23 shows here the case where plural (2 units) samplers (S/H) are provided.

The two sampler (S/H) units are capable of retaining the analog input signals at respectively different timings according to the clocks $\phi_1$, $\phi_2$ and respectively outputting them.

Mismatches may occur such as in the gain and offset among channels for time interleaving due to switching of the plural samplers (S/H) output, and spurious frequencies might possibly occur. These mismatches and spurious frequencies might sometimes cause deterioration in the A/D converter circuit characteristics.

A method to prevent the above deterioration in the A/D converter circuit characteristics in the A/D converter circuit 3 based on the second modification of the second embodiment is described next.

Specifically, the A/D converter circuit 3 further includes a gain mismatch corrector unit 80 for correcting the gain mismatch, an offset mismatch corrector unit 90 to correct the offset mismatch, an interleave image generator unit 85, and coefficient search units 50P, 50Q.

The interleave image generator unit 85 generates the interleave image $\delta_{1.Gain}^{(k)}$ based on the post-correction digital value x'(k) that is corrected in the digital corrector unit 30 according to the formula (48) described later on. The interleave image $\delta_{1.Gain}^{(k)}$ generated in this way is a signal containing the same frequency components as the spurious frequencies generated by the mismatch in gain.

The coefficient search unit 50P searches the coefficient $W_{1.Gain}$ that is utilized for correcting the gain in the gain mismatch corrector unit 80 based on the interleave image $\delta_{1.Gain}^{(k)}$ that is output from the interleave image generator unit 85 and the error signal e(k) which is the output from the error signal generator unit 40.

The coefficient search unit 50Q searches the coefficient $W_{1.OFS}$ that is utilized for correcting the offset in the offset mismatch corrector unit 90 based on the error signal e(k) that is the output from the error signal generator unit 40. The offset correction term is the same as described in formula (45).

The gain correction is described next.

[Formula 14]

Here, $\gamma_L^{(k)}=+1$ when the k-th sample is sampled by the S/H of channel $_L$, and $\gamma_L^{(k)}=0$ in all other cases. The digital output value of the ADC is expressed as:

$$x(k) = \left(1 + \gamma_l^{(k)} W_{l,Gain}\right)\sum_{i=0}^{N-1} W_i D_i^{(k)} + \gamma_l^{(k)} W_{l,OFS} \quad (46)$$

The meaning of each variable is given below.

$_L$: denotes an index expressing a channel
$\gamma_L^{(k)}$: denotes a coefficient expressing on which channel the AD conversion of the k-th sample is performed
$W_i$: denotes a weighting coefficient
$W_{1.OFS}$: denotes an offset correction term for channel $_L$ $W_{l.Gain}$: denotes the gain correction coefficient for channel $l$ k: denotes an index for expressing the number of the sample x(k): denotes the digital output value obtained by AD conversion of the k-th sample $D_i^{(k)}$: denotes the i-th bit of the AD conversion results for the k-th sample Assuming that H(z) is FIR, the error signal is given below as:

$$e(k) = Z^{-1}H(z)Zx(k) \qquad (47)$$
$$= \sum_m h_m x(k-m)$$
$$= \sum_m \left[ h_m\left(1 + \gamma_l^{(k-m)}W_{l,Gain}\right)\sum_{i=0}^{N-1} W_i D_i^{(k-m)} \right] +$$
$$\sum_m \left( h_m \gamma_l^{(k-m)} W_{l,OFS} \right)$$

The interleave image $\delta_{l.Gain}^{(k)}$ at this time is:

$$\delta_{l,Gain}^{(k)} = \frac{\partial e(k)}{\partial W_{l,Gain}} \qquad (48)$$
$$= \frac{\partial}{\partial W_{l,Gain}}[Z^{-1}H(z)Zx(k)]$$
$$= \frac{\partial}{\partial W_{l,Gain}} \sum_m \left[ h_m\left(1+\gamma_l^{(k-m)}W_{l,Gain}\right)\sum_{i=0}^{N-1} W_i D_i^{(k-m)} \right] +$$
$$\frac{\partial}{\partial W_{l,Gain}} \sum_m \left( h_m \gamma_l^{(k-m)} W_{l,OFS} \right)$$
$$= \sum_m \left( h_m \gamma_l^{(k-m)} \sum_{i=0}^{N-1} W_i D_i^{(k-m)} \right)$$
$$= \sum_m h_m \gamma_l^{(k-m)} x'(k-m)$$

However, a substitution is made:

$$x'(k) = \sum_{i=0}^{N-1} W_i D_i^{(k)} \qquad (48A)$$

So that the search formula for the gain correction coefficient is given below as:

$$W_{l,Gain}^{(new)} = W_{l,Gain}^{(old)} - \mu_{i,Gain}\left[\sum_m h_m x(k-m)\right] \times \left[\sum_m h_m x'(k-m)\right] \qquad (49)$$
$$= W_{l,Gain}^{(old)} - \mu_{i,Gain}\left[\sum_m h_m x(k-m)\right] \times$$
$$\left[\sum_m \left(h_m \gamma_l^{(k-m)} \sum_{i=0}^{N-1} W_i D_i^{(k-m)}\right)\right]$$

The search formula for the weighting coefficient is derived the same as in formula (32) however applying the gain correction coefficient gives the following formula.

$$W_i^{(new)} = \qquad (50)$$
$$W_i^{(old)} - \mu_i\left[\sum_m h_m x(k-m)\right] \times \left\{\sum_m [h_m(1+\gamma_l^{(k-m)}W_{l,Gain})D_i^{(k-m)}]\right\}$$

The above structure is capable of preventing deterioration in A/D converter circuit characteristics by correcting the mismatch in offset and gain.

Figure 24:
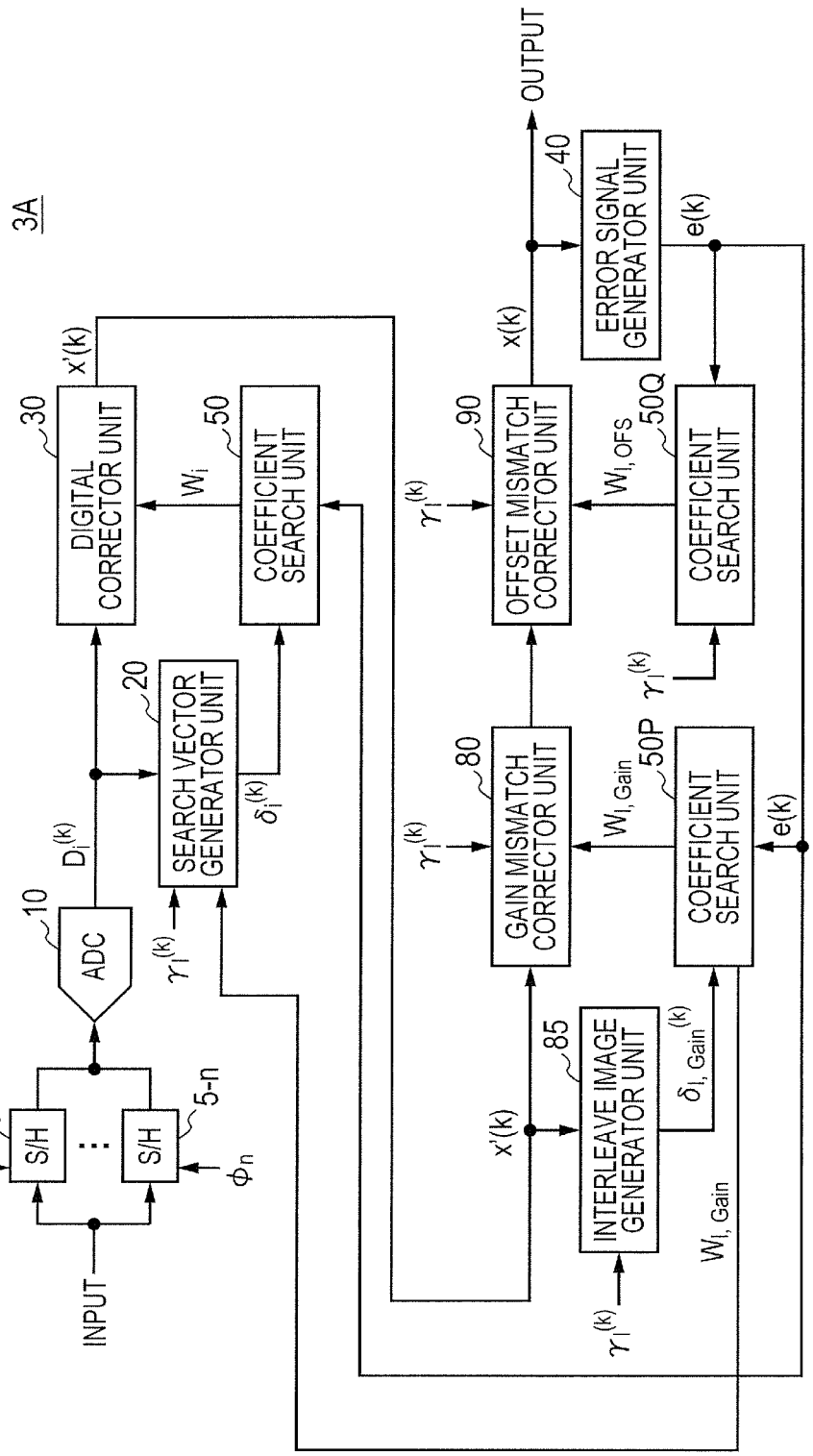
FIG. 24 is a drawing for describing the A/D converter circuit based on a second modification of the second embodiment.

FIG. 24 is a drawing for describing the A/D converter circuit 3A based on a second modification of the second embodiment.

The structure as shown in FIG. 24 contains n number of samplers.

The n number of samplers (S/H) are capable of retaining the analog input signals at respectively different timings according to the clocks $\phi_1$ to $\phi_n$ and respectively outputting them.

The above structure is capable of preventing deterioration in A/D converter circuit characteristics by correcting the mismatch in offsets and gain according to the same methods as already described.

Figure 25:
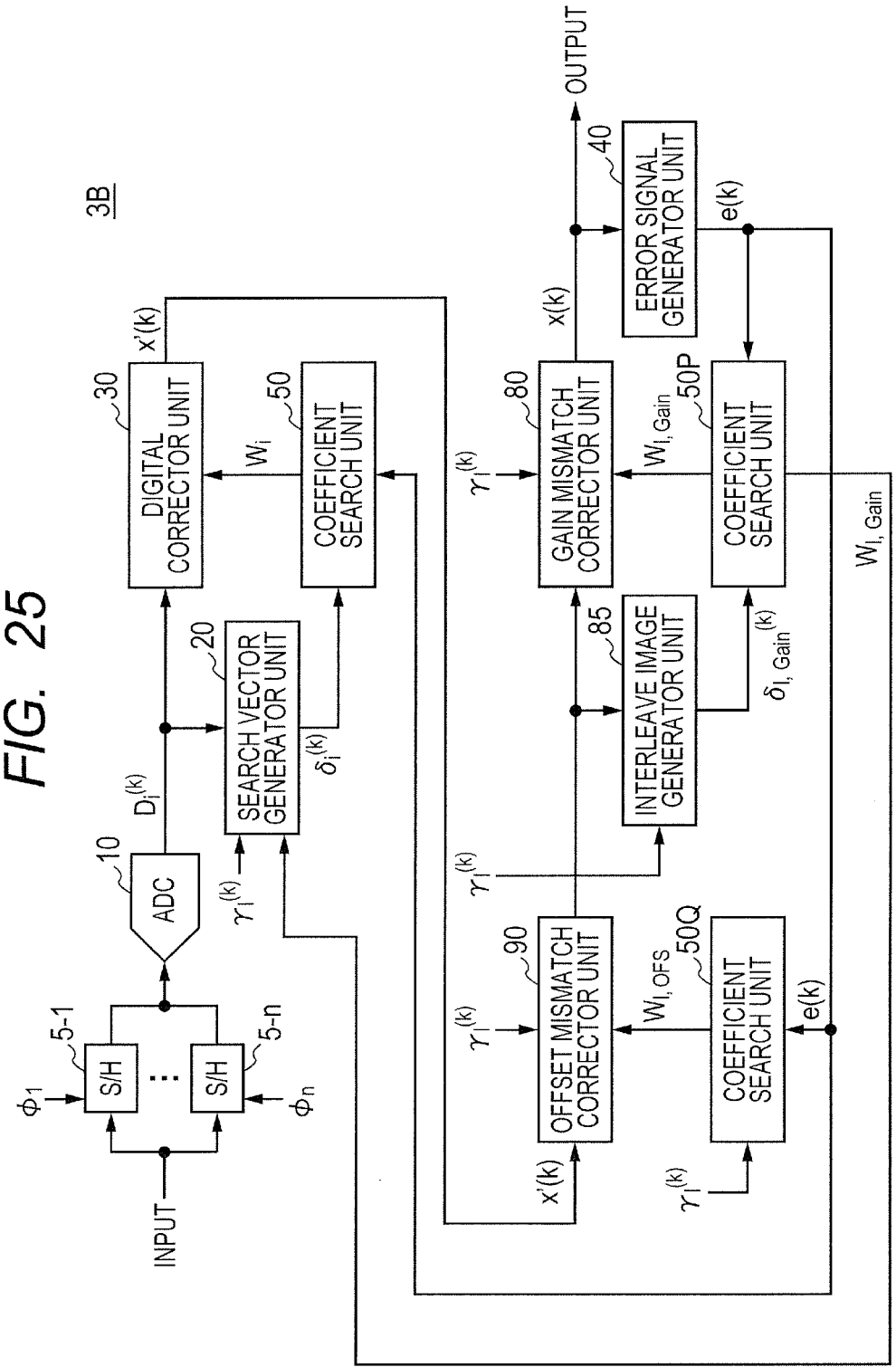
FIG. 25 is a drawing for describing the A/D converter circuit based on a second modification of the second embodiment.

FIG. 25 is a drawing for describing the A/D converter circuit 3B based on a second modification of the second embodiment.

Compared to the A/D converter circuit 3A in FIG. 24, the A/D converter circuit 3B as shown in FIG. 25 shows the case where the mounting sequence for the gain mismatch corrector unit 80 and the offset mismatch corrector unit 90 are interchanged.

The offset correction and the gain correction in this case are shown by the following formula.

[Formula 15]

Expressed as given below:

$$x(k) = \left(1 + \gamma_l^{(k)} W_{l,Gain}\right) \times \left(\sum_{i=0}^{N-1} W_i D_i^{(k)} + \gamma_l^{(k)} W_{l,OFS}\right) \qquad (51)$$

Assuming that H(z) is FIR, the error signal is given below as:

$$e(k) = Z^{-1}H(z)Zx(k)$$
$$= \sum_m h_m x(k-m)$$
$$= \sum_m \left[ h_m\left(1 + \gamma_l^{(k-m)}W_{l,Gain}\right) \times \left(\sum_{i=0}^{N-1} W_i D_i^{(k-m)} + \gamma_l^{(k-m)} W_{l,OFS}\right)\right]$$

The interleave image $\delta_{l.Gain}^{(k)}$ is at this time given as follows:

$$\delta_{l,Gain}^{(k)} = \frac{\partial e(k)}{\partial W_{l,Gain}} \qquad (53)$$
$$= \frac{\partial}{\partial W_{l,Gain}}[Z^{-1}H(z)Zx(k)]$$
$$= \frac{\partial}{\partial W_{l,Gain}} \sum_m$$
$$\left[ h_m\left(1 + \gamma_l^{(k-m)}W_{l,Gain}\right) \times \left(\sum_{i=0}^{N-1} W_i D_i^{(k-m)} + \gamma_l^{(k-m)} W_{l,OFS}\right)\right]$$

-continued $$= \sum_m \left[ h_m \gamma_l^{(k-m)} \left( \sum_{i=0}^{N-1} W_i D_i^{(k-m)} + \gamma_l^{(k-m)} W_{l,OFS} \right) \right]$$

$$= \sum_m h_m \gamma_l^{(k-m)} x''(k-m)$$

However, a substitution is made as follows:

$$x''(k) = \sum_{i=0}^{N-1} W_i D_i^{(k)} + \gamma_l^{(k)} W_{l,OFS} \quad (53A)$$

Therefore, the search formula for the gain correction coefficient is given as:

$$W_{l,Gain}^{(new)} = W_{l,Gain}^{(old)} - \mu_{l,Gain} \left[ \sum_m h_m x(k-m) \right] \times \quad (54)$$

$$\left[ \sum_m h_m \gamma_l^{(k-m)} x''(k-m) \right]$$

$$= W_{l,Gain}^{(old)} - \mu_{l,Gain} \left[ \sum_m h_m x(k-m) \right] \times$$

$$\left\{ \sum_m \left[ h_m \gamma_l^{(k-m)} \left( \sum_{i=0}^{N-1} W_i D_i^{(k-m)} + \gamma_l^{(k-m)} W_{l,OFS} \right) \right] \right\}$$

The search formula for the weighting coefficient is derived the same as in formula (32), however a gain correction coefficient is applied so that:

$$W_i^{(new)} = \quad (55)$$

$$W_i^{(old)} - \mu_i \left[ \sum_m h_m x(k-m) \right] \times \left\{ \sum_m [h_m (1 + \gamma_l^{(k-m)} W_{l,Gain}) D_i^{(k-m)}] \right\}$$

is obtained. The offset correction term is the same as the case described above however a gain correction coefficient is applied which gives the following formula.

$$W_{l,OFS}^{(new)} = W_{l,OFS}^{(old)} - \quad (56)$$

$$\mu_{l,OFS} \left[ \sum_m h_m x(k-m) \right] \times \left\{ \sum_m [h_m (1 + \gamma_l^{(k-m)} W_{l,Gain}) \gamma_l^{(k-m)}] \right\}$$

The above structure is capable of preventing deterioration in A/D converter circuit characteristics by correcting the mismatch in offsets and gain according to the same method as described above.

Third Embodiment

In the A/D converter circuits of the first and second embodiments, structures capable of background operation are described, however the signal waveform of the analog input signal that is input to the A/D converter unit 10 might not always operate normally during search processing for the weighting coefficient.

For example, if there is no change in the analog input signal, the conversion results from the A/D converter circuit are fixed so that the error signal is always 0. There is no rewrite of the weighting coefficient at this time so that the search processing for the weighting coefficient does not function. In other words, this task does not operate correctly.

Therefore, the case where inputting a signal separate from the analog input signal in advance, in order to execute the search processing for the weighting coefficient and executing the foreground operation to search the weighting coefficient is described.

Figure 26A:
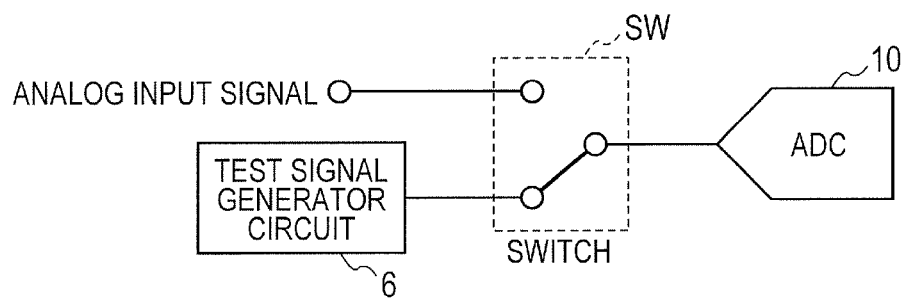
FIG. 26A and FIG. 26B are drawings for describing the signal input to the A/D converter unit based on the third embodiment.
Figure 26B:
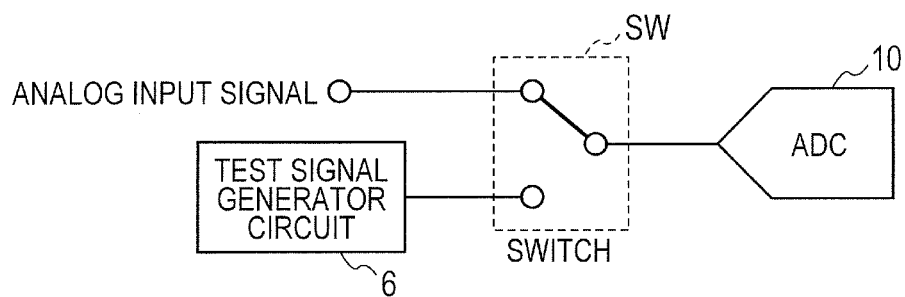

FIG. 26A and FIG. 26B are drawings for describing the signal input to the A/D converter unit 10 based on the third embodiment.

Referring to FIG. 26, the present example describes the structure that includes a test signal generator circuit 6 to generate a test signal, and further includes a switch SW to switch the analog input signal and the test signal from the test signal generator circuit 6. The switch SW receives the analog input signal and the test signal, and switches the signal for input to the A/D converter unit 10 by switching by the switch SW.

Here, FIG. 26A shows here the case where executing search processing for the weighting coefficient (during the weighting coefficient search operation). More specifically, the test signal generator circuit 6 and the A/D converter unit 10 are coupled by the switch SW. The coefficient search unit 50 in this way implements the search processing for the weighting coefficient by way of a test signal from the test signal generator circuit 6 and the search converges on the appropriate weighting coefficient.

Next, FIG. 26B shows the case where implementing A/D conversion operation (during A/D conversion operation). More specifically, the analog input signal and the A/D converter unit 10 are coupled by the switch SW. In the present example, the coefficient search unit 50 converges the weighting coefficient by search processing of the weighting coefficients by way of the test signal from the test signal generator circuit 6 so that the A/D conversion operation by the analog input signal can achieve high-accuracy A/D conversion operation based on the converged weighting coefficients.

Figure 27:
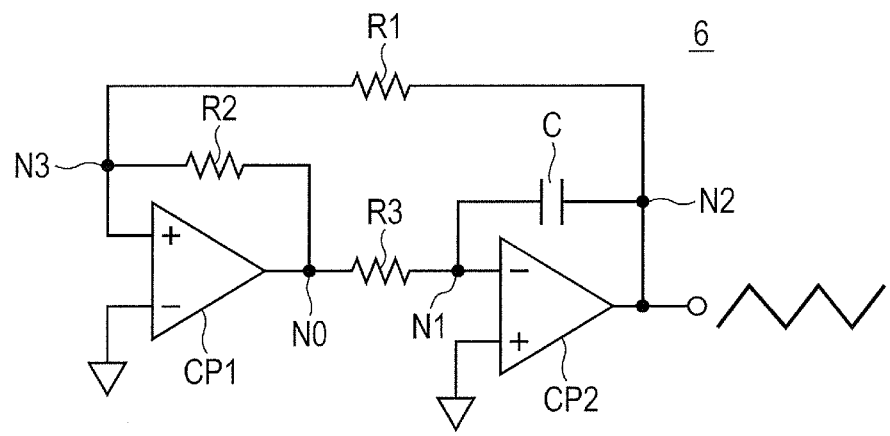
FIG. 27 is a circuit structure diagram of a test signal generator circuit based on the third embodiment.

FIG. 27 is a circuit structural diagram of the test signal generating circuit 6 based on the third embodiment.

The test signal generator circuit 6 shown in FIG. 27 is comprised of resistors R1 to R3, operational amplifiers CP1, CP2, and a condenser C.

The operational amplifier CP1 outputs the amplified results of the difference in voltage between the input of the node N3 and the clamping voltage to the node N0. The resistor R2 is mounted between the node N3 and the node N0. The resistor R3 is mounted between the node N0 and the node N1. The operational amplifier CP2 outputs the amplified results of the difference in voltage between the input of the node N1 and the clamping voltage to the node N2. The condenser C is mounted between the node N1 and the node N2. The resister R1 is mounted between the node N2 and the node N3. The structure of the present example is capable of outputting a triangular wave signal from the node N2.

In the present example, the case where utilizing a triangular wave signal as the test signal is described, however the present invention is not limited in particular to a triangular wave signal and signals of a sine wave or a random wave may also be utilized as the test signal.

In the above processing the test signal generator circuit 6 generates a test signal assumed beforehand in the third embodiment, and executing the search processing for the weighting coefficients according to the test signal guarantees the capability to securely implement the search operation for the weighting coefficients so that a high-speed, high-accuracy A/D converter circuit can be achieved.

Fourth Embodiment

In the description for the above embodiment, a structure is employed in which the results from analog-digital (AD) conversion are input directly to the digital corrector unit and coefficient search unit to implement search processing for the weighting coefficient.

The fourth embodiment is described for the case where executing the search processing for the weighting coefficient by another method.

Figure 28:
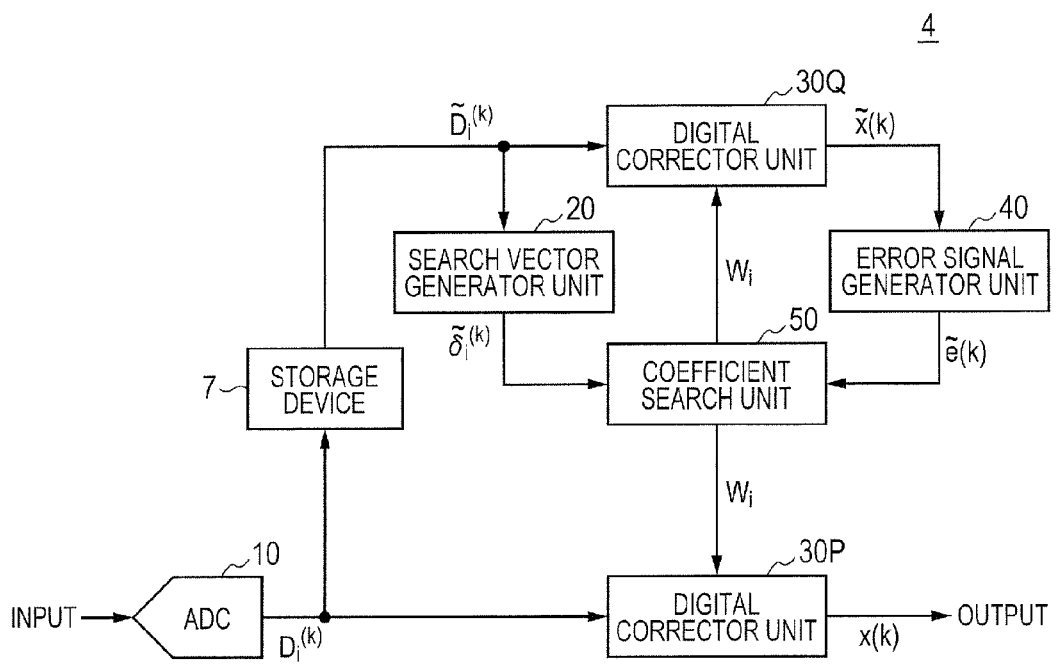
FIG. 28 is an outline diagram for describing the structure of the A/D converter circuit based on the fourth embodiment.

FIG. 28 is an outline diagram for describing the structure of the A/D converter circuit 4 based on the fourth embodiment.

In comparison to the A/D converter circuit 1, the A/D converter circuit 4 shown in FIG. 28 differs in the point that along with including a storage device 7, the digital corrector units 30P and 30Q are provided instead of the digital corrector unit 30. Other points are the same as described in FIG. 1 so a redundant, detailed description of identical points is omitted.

More specifically, the output from the A/D converter unit 10 is input to the storage device 7. The storage device 7 then retains the AD conversion results from the A/D converter unit 10 as data sequences.

The storage device 7 is capable of a simulated output of A/D conversion results output from the A/D converter unit 10 by reproducing (outputting) the retained data sequences to the digital corrector unit, etc.

In the present example, the search processing of the weighting coefficients is performed by utilizing the data sequences reproduced (output) by the storage device 7. Namely, the appropriate weighting coefficient is searched according to the same processing as described above by using the search vector generator unit 20, the digital corrector unit 30Q, the coefficient search unit 50, and the error signal generator unit 40.

The coefficient search unit 50 then outputs the searched weighting coefficients to the digital corrector unit 30P. The digital corrector unit 30P digitally corrects the AD conversion results output from the A/D converter unit 10 by using the weighting coefficient output from the coefficient search unit 50.

The above structure is capable of rendering a high-speed, high-accuracy A/D conversion circuit by searching the weighting coefficients by utilizing the data sequences retained in the storage device 7.

In the above structure, the digital corrector units 30P and 30Q can utilize respectively different speeds and timings for the operating speed.

The time for the weighting coefficient search for example can be shortened by operating the digital corrector unit 30Q at a higher speed than the digital corrector unit 30P. In this case, the storage device 7 may repeatedly reproduce (output) the retained AD conversion results multiple times.

Operating the digital corrector unit 30P at a higher speed than the digital corrector unit 30Q allows reducing the consumption current in the search operation for the weighting coefficient.

The digital corrector unit 30P and 30Q can also be jointly utilized by time sharing. The above structure would allow operation with a single digital corrector unit 30P.

The storage device 7 need not always store all of the AD conversion results, and preferably stores data sequences capable of being effectively utilized during a search for weighting coefficients.

In regards to this point, the search processing for the weighting coefficient might not always operate normally due to the signal waveform for the analog input signal. For example, if there is no change in the analog input signal, the conversion results from the A/D converter circuit are fixed results so the error signal is always at 0. There is no rewrite of the weighting coefficient at this time so the weighting coefficient search processing does not function. Therefore, when a change in the AD conversion results is detected, the data sequences may be stored in the storage device 7.

FIG. 29 is a drawing for describing the converging of the error signals based on the fourth embodiment.

Figure 29A:
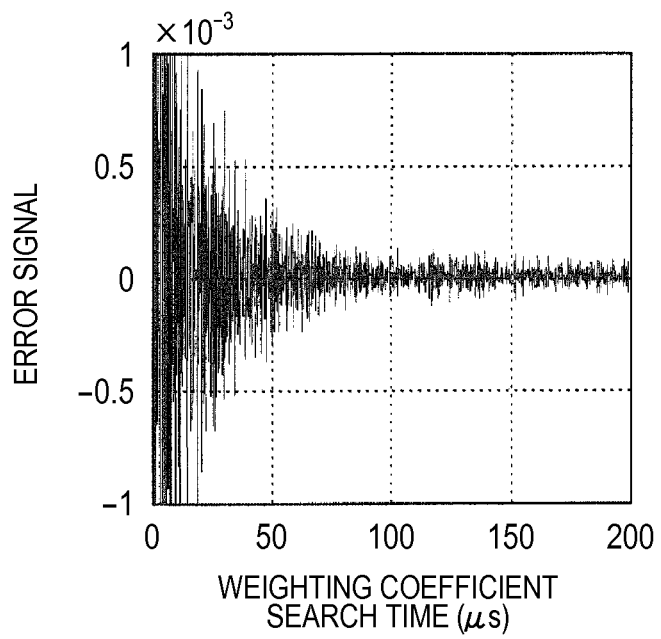
FIG. 29A and FIG. 29B are drawings for describing the converging of the error signals based on the fourth embodiment.

Referring to FIG. 29A, in this example the sampling frequency for searching the weighting coefficients of both the A/D converter unit 10 and the coefficient search unit 50 are 10 MHz.

Figure 29B:
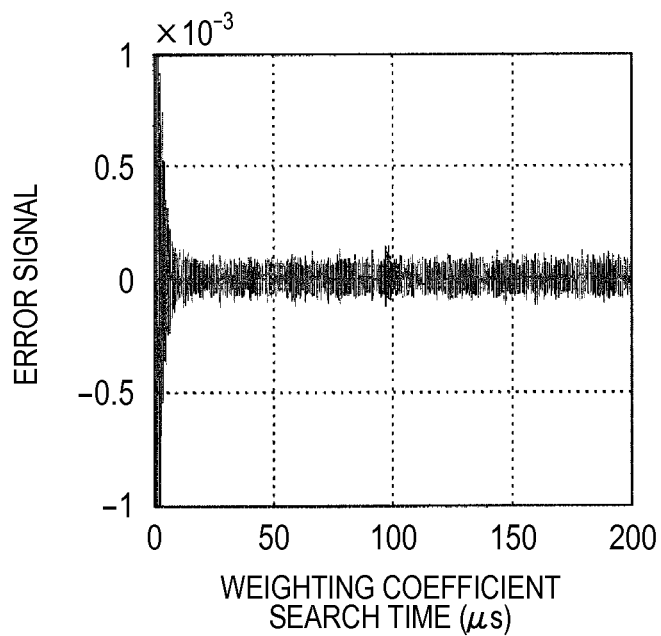

Referring to FIG. 29B, in this example the sampling frequency of the A/D converter unit 10 is set to 10 MHz, and for the coefficient search unit 50 the search operation for weighting coefficient is set to 100 MHz which is 10 times the sampling frequency in FIG. 29A. In contrast to the error signal convergence requiring approximately 100 μs in FIG. 29A, the error signal convergence in FIG. 29B requires only approximately 10 μs which allows confirming the high-speed processing is achieved.

Fifth Embodiment

A specific example of a product (semiconductor integrated circuit) capable of applying the above described A/D converter circuit is described in the fifth embodiment.

Figure 30:
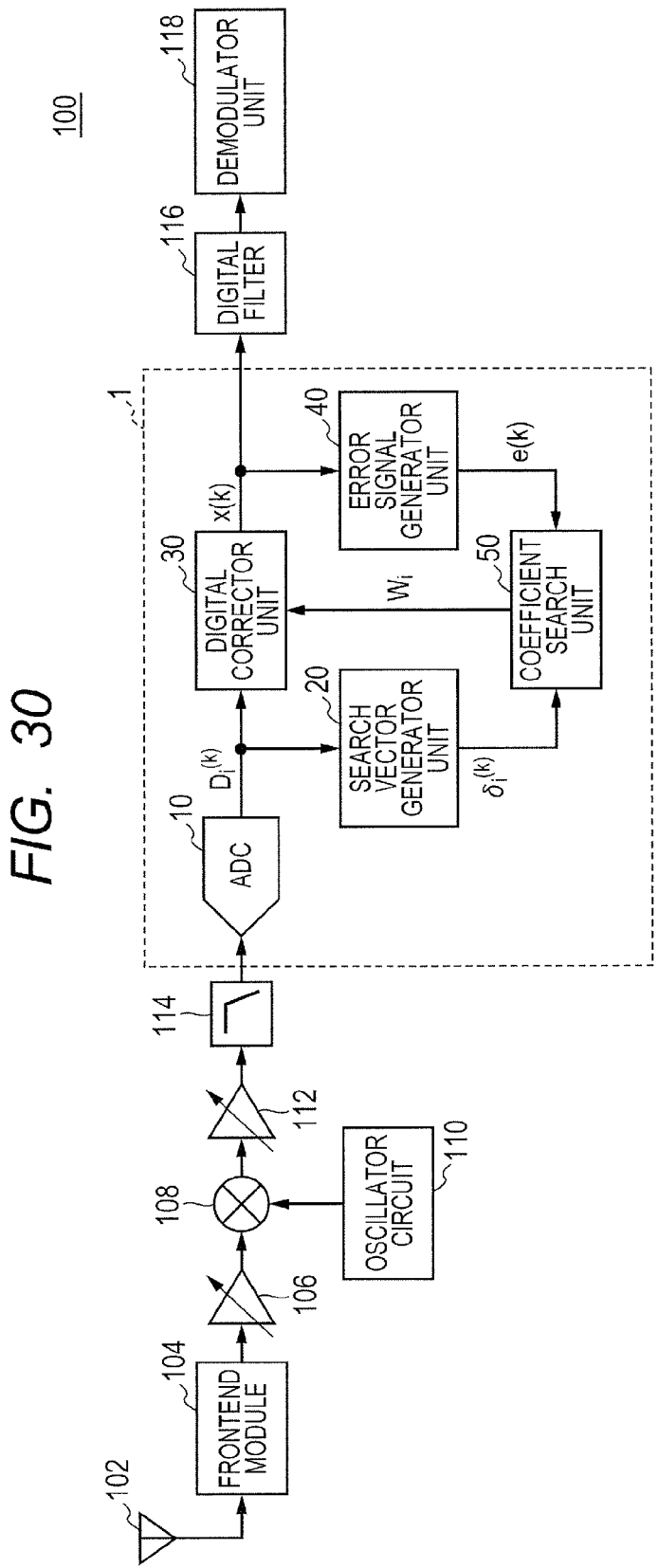
FIG. 30 is a drawing for describing the structure of a wireless receiver based on the fifth embodiment.

FIG. 30 is a drawing for describing the structure of the wireless receiver 100 based on the fifth embodiment.

As shown in FIG. 30, the wireless receiver 100 is comprised of an antenna 102, a frontend module 104, an LNA (Low Noise Amplifier) 106, a mixer 108, an oscillator circuit 110, a PGA (Programmable Gain Amplifier) 112, a LPF (Low-pass filter) 114, an A/D converter circuit 1, a digital filter 116, and a demodulator unit 118.

The A/D converter circuit 1 is comprised of an A/D converter unit 10, a search vector generator unit 20, a digital corrector unit 30, an error signal generator unit 40, and a coefficient search unit 50.

The frontend module 104 outputs the RF signal (wireless signal) that is received at the antenna 102 to the LNA 106. The LNA 106 appropriately amplifies the signal according to the band. The oscillator circuit 110 generates a local (LO) oscillator signal. The mixer 108 frequency converts the RF signal into a baseband signal by multiplying the local (LO) oscillator signal. The PGA 112 then amplifies the baseband signal to the desired signal level. The LPF 114 removes external band interference wave from the baseband signal. The A/D converter circuit 1 then performs A/D conversion of the baseband signal from an analog signal to a digital signal. More specifically, the A/D converter unit 10 performs A/D conversion (AD conversion) of the baseband signal from an analog signal to a digital signal. The digital corrector unit 30 then calculates the digital output value x(k) by multiplying the weighting coefficient $W_i$ by each bit $D_i^{(k)}$ in the AD conversion results output from the A/D converter unit 10 and summing them. The search vector generator unit 20 generates the search vector $\delta_i^{(k)}$ utilizing each bit $D_i^{(k)}$ from the AD conversion results. The error signal generator unit 40 calculates the error signal e(k). The coefficient search unit 50 calculates the weighting coefficient $W_i$ based on the search vector $\delta_i^{(k)}$ and the error signal e(k).

The digital filter 116 then removes any external band interference wave that the LPF114 has not already removed and quantization noise from outside the band generated in the AD conversion. The demodulator unit 118 then reproduces the original signal.

The wireless receiver 100 is in other words capable of applying and utilizing the A/D converter circuit 1 based on the present embodiment. The A/D converter circuit 1 is described in the present example however A/D converter circuits based on other embodiments and modifications may also be applied.
(Modification of the Fifth Embodiment)

Figure 31:
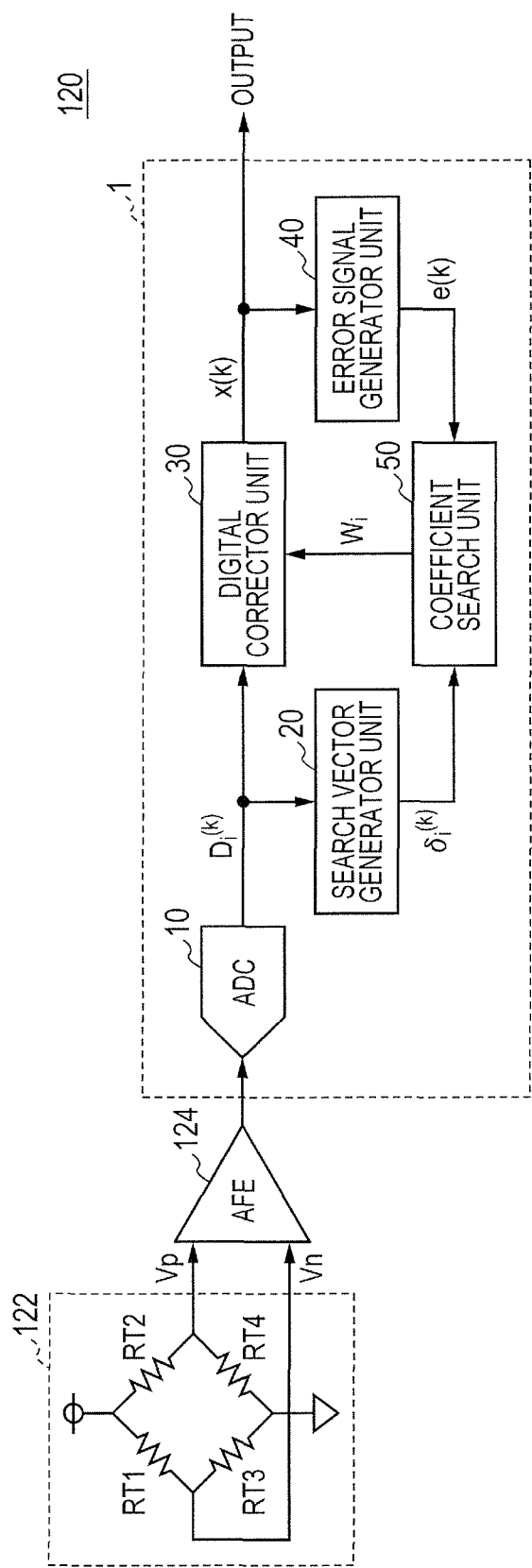
FIG. 31 is a drawing for describing a sensor based on a modification of the fifth embodiment.

FIG. 31 is a drawing for describing the sensor 120 based on a modification of the fifth embodiment.

In FIG. 31, the sensor 120 is a Wheatstone bridge type sensor circuit.

The sensor 120 is comprised of a Wheatstone bridge circuit 122, an AFE (Analog Front End) 124, and an A/D converter circuit 1. The Wheatstone bridge circuit 122 includes resistors RT1 to RT4. The resistors RT1 to RT4 configure a Wheatstone bridge and a portion or all of the resistors are sensor elements.

Figure 32:
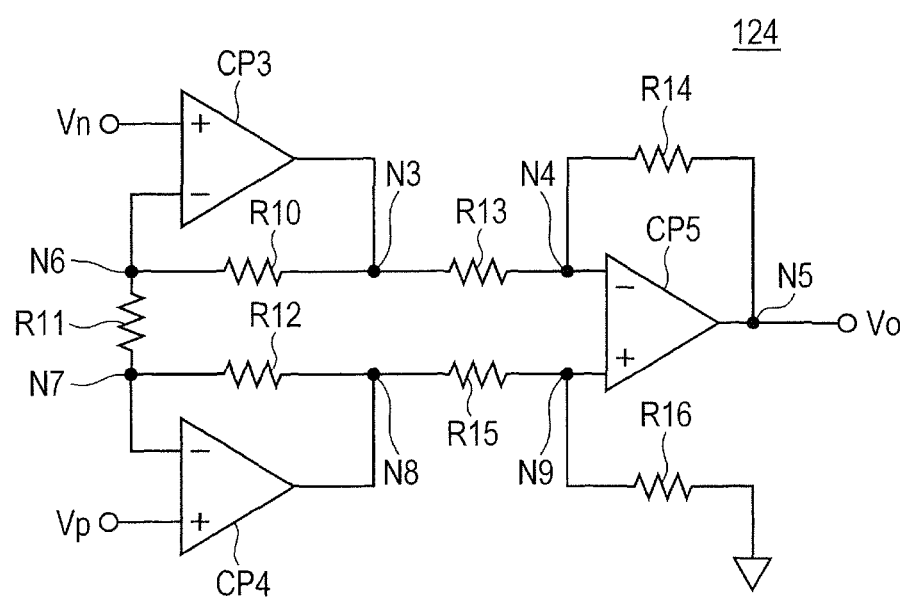
FIG. 32 is a drawing for describing the structure of the AFE124 based on a modification of the fifth embodiment.

FIG. 32 is a drawing for describing the structure of the AFE 124 based on a modification of the fifth embodiment.

FIG. 32 shows an instrumentation amplifier as one example of the AFE 124. More specifically, the AFE 124 is comprised of resistors R10 to R16, and operational amplifiers CP3 to CP5.

The operational amplifier CP3 outputs the results from amplifying the difference in voltage between the voltage Vp input and the node N6. The resistor R10 is mounted between node N3 and node N6. The resistor R13 is mounted between the node N3 and the node N4.

The operational amplifier CP4 outputs the results from amplifying the difference in voltage between the voltage Vn input and the node N7. The resistor R11 is mounted between node N6 and node N7. The resistor R12 is mounted between node N7 and node N8. The resistor R15 is mounted between node N8 and node N9. The resistor R16 is mounted between node N9 and the clamping voltage. The operational amplifier CP5 outputs the amplified results of the difference in voltage between node N4 and node N9 to node N5. The resistor R14 is mounted between the node N4 and node N5.

In the Wheatstone bridge circuit 122, the voltage Vp=Vn when the resistance values of resistors RT1 through RT4 are equivalent. When a portion or all of the resistors RT1, RT2, RT3, and RT4 are sensor elements, a change in the physical quantity that is the target for observation causes a fluctuation in a portion or all of resistance values of RT1 through RT4 and so generates a voltage across voltages Vp–Vn. Therefore, measuring the voltage across voltage Vp–Vn allows measuring the change in physical quantity for the sensor element that is the target for observation. The voltage across voltage Vp–Vn is generally tiny and so is amplified by AFE 124. The A/D converter circuit 1 then performs AD conversion of the analog signal amplified by AFE 124 into a digital signal. More specifically, the A/D converter unit 10 performs AD conversion of the analog signal output from the AFE 124 to a digital signal. The digital corrector unit 30 then calculates the digital output value x(k) by multiplying the weighting coefficient $W_i$ by each bit $D_i^{(k)}$ in the AD conversion results output from the A/D converter unit 10 and summing them. Moreover, the search vector generator unit 20 generates the search vector $\delta_i^{(k)}$ by utilizing each bit $D_i^{(k)}$ from the AD conversion results. The error signal generator unit 40 calculates the error signal e(k). The coefficient search unit 50 then calculates the weighting coefficient $W_i$ based on the search vector $\delta_i^{(k)}$ and the error signal e(k).

Namely, the sensor 120 is capable of applying and utilizing the A/D converter circuit 1 based on the present embodiment. The A/D converter circuit 1 is described in the present example however A/D converter circuits based on other embodiments and modifications may also be applied.

The number of sensor elements utilized to configure the structure in the sensor 120 varies. The sensor element is an element whose resistance value fluctuates according to some type of physical quantity and for example a temperature sensor, magnetic sensor, optical sensor, acceleration sensor or other sensors may be mounted according to the physical quantity that is the target for observation and the A/D conversion circuit based on the present embodiment can be applied to any of these sensors.

Sixth Embodiment

The sixth embodiment is described in a specific example utilizing the above described A/D converter circuit.

According to the field of application, a multiplexer may in some cases be mounted at the input to the A/D converter unit 10 to perform analog/digital (AD) conversion of multiple analog inputs in a single A/D converter unit 10.

A multiplexer for example may actually be mounted for example in a microcontroller.

A large change occurs in the input to the A/D converter unit 10 at this point regardless of the input signal band of each input when the multiplexer input is switched.

However, when considering each input to the multiplexer, there are limits on the input signal bandwidth at each input so high-speed A/D conversion processing can be achieved by isolating the A/D conversion results for each input.

Figure 33:
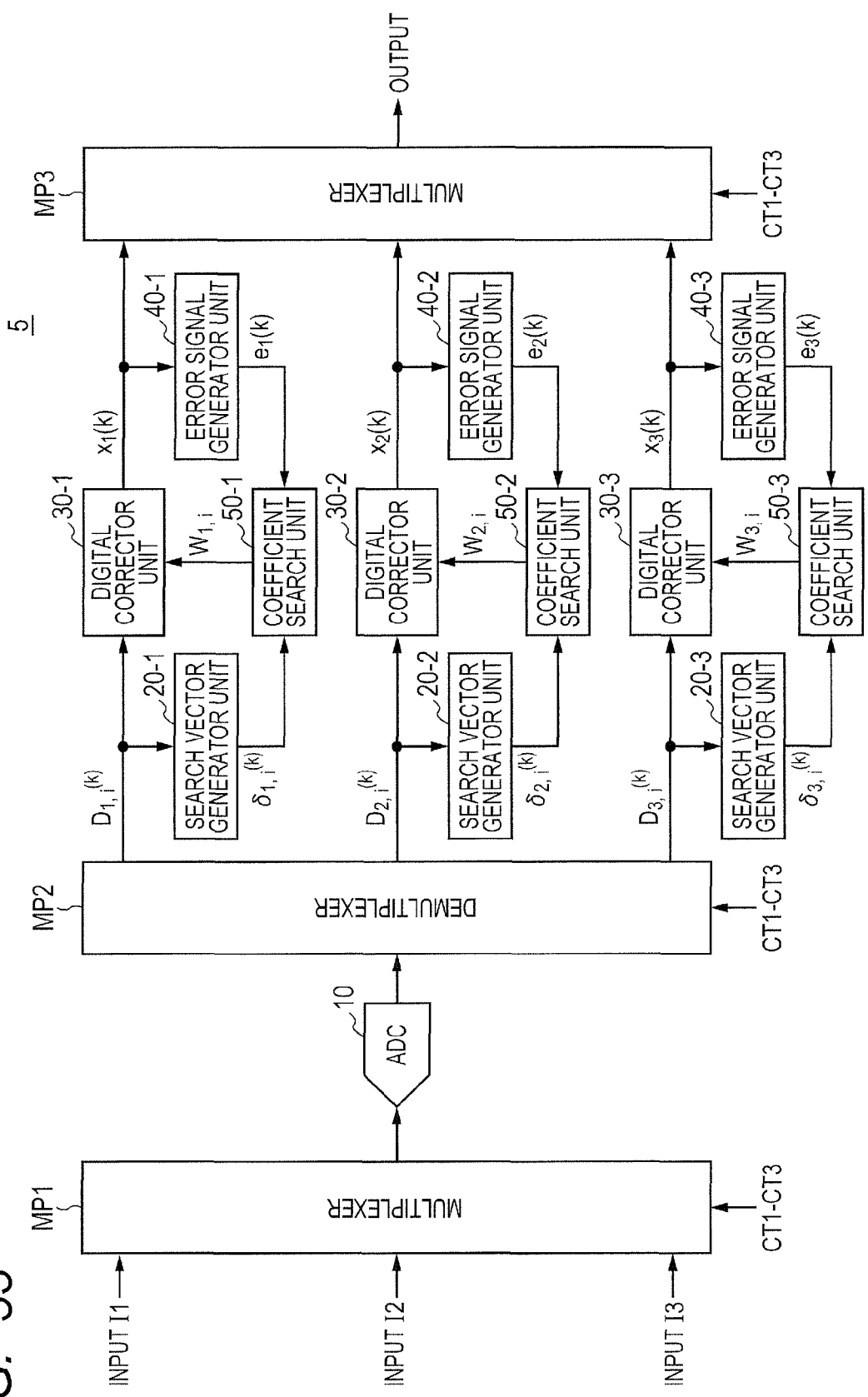
FIG. 33 is an outline diagram for describing the structure of the A/D converter circuit based on the sixth embodiment.

FIG. 33 is an outline diagram for describing the structure of the A/D converter circuit 5 based on the sixth embodiment.

The A/D converter circuit 5 as shown in FIG. 33 is comprised of an A/D converter unit 10, multiplexers MP1 to MP3, search vector generator units 20-1 to 20-3, digital corrector units 30-1 to 30-3, error signal generator units 40-1 to 40-3, and coefficient search units 50-1 to 50-3.

The multiplexer MP1 selectively accepts an input from the plural input paths of the inputs I1 to I3 and outputs it to the A/D converter unit 10 according to the commands CT1 to CT3. When the command CT1 for example is input, the multiplexer MP1 accepts an input I1 and outputs it to the A/D converter unit 10. Also, when the command CT2 is input, the multiplexer MP1 accepts the input I2 and outputs it to the A/D converter unit 10. When the command CT3 is input, the multiplexer MP1 accepts the input I3 and outputs it to the AD converter unit 10.

The demultiplexer MP2 selectively outputs the outputs from the A/D converter unit 10 along the plural output paths of the digital corrector units 30-1 to 30-3 according to the commands CT1 to CT3. When the command CT1 for example is input, the demultiplexer MP2 outputs the digital value for input I1 from the A/D converter unit 10 to the digital corrector unit 30-1. When the command CT2 is input, the demultiplexer MP2 outputs the digital value for input I2 from the A/D converter unit 10 to the digital corrector unit 30-2. When the command CT3 is input, the demultiplexer MP2 outputs the digital value for input I3 from the A/D converter unit 10 to the digital converter unit 30-3.

The multiplexer MP3 selectively accepts and outputs digital values output from the digital corrector units 30-1 to 30-3 according to the commands CT1 to CT3. When the command CT1 for example is input, the multiplexer MP3 outputs a post-correction digital value for the input I1 from the digital corrector unit 30-1. When the command CT2 is input, the multiplexer MP3 outputs a post-correction digital value for the input I2 from the digital corrector unit 30-2. Also, when the command CT3 is input, the multiplexer MP3 outputs a post-correction digital value for the input I3 from the digital corrector unit 30-3.

The structure for the A/D converter unit 10, the search vector generator units 20-1 to 20-3, the digital corrector units 30-1 to 30-3, the error signal generator units 40-1 to 40-3, and the coefficient search units 50-1 to 50-3 are identical to the description of the structure for the first embodiment so a detailed, redundant description is omitted.

Figure 34:
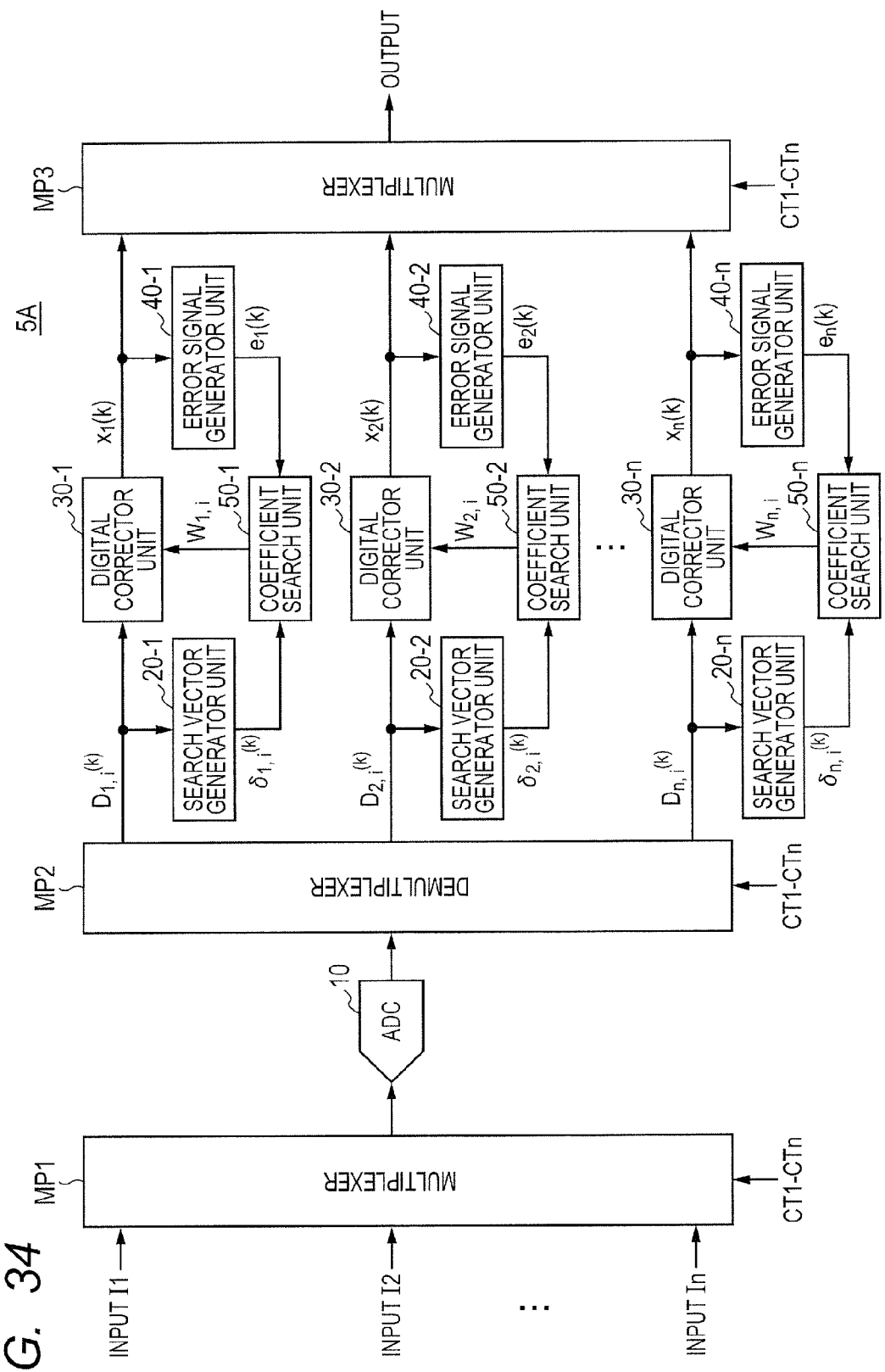
FIG. 34 is an outline diagram for describing the structure of the A/D converter circuit based on the sixth embodiment.

FIG. 34 is an outline diagram for describing the structure of the A/D converter circuit 5A based on the sixth embodiment.

The A/D converter circuit 5A shown in FIG. 34 is comprised of an A/D converter unit 10, multiplexers MP1 to MPn, search vector generator units 20-1 to 20-$n$, digital corrector units 30-1 to 30-$n$, error signal generator units 40-1 to 40-$n$, and coefficient search units 50-1 to 50-$n$.

The multiplexer MP1 selectively accepts an input from the inputs I1 to In and outputs it to the A/D converter unit 10 according to the commands CT1 to CTn.

The demultiplexer MP2 selectively outputs an output from the A/D converter unit 10 to the digital corrector units 30-1 to 30-$n$ according to the commands CT1 to CTn.

The multiplexer MP3 accepts and outputs the digital values output from the digital corrector units 30-1 to 30-$n$ according to the commands CT1 to CTn.

The structure for the A/D converter unit 10, the search vector generator units 20-1 to 20-$n$, the digital corrector units 30-1 to 30-$n$, the error signal generator units 40-1 to 40-$n$, and the coefficient search units 50-1 to 50-$n$ are identical to the description for the first embodiment so a detailed, redundant description is omitted.

The above structure allows achieving high-speed A/D conversion processing by isolating the A/D conversion results for each input.

(Modification of the Sixth Embodiment)

The above sixth embodiment describes a structure where the coefficient search units 50 are equal to the number of multiplexer inputs. Weighting coefficient values different from each of the multiplexer inputs are utilized.

The A/D converter unit 10 however is jointly utilized so the calculated weighting coefficients are the same for any of the multiplexer inputs.

Therefore, installing one coefficient search unit 50 will prove sufficient. A description of an A/D converter circuit capable of a smaller surface area is described for the modification of the sixth embodiment.

Figure 35A:
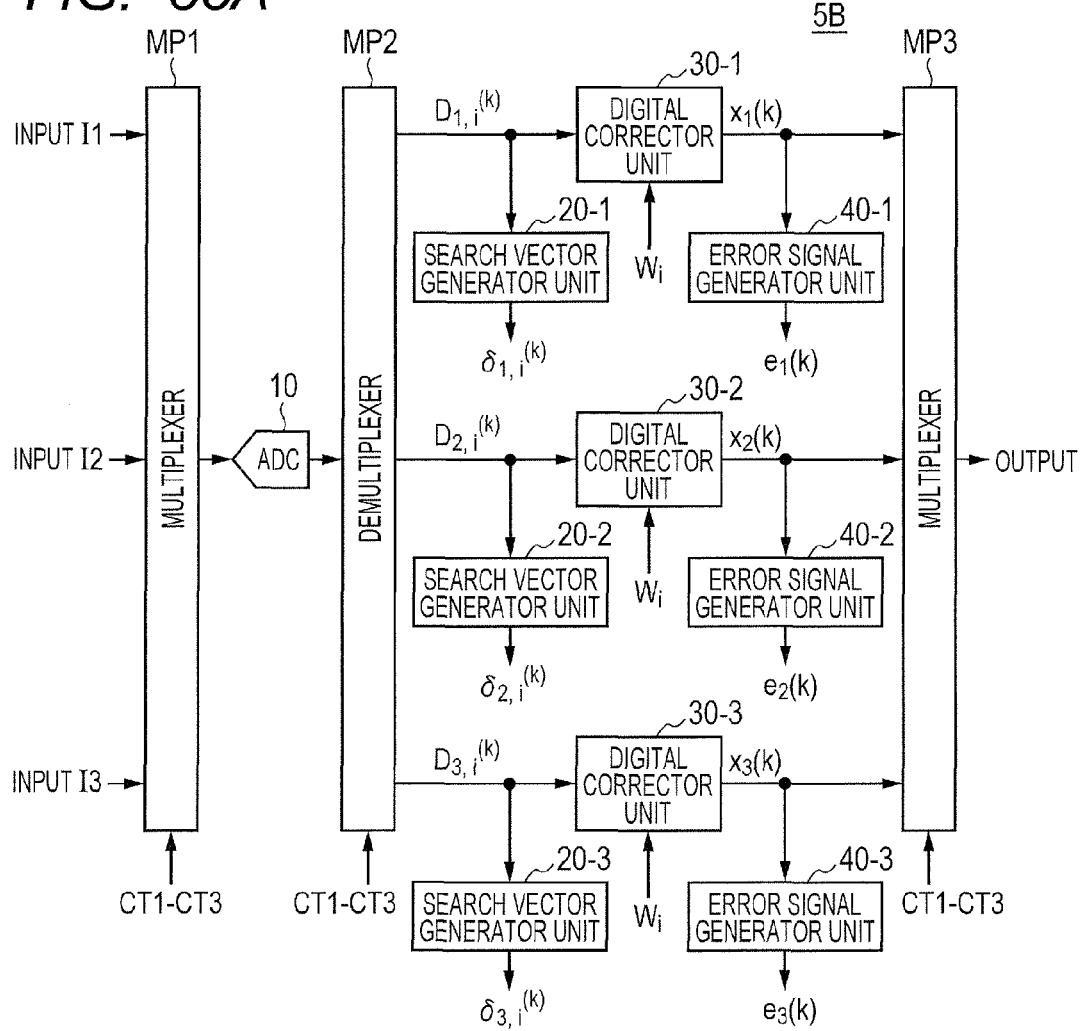
FIG. 35A and FIG. 35B are outline diagrams for describing the structure of the A/D converter circuit and a coefficient search unit based on a modification of the sixth embodiment.
Figure 35B:
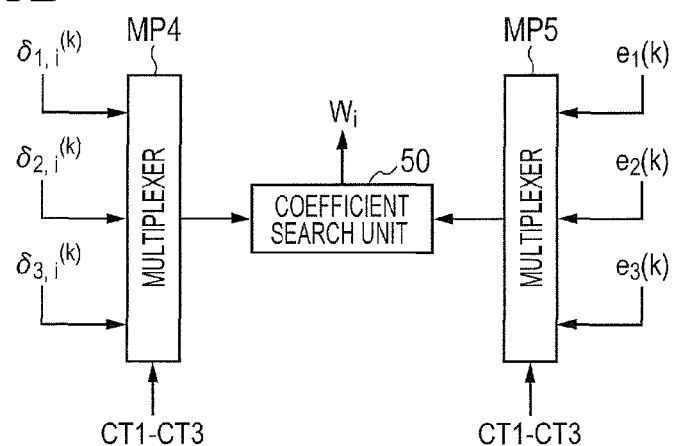

FIG. 35A and FIG. 35B are outline diagrams for describing the structure of the A/D converter circuit 5B and the coefficient search unit 50 based on a modification of the sixth embodiment.

The A/D converter circuit 5B shown in FIG. 35A is comprised of an A/D converter unit 10, the multiplexers MP1, MP3, MP4, MP5, a demultiplexer MP2, the digital corrector units 30-1 to 30-3, the search vector generator units 20-1 to 20-3, and the error signal generator units 40-1 to 40-3.

The multiplexer MP1 selectively accepts the inputs I1 to I3 and outputs them to the A/D converter unit 10 according to the commands CT1 to CT3.

The demultiplexer MP2 selectively outputs the output from the A/D converter unit 10 to the digital corrector units 30-1 to 30-3 according to the commands CT1 to CT3.

The multiplexer MP3 selectively accepts and outputs the digital values output from the digital corrector units 30-1 to 30-3 according to the commands CT1 to CT3.

The coefficient search unit 50 for searching the weighting coefficients is described while referring to FIG. 35B.

The multiplexer MP4 selectively accepts search vectors output from the search vector generator units 20-1 to 20-3 and outputs them to the coefficient search unit 50.

The multiplexer MP5 selectively accepts error signals output from the error signal generator units 40-1 to 40-3 and outputs them to the coefficient search unit 50.

The structure for the A/D converter unit 10, the search vector generator units 20-1 to 20-3, the digital corrector units 30-1 to 30-3, the error signal generator units 40-1 to 40-3, and the coefficient search unit 50 are identical to the description of the structure for the first embodiment so a detailed, redundant description is omitted.

The above structure allows mounting and jointly utilizing a coefficient search unit 50 and so is capable of reducing the number of parts and reducing the surface area.

Figure 36A:
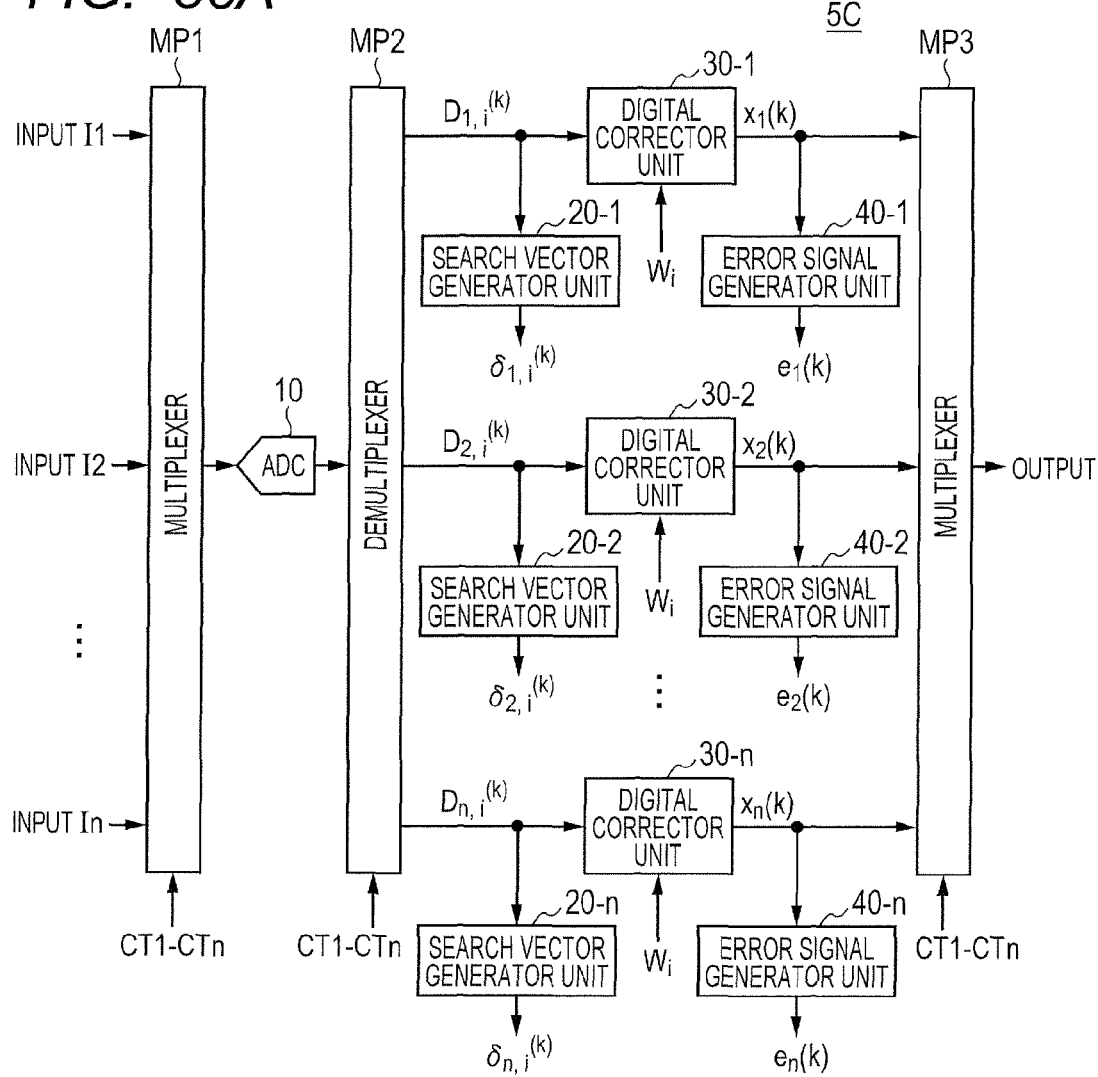
FIG. 36A and FIG. 36B are outline diagrams for describing the structure of the A/D converter circuit and a coefficient search unit based on a modification of the sixth embodiment.
Figure 36B:
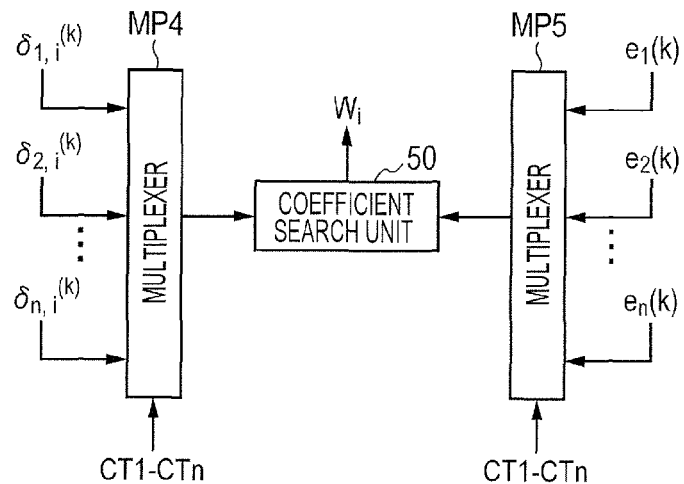

FIG. 36A and FIG. 36B are outline diagrams for describing the structure of the A/D converter circuit 5C based on a modification of the sixth embodiment.

The A/D converter circuit 5C shown in FIG. 36A is comprised of an A/D converter unit 10, the multiplexers MP1, MP3, MP4, MP5, a demultiplexer MP2, the digital corrector units 30-1 to 30-$n$, the search vector generator units 20-1 to 20-$n$, and the error signal generator units 40-1 to 40-$n$.

The multiplexer MP1 selectively accepts plural inputs from the plural input paths of the inputs I1 to In and outputs them to the A/D converter unit 10 according to the commands CT1 to CTn.

The demultiplexer MP2 selectively outputs the output from the A/D converter unit 10 to plural output paths of the digital corrector units 30-1 to 30-$n$ according to the commands CT1 to CTn.

The multiplexer MP3 selectively accepts and outputs the digital values output from the digital corrector units 30-1 to 30-$n$ according to the commands CT1 to CTn.

The coefficient search unit 50 for searching the weighting coefficients is described while referring to FIG. 36B.

The multiplexer MP4 selectively accepts the search vectors output from the search vector generator units 20-1 to 20-$n$ and outputs them to the coefficient search unit 50 according to the commands CT1 to CTn.

The multiplexer MP5 selectively accepts error signals output from the error signal generator units 40-1 to 40-$n$ and outputs them to the coefficient search unit 50 according to the commands CT1 to CTn.

The structure for the A/D converter unit 10, the search vector generator units 20-1 to 20-$n$, the digital corrector units 30-1 to 30-3, the error signal generator units 40-1 to 40-$n$, and the coefficient search unit 50 are identical to the description of the structure for the first embodiment so a detailed, redundant description is omitted.

The above structure allows mounting and jointly utilizing a coefficient search unit 50 and so is capable of reducing the number of parts and reducing the surface area.

The present invention rendered by the present inventors is described based on the embodiments however the present invention is not limited to the embodiments and may include all manner of modifications and variations not departing from the spirit and scope of the invention.

What is claimed is:

1. An analog-to-digital converter circuit that converts an analog input signal into a digital quantity comprising:
   an analog-to-digital converter unit that converts the analog input signal into a pre-correction digital value; and a corrector unit that digitally corrects the pre-correction digital value output from the analog-to-digital converter unit, wherein the corrector unit includes:

a storage device that stores a first pre-correction digital value output from the analog-to-digital converter unit;

a first weighting coefficient multiplier unit that outputs a first post-correction digital value obtained by multiplying a weighting coefficient by each bit of the first pre-correction value and summing them; and a weighting coefficient search unit that searches for a weighting coefficient so as to minimize an error signal generated based on the first post-correction digital value and an approximate value for the first post-correction digital value, and a second weighting coefficient multiplier unit that outputs a second post-correction digital value obtained by multiplying the weighting coefficient searched by the weighting coefficient search unit by each bit of the second pre-correction digital value for the analog input signal output from the analog-to-digital converter unit, and summing them.

2. An analog-to-digital converter circuit that converts a plurality of analog input signals into a digital quantity comprising:

a first selector unit that is able to selectively accept and output an input from a plurality of input paths for analog input signals;

an analog-to-digital converter unit that converts analog input signals output from the first selector unit into pre-correction digital values;

a second selector unit that is able to accept pre-correction digital values output from the analog-to-digital converter unit, and output the pre-correction digital values to a plurality of output paths formed corresponding to each of the analog input signals; and a corrector unit that digitally corrects the pre-correction digital value output from the second selector unit, wherein the corrector unit includes:

a plurality of weighting coefficient multiplier units that are mounted to correspond to each of the output paths, and output the post-correction digital value obtained by multiplying a weighting coefficient of each bit by each bit of the pre-correction digital value output from the analog-to-digital corrector unit, and summing them;

a plurality of weighting coefficient search units that are mounted to correspond to each of the weighting coefficient multiplier units, and search a weighting coefficient so as to minimize an error signal that is generated based on the post-correction digital value and the approximate value of the post-correction digital value, and a third selector unit that is able to selectively accept and output an input from the weighting coefficient multiplier units.

3. An analog-to-digital converter circuit that converts a plurality of analog input signals into a digital quantity comprising:

a first selector unit that is able to selectively accept and output an input from a plurality of input paths for analog input signals;

an analog-to-digital converter unit that converts analog input signals output from the first selector unit into pre-correction digital values;

a second selector unit that is able to accept pre-correction digital values output from the analog-to-digital converter unit, and selectively output the pre-correction digital values to a plurality of output paths formed corresponding to each of the analog input signals; and a corrector unit that digitally corrects the pre-correction digital value that is output from the second selector unit, wherein the corrector unit includes:

a plurality of weighting coefficient multiplier units that are mounted to correspond to each of the output paths, and output the post-correction digital value obtained by multiplying a weighting coefficient for each bit by each bit in the pre-correction digital value output from the analog-to-digital converter unit;

a weighting coefficient search unit that searches for a weighting coefficient so as to minimize an error signal generated based on the post-correction digital value and an approximate value of the post-correction digital value; and a third selector unit that is able to selectively accept and output the inputs from the weighting coefficient multiplier units, wherein the weighting coefficient search unit rewrites the weighting coefficient provided for each bit obtained by multiplying and summing the error signal by a search vector utilized for searching the weighting coefficient which is generated based on each bit of the corresponding pre-correction digital value and an approximate value for each bit of the pre-correction digital value, wherein the corrector unit includes:

a plurality of search vector generator units that are mounted to correspond to each of the weighting coefficient multiplier units, and generate the search vector based on each bit of the pre-correction digital value and the approximate value of each bit of the pre-correction digital value;

a plurality of error signal generator units that are mounted to correspond to each of the weighting coefficient multiplier units, and calculate an error signal based on the post-correction digital value and an approximate value of the post-correction digital value;

a third selector unit that is able to selectively accept the inputs of search vectors output from the search vector generator units, and output them to the weighting coefficient search units, and a fourth selector unit that is able to selectively accept the inputs of error signals output from the error signal generator units, and output them to the weighting coefficient search unit.

* * * * *